US012105141B2

(12) United States Patent
Soldano et al.

(10) Patent No.: US 12,105,141 B2
(45) Date of Patent: *Oct. 1, 2024

(54) STRUCTURE AND METHOD FOR TESTING OF PIC WITH AN UPTURNED MIRROR

(71) Applicant: POET Technologies, Inc., San Jose, CA (US)

(72) Inventors: Lucas Soldano, San Jose, CA (US); Jing Yang, Singapore (SG); Yong Meng Lee, San Jose, CA (US); Suresh Venkatesan, San Jose, CA (US)

( * ) Notice: Subject to any disclaimer, the term of this patent is extended or adjusted under 35 U.S.C. 154(b) by 169 days.

This patent is subject to a terminal disclaimer.

(21) Appl. No.: 17/242,686

(22) Filed: Apr. 28, 2021

(65) Prior Publication Data

US 2021/0356518 A1 Nov. 18, 2021

Related U.S. Application Data

(60) Provisional application No. 63/016,535, filed on Apr. 28, 2020.

(51) Int. Cl.
| | |
|---|---|
| *G01R 31/311* | (2006.01) |
| *G01R 31/28* | (2006.01) |
| *G02B 6/42* | (2006.01) |

(52) U.S. Cl.
CPC ........ *G01R 31/311* (2013.01); *G01R 31/2886* (2013.01); *G02B 6/4214* (2013.01)

(58) Field of Classification Search
CPC . G01R 31/311; G01R 31/2886; G02B 6/4214
See application file for complete search history.

(56) References Cited

U.S. PATENT DOCUMENTS

| 10,877,219 | B1 * | 12/2020 | Traverso ................ G02B 23/08 |
|---|---|---|---|
| 2002/0048431 | A1 * | 4/2002 | Kimura .............. G02B 6/12007 |
| | | | 385/47 |
| 2017/0330876 | A1 * | 11/2017 | Leedy ............... H01L 27/11807 |

(Continued)

FOREIGN PATENT DOCUMENTS

| FR | 2644883 | * 9/1990 | ............. G01B 11/00 |
|---|---|---|---|
| GB | 2387479 | 10/2003 | |
| GB | 2387489 | 10/2003 | |

OTHER PUBLICATIONS

Non-final Office Action dated Sep. 29, 2022, U.S. Appl. No. 17/242,701, filed Apr. 28, 2021.

*Primary Examiner* — Alexander Satanovsky
*Assistant Examiner* — Sharah Zaab
(74) *Attorney, Agent, or Firm* — Tue Nguyen

(57) ABSTRACT

A structure and method for the wafer level testing of interposer-based photonic integrated circuits is described that includes the formation of an upturned mirror structure and the method of utilizing the interposer-based mirror structure for electrical and optical testing of optoelectrical circuits that include emitting components such as lasers, detecting components such as photodetectors, and both emitting and detecting components. Electrical activation of the optoelectrical emitting or sending devices and the subsequent detection and measurement of the optical signals in detecting or receiving devices provides information on the operability or functionality of the PIC on the die at the wafer level, prior to die separation or singulation, using the electrical and optical components of the PIC circuit.

20 Claims, 33 Drawing Sheets

(56) References Cited

U.S. PATENT DOCUMENTS

| | | | |
|---|---|---|---|
| 2019/0265421 A1* | 8/2019 | Ji | G02B 6/30 |
| 2020/0033228 A1* | 1/2020 | Piazza | G01M 11/335 |
| 2020/0132947 A1* | 4/2020 | Ji | G02B 6/4214 |
| 2021/0255386 A1* | 8/2021 | Ring | G02B 6/12019 |
| 2021/0356519 A1* | 11/2021 | Soldano | G01M 11/35 |

* cited by examiner (i) Interposer structure cross section (ii) PIC cross section (iii) PIC top-down view

810 ─╮

| Form a base structure 101, wherein the base structure includes an optional electrical interconnect layer 103 disposed on a substrate 100.  890 |

⇩

| Form an optoelectrical circuitry on base structure 101, wherein the optoelectrical circuitry includes one or more optoelectrical sending devices 122, one or more optical devices 140, electrical contact pads 130, planar waveguides 144, 146, and electrical connections 132, and wherein the electrical connections 132 connect the electrical contact pads 130 and the one or more sending devices 122, and wherein the optoelectrical circuitry is configured to send an optical signal 170.  891a |

⇩

| Form an upturned mirror structure 148 on base structure 101, wherein the upturned mirror structure 148 is optically connected to the one or more sending devices 122 and the optical device 140 through planar waveguides 144, 146 formed in the planar waveguide layer 105, and wherein the upturned mirror 148 is configured to receive the optical signal 170 from the optoelectrical circuitry.  892 |

⇩

| Provide a parametric analyzer 160, an electrical portion 162a of a probe head 162 electrically connectable to the electrical contact pads 130, and an optical portion 162b of a probe head 162 optically connectable to the upturned mirror 148, and equipped with one or more optical detectors 116, and
Perform a functionality test of the optoelectrical circuitry,
wherein the parametric analyzer 160 provides a first electrical signal to the electrical probe head 162a electrically connected to one or more sending devices 122, and
wherein the first electrical signal received by the one or more sending devices 122, causes the one or more sending devices 122 to form an optical signal comprised of one or more wavelengths of light that propagate through the optoelectrical circuitry to the upturned mirror 148, and
wherein the upturned mirror 148 reflects the optical signal from the one or more sending devices 122 to the optical probe head 162b, and
wherein the optical signal in the optical probe head is received by the optical detector 116, and
wherein the detector 116 produces a second electrical signal, and
wherein the parametric analyzer receives the second electrical signal, and
wherein the second electrical signal provides information about the functionality of the optoelectrical circuitry.  893 |

⇩

| Continue the fabrication processing.  894 |

⇩

| Singulate the PIC die 102.  895 |

| Form a base structure 101, wherein the base structure includes an optional electrical interconnect layer 103 disposed on a substrate 100. 990 |

⬇

Form an optoelectrical circuitry on base structure 101, wherein the optoelectric circuitry includes one or more optoelectrical receiving devices 124, one or more optical devices 142, electrical contact pads 130, planar waveguides 144, 146, and electrical connections 132, and wherein the electrical connections 132 connect the electrical contact pads 130 and the one or more receiving devices 124, and wherein the optoelectrical circuitry is configured to receive an optical signal 170.  991b

⬇

Form an upturned mirror structure 148 on base structure 101, wherein the upturned mirror structure 148 is optically connected to the one or more receiving devices 124 and the optical device 142 through planar waveguides 144,146 formed in the planar waveguide layer 105, and wherein the upturned mirror 148 is configured to reflect an optical signal 170 into the optoelectrical circuitry  992

⬇

Provide a parametric analyzer 160, an electrical portion 162a of a probe head 162 electrically connectable to the electrical contact pads 130, and an optical portion 162b of a probe head 162 optically connectable to the upturned mirror 148 and equipped with one or more optical emitters 117, and Perform a functionality test of the optoelectrical circuitry, wherein the parametric analyzer 160 provides a first electrical signal to the optical probe head 162b electrically connected to one or more emitting devices 117, and wherein the first electrical signal is received by the one or more optical emitters 117, causing the one or more emitter devices 117 to form an optical signal comprised of one or more wavelengths of light that is incident on the upturned mirror 148, and wherein the optical signal, incident on the upturned mirror 148, is reflected into the optoelectrical circuitry, and wherein the optical signal propagates through the optoelectrical circuitry to one or more receiving devices 124, forming a second electrical signal, and wherein the parametric analyzer 160 receives the second electrical signal from the electrical probe head 162a electrically connected to the one or more receiving devices 124, wherein the second electrical signal provides information about the functionality of the optoelectrical circuitry. 993

⬇

Continue the fabrication processing.  994

⬇

Singulate the PIC die 102.  995

Form a base structure 301, wherein the base structure includes an optional electrical interconnect layer 303 disposed on a substrate 300.  1090

Form a first optoelectrical circuitry 306 on base structure 301, wherein the first optoelectrical circuitry includes one or more optoelectrical sending devices 322, one or more optical devices 340, electrical contact pads 330a, planar waveguides 344,346a, and electrical connections 332, and wherein the electrical connections 332 connect the electrical contact pads 330a to the one or more sending devices 322, and wherein the first optoelectrical circuitry 306 is configured to send an optical signal 370.  1091a

Form a second optoelectrical circuitry 308 on base structure 301, wherein the second optoelectrical circuitry includes one or more optoelectrical receiving devices 324, one or more optical devices 342, electrical contact pads 330b, planar waveguides 344, 346b, and electrical connections 332, and wherein the electrical connections 332 connect the electrical contact pads 330b to the one or more receiving devices 324, wherein the optoelectrical circuitry 308 is configured to receive an optical signal 370, and  1091b

Form a first upturned mirror structure 348a on base structure 301, wherein the first upturned mirror structure 348a is optically connected to the one or more sending devices 322 and the one or more optical devices 340 through planar waveguides 344, 346a formed in the planar waveguide layer 305, and wherein the first upturned mirror structure 348a is configured to receive the optical signal 370 from the first optoelectrical circuitry 306, and  1092a

Form a second upturned mirror structure 348b on base structure 301, wherein the second upturned mirror structure 348b is optically connected to the one or more receiving devices 324 and the one or more optical devices 342 through planar waveguides 344, 346b formed in the planar waveguide layer 305, and wherein the second upturned mirror 348b is configured to reflect an optical signal 370 into the waveguide 346b of the second optoelectrical circuitry.  1092b

Provide a parametric analyzer 360, an electrical portion 362a of probe head 362 electrically connectable to the electrical contact pads 330a, 330b, and an optical portion 362b of a probe head 362, optically connectable to the first and second upturned mirrors 348a, 348b, and the optical probe head 362b equipped with one or more optical detectors 316 and one or more optical emitters 317, and Perform a functionality test of the first optoelectrical circuitry 306, wherein the parametric analyzer 360 provides a first electrical signal to the electrical probe head 362a electrically connected to the one or more sending devices 322, and wherein the first electrical signal received by the one or more sending devices 322, causes the one or more sending devices 322 to form a first optical signal comprised of one or more wavelengths of light that propagate through the first optoelectrical circuitry 306 to the first upturned mirror 348a, and wherein the first upturned mirror 348a reflects the first optical signal from the one or more sending devices 322 to the optical probe head 362b, and wherein the first optical signal in the optical probe head 362b is received by an optical detector 316, and wherein the detector 316 produces a second electrical signal, and wherein the parametric analyzer 360 receives the second electrical signal, and wherein the second electrical signal provides information about the functionality of the first optoelectrical circuitry 306, And perform a functionality test of the second optoelectrical circuitry 308 wherein the parametric analyzer 360 provides a third electrical signal to the optical probe head 362a electrically connected to the one or more optical emitters 317 in the optical probe head 362a, wherein the third electrical signal is received by one or more emitter devices 317, causing the one or more emitter devices 317 to form a second optical signal comprised of one or more wavelengths of light that is incident on the second upturned mirror 348a, and wherein the second optical signal, incident on the second upturned mirror 348b, is reflected into the second optoelectrical circuitry 308, and wherein the second optical signal propagates through the second optoelectrical circuitry 308 to one or more receiving devices 324, forming a fourth electrical signal, and wherein the parametric analyzer 360 receives the fourth electrical signal from the electrical probe head 362a electrically connected to the one or more receiving devices 324, wherein the fourth electrical signal provides information about the functionality of the second optoelectrical circuitry 308.

1093

Continue the fabrication processing.

1094

Singulate the PIC die 302.

Form a base structure 301, wherein the base structure includes an optional electrical interconnect layer 303 disposed on a substrate 300.

*1190*

Form a first optoelectrical circuitry 306 on base structure 301, wherein the first optoelectrical circuitry includes one or more optoelectrical sending devices 322, one or more optical devices 340, electrical contact pads 330a, planar waveguides 344,346a, and electrical connections 332, and wherein the electrical connections 332 connect the electrical contact pads 330a to the one or more sending devices 322, and wherein the first optoelectrical circuitry 306 is configured to send an optical signal 370.

*1191a*

Form a second optoelectrical circuitry 308 on base structure 301, wherein the second optoelectrical circuitry includes one or more optoelectrical receiving devices 324, one or more optical devices 342, electrical contact pads 330b, planar waveguides 344, 346b, and electrical connections 332, and wherein the electrical connections 332 connect the electrical contact pads 330b to the one or more receiving devices 324, wherein the optoelectrical circuitry 308 is configured to receive an optical signal 370, and

*1191b*

Form a first upturned mirror structure 348a on the base structure 301, wherein the first upturned mirror structure 348a is optically connected to the one or more sending devices 322 and the optical device 340 through planar waveguides 344 formed in the planar waveguide layer 305, and wherein the first upturned mirror structure 348a is configured to receive the optical signal 370 from the first optoelectrical circuitry 306, and

*1192a*

Form a second upturned mirror structure 348b on the base structure 301, wherein the second upturned mirror structure 348b is optically connected to the one or more receiving devices 324 and the optical device 342 through planar waveguides 344 formed in the planar waveguide layer 305, and wherein the second upturned mirror 348b is configured to receive and reflect an optical signal 370 from probe head 162b into the planar waveguide 346b.

Provide a parametric analyzer 360, an electrical portion 362a of probe head 362 electrically connectable to the electrical contact pads 330a, 330b, and an optical portion 362b of a probe head 362, optically connectable to the first and second upturned mirrors 348a, 348b, and the optical probe head 362b equipped with one or more optical detectors 316 and one or more optical emitters 317, and Perform a functionality test of the first and second optoelectrical circuitries 306, 308, wherein the parametric analyzer 360 provides a first electrical signal to the electrical probe head 362a electrically connected to the one or more sending devices 322, and wherein the first electrical signal received by the one or more sending devices 322, causes the one or more sending devices 322 to form a first optical signal comprised of one or more wavelengths of light that propagate through the first optoelectrical circuitry 306 to the first upturned mirror 348a, and wherein the first upturned mirror 348a reflects the first optical signal from the one or more sending devices 322 to the optical probe head 362b, and wherein the first optical signal in the optical probe head 362b is received by an optical detector 316, and wherein the detector 316 produces a second electrical signal, and wherein the one or more emitters 317 receive the second electrical signal, and cause the emitters 317 to form a second optical signal that is comprised of one or more wavelengths of light incident on the second upturned mirror 348a, and wherein the second optical signal, incident on the second upturned mirror 348b, is reflected into the second optoelectrical circuitry 308, and wherein the second optical signal propagates through the second optoelectrical circuitry 308 to one or more receiving devices 324, wherein the parametric analyzer 360 receives an electrical signal from the electrical probe head 362a electrically connected to the one or more receiving devices 324, wherein the fourth electrical signal provides information about the functionality of the first and second optoelectrical circuitries 306, 308.

1193

Continue the fabrication processing.

1194

Singulate the PIC die 302.

| Form a base structure 301, wherein the base structure includes an optional electrical interconnect layer 303 disposed on a substrate 300 |
| --- |

1290

| Form a first optoelectrical circuitry 306 on base structure 301, |
| --- |
| wherein the first optoelectrical circuitry includes one or more optoelectrical sending devices 322, one or more optical devices 340, electrical contact pads 330a, planar waveguides 344, 346a, and electrical connections 332, and |
| wherein the electrical connections 332 connect the electrical contact pads 330a to the one or more sending devices 322, and |
| wherein the first optoelectrical circuitry 306 is configured to send an optical signal 370. |

1291a

| Form a second optoelectrical circuitry 308 on base structure 301, |
| --- |
| wherein the second optoelectrical circuitry includes one or more optoelectrical receiving devices 324, one or more optical devices 342, electrical contact pads 330b, planar waveguides 344, 346b, and electrical connections 332, and |
| wherein the electrical connections 332 connect the electrical contact pads 330b to the one or more receiving devices 324, |
| wherein the optoelectrical circuitry 308 is configured to receive an optical signal 370, and |

1291b

| Form a first upturned mirror structure 348a on the base structure 301, |
| --- |
| wherein the first upturned mirror structure 348a is optically connected to the one or more sending devices 322 and the optical device 340 through planar waveguides 344 formed in the planar waveguide layer 305, and |
| wherein the first upturned mirror structure 348a is configured to receive the optical signal 370 from the first optoelectrical circuitry 306, and |

1292a

| Form a second upturned mirror structure 348b on the base structure 301, |
| --- |
| wherein the second upturned mirror structure 348b is optically connected to the one or more receiving devices 324 and the optical device 342 through planar waveguides 344 formed in the planar waveguide layer 305, and |
| wherein the second upturned mirror 348b is configured to receive and reflect an optical signal 370 from probe head 162b into the planar waveguide 346b. |

Provide a parametric analyzer 360, an electrical portion 362a of probe head 362 electrically connectable to the electrical contact pads 330a, 330b, and an optical portion 362b of probe head 362 optically connectable to the first and second upturned mirrors 348a, 348b, and Provide an optical loop 365 in the optical portion 362b of the probe head 362, and Perform a functionality test of the first and second optoelectrical circuitries 306, 308, wherein the parametric analyzer 360 provides a first electrical signal to the electrical probe head 362a electrically connected to the one or more sending devices 322, and wherein the first electrical signal received by the sending device 322, causes the one or more sending devices 322 to form an optical signal comprised of one or more wavelengths of light, wherein the optical signal propagates through the first optoelectrical circuitry 306 to the first upturned mirror 348a, and wherein the first upturned mirror reflects the optical signal from the one or more sending devices 322 to the optical probe head 362b, and wherein the optical signal in the optical probe head 362b is received by optical loop 365 and redirected to the second upturned mirror 348b, wherein the optical signal, incident on the second upturned mirror 348b, is reflected into the second optoelectrical circuitry 308 to the one or more receiving devices 324, wherein the parametric analyzer 360 receives a second electrical signal from the electrical probe head 362a electrically connected to the one or more receiving devices 324, wherein the second electrical signal provides information about the functionality of the first and second optoelectrical circuitries 306, 308

1293

Continue the fabrication processing.

1294

Singulate the PIC die 302.

STRUCTURE AND METHOD FOR TESTING OF PIC WITH AN UPTURNED MIRROR

The present patent application claims priority from U.S. Provisional Patent Applicant Ser. No. 63/016,535, filed on Apr. 28, 2020, entitled "Structure and Method for testing of PIC with an Upturned mirror", of the same inventors, hereby incorporated by reference in its entirety.

The present patent application relates to patent application Ser. No. 17/242,580, filed on Apr. 28, 2021, entitled "Loopback Waveguide", and patent application Ser. No. 17/242,584, filed on Apr. 28, 2021, entitled "Loopback Waveguide", hereby incorporated by reference in its entirety.

FIELD OF THE INVENTION

The present invention relates to photonic integrated circuits, and more particularly to a structure and method for routing optical signals into and from planar waveguides in photonic integrated circuits.

BACKGROUND

Photonic integrated circuits (PICs) are used in optical communications networks and other applications that utilize optical signals for encoding and transporting information. Planar waveguides are used in photonic integrated circuits (PICs) for guiding the optical signals between the various optical and optoelectrical components within the circuit. Waveguides and many other optical devices are formed on semiconductor and other forms of substrates using semiconductor fabrication methods for depositing and patterning the individual layers from which these waveguides and other devices are formed.

Access to the optical signals that are propagating within the waveguides during partial or full operation can be beneficial for obtaining information about the level of performance of the circuit and the optical and optoelectrical components included within the circuit. Methods for providing this access and the accompanying structures utilized in these methods would benefit from the use of processes that are derived from semiconductor processing techniques. Devices and structures, for example, that enable the movement of optical signals into and from the planar waveguides in planar PICs prior to die singulation and prior to the attachment of optical fibers would facilitate wafer level process testing that would reduce the cost of processing and testing by enabling PIC performance evaluation during the fabrication process.

Thus, a need in the art exists for structures and methods that enable optical signals to be delivered to, and received from, planar waveguides in PICs. Access to the planar waveguides can be used in optical circuits, for example, for wafer level testing of optical device and circuit performance, during and after the fabrication process of PICs.

SUMMARY

Embodiments of a structure and testing methodology for wafer level evaluation of photonic integrated circuits are disclosed herein.

Embodiments described herein disclose a structure and methodology for the formation of an upturned mirror structure that provides access to optical signals propagating in planar waveguides that are formed on an interposer structure. Embodiments further include a test circuit and methodology for testing that includes the use of upturned mirrors formed on the interposer. The wafer level testing methods include a probe head comprising an electrical portion and an optical portion, with the probe head in communication with a parametric analyzer or other form of electrical measurement equipment. In embodiments, the electrical portion of the probe head connects to one or more contact pads on the PIC, and the optical portion is aligned with one or more upturned mirrors on the PIC to receive signals from, or to send optical signals to, the PIC. Additionally, embodiments include the connection of the electrical portion or portions of the probe head to a current or voltage source, or both, and a measurement device such as a parametric analyzer for assessment of the signals received from the probe head. In some embodiments, optical signals may be provided from the optical portion of the probe head to the parametric analyzer for conversion to an electrical signal prior to measurement.

In some embodiments, one or more upturned mirrors are formed in an interposer structure. The one or more upturned mirror structures are formed using a process flow described herein. For each upturned mirror, a recess is formed and filled with a dielectric material, the dielectric fill material is masked and exposed to an isotropic etch process to form a base for the mirror, and then a reflective layer is deposited and patterned to form the reflective mirrors. The recesses formed in the interposer structure for the upturned mirrors are positioned such that the reflective surfaces of the mirrors intersect the pathways of optical signals propagating through the planar waveguides in the interposer.

In an embodiment, the optoelectrical circuits of the PIC include one or more sending devices, such as a laser, electrical contact pads that connect to the sending device through the electrical interconnect layer, and planar waveguides that provide optical connections from the one or more sending devices to an upturned mirror. During a test, one or more electrical contacts from the electrical portion of a probe head are brought into contact with the one or more contact pads on the PIC, an electrical signal is provided from a voltage or current source, connected to the electrical contacts, and an electrical signal is delivered through the contacts to the one or more sending devices to activate the sending devices to emit an optical signal that propagates through the planar waveguides to the upturned mirror, and subsequently to the optical portion of a probe head positioned to receive the reflected optical signal from the upturned mirror.

In another embodiment, the optoelectrical circuits of the PIC include one or more receiving devices, such as a photodetector, electrical contact pads that connect to the receiving device through the electrical interconnect layer, and planar waveguides that provide optical connections from the one or more receiving devices to an upturned mirror. During a test, one or more electrical contacts from the electrical portion of a probe head are brought into contact with the one or more contact pads on the PIC, and an electrical signal is provided from the receiving device when activated by an optical signal from the optical portion of the probe head. In this embodiment, the optical portion of the probe head is positioned to send an optical signal to the upturned mirror, that is in turn reflected by the upturned mirror into the planar waveguides that connect through the optoelectrical circuit to the one or more receiving devices.

In yet another embodiment, the optoelectrical circuits of the PIC includes one or more sending devices and one or more receiving devices. First and second upturned mirrors are formed on the base structure that includes an electrical interconnect layer and a substrate. One or more optoelectrical circuits are formed on the base structure in this embodiment wherein a first optoelectrical circuitry includes one or more optoelectrical sending devices, such as a laser, and wherein a second optoelectrical circuitry includes one or more receiving devices, such as a photodiode. Additionally, the first and second circuitries include electrical contact pads that connect to the sending and receiving devices through the electrical interconnect layer, and planar waveguides formed in the planar waveguide layer that provide an optical connection from the sending devices to the first upturned mirror and from receiving devices to the second upturned mirror. During a test, one or more electrical contacts from the electrical portion of a probe head are brought into contact with the one or more contact pads on the PIC, an electrical signal is provided from a voltage or current source, connected to the electrical contacts, and an electrical signal is delivered through the contacts to activate the one or more sending devices to emit an optical signal. This optical signal is emitted from the one or more sending devices, and wherein this signal propagates through the planar waveguides formed in the planar waveguide layer to the first upturned mirror. This optical signal is reflected perpendicularly from its direction of propagation substantially parallel to the surface of the substrate in the planar waveguide layer, to the optical portion of a probe head positioned to receive the reflected optical signal from this first upturned mirror. In some embodiments, the optical signal is received by the probe head and redirected to the second upturned mirror. In some embodiments, redirecting of the optical signal in the optical portion of the probe head is achieved, for example, by routing the optical signal through the probe head. In other embodiments, the optical signal in the probe head is received by an optical detection device in the probe head, and this detection device triggers an emitting device to emit an optical signal from an optical emitting device to the second upturned mirror. Once the optical signal is received by the second upturned mirror, the optical signal is reflected into a planar waveguide of the second optoelectrical circuitry, optically connected to the one or more receiving devices. When activated by this optical signal, the one or more receiving devices provide electrical signals through the electrical interconnect layer to one or more electrical contact pads and subsequently, to the electrical portion of the probe head that is in contact with these one or more contact pads on the PIC.

In embodiments, the wafer level test structure, that includes the first and second upturned mirrors, and the methodology associated with the use of the upturned mirrors, are used to evaluate the any one or more of the sending device, the sending circuit, the receiving device, the receiving circuit, the electrical interconnect layer, the optical planar waveguides, an optical circuit on the PIC, or any other aspect of devices mounted on or to the photonic integrated circuit that are influenced by one or more electrical signals from the contact pad or by optical signals that are propagating through at least a portion of the PIC.

In some embodiments, the electrical contacts are formed on an electrical interface on the PIC. In other embodiments, the upturned mirror structure is used to form the electrical contacts used in the electrical test circuit.

Other aspects and features of embodiments will become apparent to those skilled in the art upon review of the following detailed description in conjunction with the accompanying figures.

BRIEF DESCRIPTION OF THE DRAWINGS

FIG. 6A. Cross sectional schematic of an embodiment of a wafer level testing configuration that includes a parametric analyzer 660, electrical probe head 662a, and optical probe head 662b configured for testing of an interposer-based PIC die 602 with a sending circuit 606 and an upturned mirror 648a.

FIG. 8B. Flow chart for embodiments of a method for PIC die fabrication and wafer level testing for a PIC 102 that has a sending device 122.

FIG. 9B. Flow chart for embodiments of a method for PIC die fabrication and wafer level testing for a PIC 102 that has one or more receiving devices 124.

FIG. 10B. Flow chart for embodiments of a method of fabrication and wafer level testing for a PIC die 302 that has a sending device 322 and a receiving device 324, and for which the optical probe head 362b has a detector 316 and an emitter 317.

FIG. 11B. Flow chart for embodiments of a method of fabrication and wafer level testing for a PIC die 302 that has sending device 322 and a receiving device 324, and for which the optical probe head 362b has a detector 316 and an emitter 317 in which the detector 316 detects an optical signal and sends an electrical signal to the emitter 317.

FIG. 12B. Flow chart for embodiments of a method of fabrication and wafer level testing for a PIC die 302 that has sending device 322 and receiving device 324, and for which the optical probe head 362b has an optical loop 365.

FIG. 16. Schematic drawing of an embodiment of a PIC die 1602 for which all or a portion of the upturned mirror 1648 is used to form an electrical connection between the electrical interconnect layer of the interposer and the electrical probe 1662a.

DETAILED DESCRIPTION

Figure 1A:
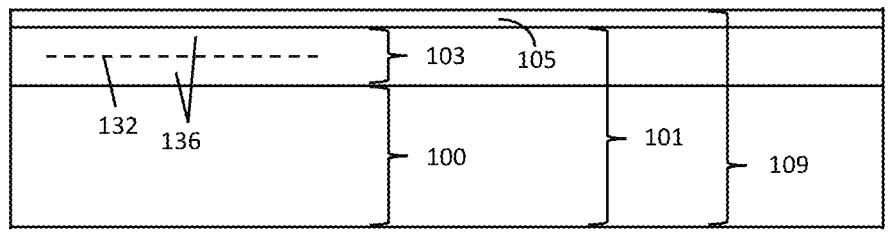
FIG. 1A. Schematic drawings of an embodiment of a PIC die 102 formed on base structure 101 shown with electrical probe 162a and optical probe 162b: (i) base structure cross section, (ii) PIC cross section, (iii) PIC top-down perspective.
Figure 1A:
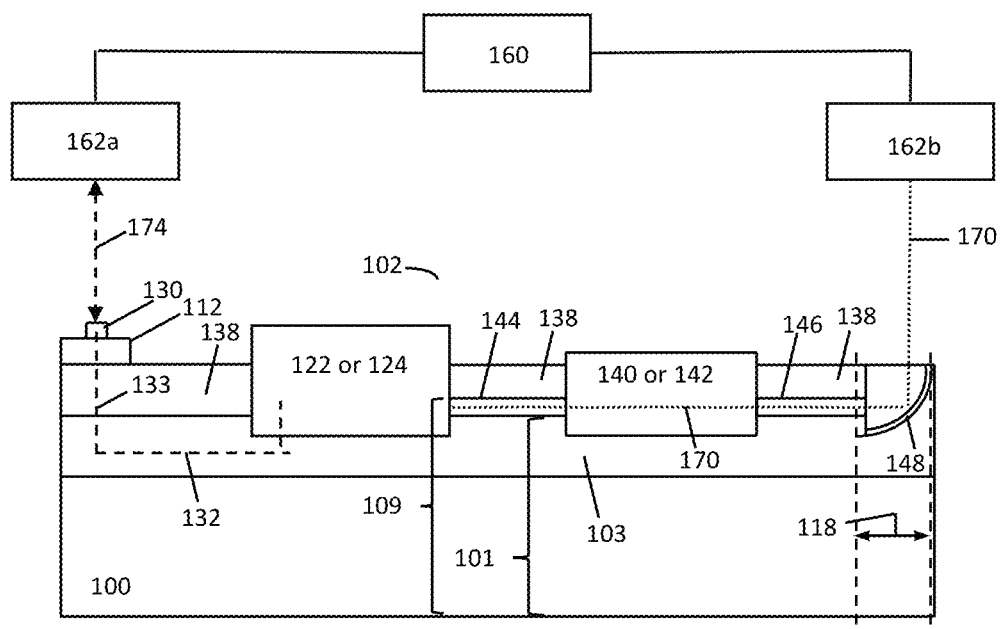
Figure 1A:
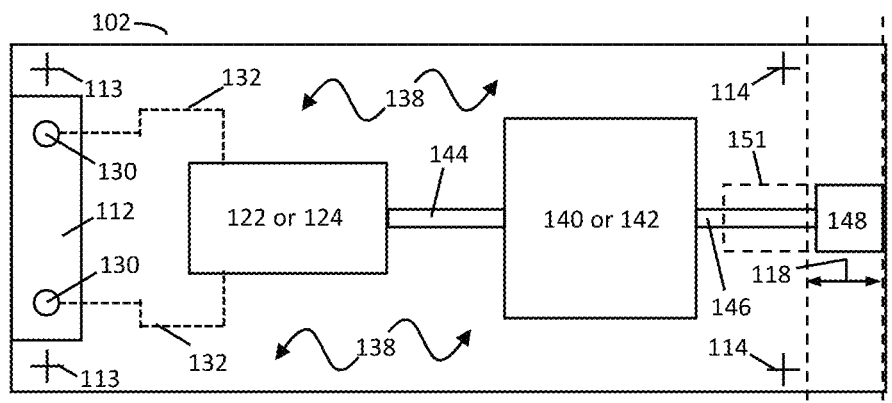

Embodiments described herein disclose a structure for an upturned mirror structure and methodology for the formation of an upturned mirror structure in an interposer structure that includes a substrate and an optional electrical interconnect layer. Embodiments described herein further disclose the wafer level testing of photonic integrated circuits (PICs), formed on an interposer base structure that includes an optional underlying interconnect layer and a substrate. Embodiments further include a methodology for the wafer level testing that includes the use of upturned mirrors formed on the interposer base structure. In some embodiments, the methodology includes a probe head comprising an electrical portion and an optical portion, with the probe head attached to a parametric analyzer or other form of electrical measurement equipment. In embodiments, the electrical portion of the probe head connects to one or more contact pads on the PIC, and the optical portion is aligned with one or more upturned mirrors on the PIC to receive signals from, or to send optical signals to, the PIC. Additionally, embodiments include the connection of the electrical portion or portions of the probe head to a current or voltage source, or both, and a measurement device such as a parametric analyzer for assessment of the signals received from the probe head. In some embodiments, optical signals may be provided from the optical portion of the probe head to the parametric analyzer for conversion to an electrical signal prior to measurement.

In an embodiment, the optoelectrical circuits of the PIC include one or more sending devices, such as a laser, electrical contact pads that connect to the sending device through the electrical interconnect layer, and planar waveguides that provide optical connections from the one or more sending devices to an upturned mirror. Planar waveguides are formed from a planar waveguide layer on the optional interconnect layer. During a test, one or more electrical contacts from the electrical portion of a probe head are brought into contact with the one or more contact pads on the PIC, an electrical signal is provided from a voltage or current source, connected to the electrical contacts, and an electrical signal is delivered through the contacts to the one or more sending devices to activate the sending devices to emit an optical signal. This optical signal is emitted from the one or more sending devices, and it propagates through the planar waveguides to the upturned mirror. This optical signal is reflected perpendicularly from its direction of propagation parallel to the surface of the substrate in the planar waveguide layer, to the optical portion of a probe head positioned to receive the reflected optical signal from the upturned mirror. In embodiments, the optical signal is either detected and converted to an electrical signal at the optical probe head, or optically received by the probe head and routed for processing elsewhere through a waveguide or other optical pathway for detection at a parametric analyzer or other form of analytical or measurement equipment. In embodiments, the wafer level test structure, that includes the upturned optical mirror, and the methodology associated with the use of the upturned mirror are used to evaluate the any one or more of the sending devices, the sending circuit, the electrical interconnect layer, the optical planar waveguide, an optical circuit on the PIC, or any other aspect of devices mounted on or to the photonic integrated circuit formed on the interposer that are influenced by the electrical signal from the contact pad or optical signal from the sending device.

In another embodiment, the optoelectrical circuits of the PIC include one or more receiving devices, such as a photodetector, electrical contact pads that connect to the receiving device through the electrical interconnect layer, and planar waveguides that provide optical connections from the one or more receiving devices to an upturned mirror. Planar waveguides are formed from a planar waveguide layer on the optional interconnect layer. During a test, one or more electrical contacts from the electrical portion of a probe head are brought into contact with the one or more contact pads on the PIC, and an electrical signal is provided from the receiving device when activated by an optical signal from the optical portion of the probe head. In this embodiment, the optical portion of the probe head is positioned to send an optical signal to the upturned mirror, that is in turn reflected by the upturned mirror into the planar waveguides that connect through the optoelectrical circuit to the one or more receiving devices. Once received by the one or more receiving devices, an electrical signal is formed by the one or more receiving devices that is detectable at the one or more contact pads on the PIC, and at a parametric tester or other form of analytical or measurement device connected to the contact pad through the electrical portion of the probe head. In embodiments, the wafer level test structure, that includes the upturned optical mirror, and the methodology associated with the use of the upturned mirror and the base structure are used to evaluate the any one or more of the receiving devices, the receiving circuit, the electrical interconnect layer, the optical planar waveguide, an optical circuit on the PIC, or other aspect of devices mounted on or to the photonic integrated circuit that are influenced by the optical signal from the probe head and the receiving device, and the electrical signal between the contact pads and the one or more receiving devices.

In yet another embodiment, the optoelectrical circuits of the PIC includes one or more sending devices and one or more receiving devices. First and second upturned mirrors are formed on the base structure that includes an electrical interconnect layer and a substrate. One or more optoelectrical circuits are formed on the base structure in this embodiment wherein a first optoelectrical circuitry includes one or more optoelectrical sending devices, such as a laser, and wherein a second optoelectrical circuitry includes one or more receiving devices, such as a photodiode. Additionally, the first and second circuitries include electrical contact pads that connect to the sending and receiving devices through the electrical interconnect layer, and planar waveguides formed in the planar waveguide layer that provide an optical connection from the sending devices to the first upturned mirror and from receiving devices to the second upturned mirror. During a test, one or more electrical contacts from the electrical portion of a probe head are brought into contact with the one or more contact pads on the PIC, an electrical signal is provided from a voltage or current source, connected to the electrical contacts, and an electrical signal is delivered through the contacts to activate the one or more sending devices to emit an optical signal. This optical signal is emitted from the one or more sending devices, and wherein this signal propagates through the planar waveguides formed in the planar waveguide layer to the first upturned mirror. This optical signal is reflected perpendicularly from its direction of propagation parallel to the surface of the substrate in the planar waveguide layer, to the optical portion of a probe head positioned to receive the reflected optical signal from this first upturned mirror. In some embodiments, the optical signal is received by the probe head and redirected to the second upturned mirror. In some embodiments, redirecting of the optical signal in the optical portion of the probe head is achieved, for example, by routing the optical signal through an optical fiber, bundle of fibers, waveguide, or by reflection of the optical signal in the probe head with mirrors. In other embodiments, the optical signal in the probe head is received by an optical detection device in the probe head, and this detection device triggers an emitting device to emit an optical signal from an optical emitting device to the second upturned mirror. Once the optical signal is received by the second upturned mirror, the optical signal is reflected into a planar waveguide of the second optoelectrical circuitry, optically connected to the one or more receiving devices. When activated by this optical signal, the one or more receiving devices provide electrical signals through the electrical interconnect layer to one or more electrical contact pads and subsequently, to the electrical portion of the probe head that is in contact with these one or more contact pads on the PIC. One or more of an optical device, optical circuit, optical component, and an optoelectrical device, electrical device or other form of signal conditioning device may be present between the upturned mirror and the one or more receiving devices. In embodiments, the wafer level test structure, that includes the first and second upturned mirrors, and the methodology associated with the use of the upturned mirrors, are used to evaluate the any one or more of the sending device, the sending circuit, the receiving device, the receiving circuit, the electrical interconnect layer, the optical planar waveguides, an optical circuit on the PIC, or any other aspect of devices mounted on or to the photonic integrated circuit that are influenced by one or more electrical signals from the contact pad or by optical signals that are propagating through at least a portion of the PIC.

In yet another embodiment, in which the optoelectrical circuits of the PIC also include one or more sending devices and one or more receiving devices, a first optoelectrical circuitry includes one or more optoelectrical sending devices, such as a laser, and a second optoelectrical circuitry includes one or more receiving devices, such as a photodiode. These first and second circuitries include electrical contact pads that connect to the sending and receiving devices through the electrical interconnect layer, and planar waveguides formed in the planar waveguide layer that provide an optical connection from the sending devices to a first upturned mirror and from the receiving devices to a second upturned mirror. During a test, one or more electrical contacts from the electrical portion of a probe head are brought into contact with the one or more contact pads on the PIC, an electrical signal is provided from a voltage or current source, connected to the electrical contacts, and an electrical signal is delivered through the contacts to activate the one or more sending devices in the first optoelectrical circuitry to emit an optical signal. This optical signal from the one or more sending devices propagates through the planar waveguides formed in the planar waveguide layer and the first optoelectrical circuitry to the first upturned mirror. The optical signal is reflected perpendicularly from its direction of propagation parallel to the surface of the substrate in the planar waveguide layer, to the optical portion of a probe head positioned to receive the reflected optical signal from this first upturned mirror. In some embodiments, the optical signal is received by an optoelectrical detector, such as a photodiode for example, on, in, or connected in some way to the probe head, such that the optical signal reflected from the first upturned mirror is detected. In some embodiments, the detected signal from the optoelectrical device in the probe head is processed within the probe head, and in some embodiments, electrical signals from the optoelectrical detector are received remotely by a parametric tester for further processing. In some embodiments, the one or more sending devices in the first optoelectrical circuitry, the first upturned mirror, and the first optoelectrical circuitry including the planar waveguides, are tested with the detector in the optical portion of the probe head. In some other embodiments, the one or more receiving devices in the second optoelectrical circuitry, the second upturned mirror, and the second optoelectrical circuitry including the planar waveguides, are tested with the emitter in the optical portion of the probe head.

In yet other embodiments, the one or more sender devices in the first optoelectrical circuitry, the one or more receiving devices in the second optoelectrical circuitry, the first and second upturned mirrors, and the first and second optoelectrical circuitries including the planar waveguides, are tested with both the detector and the emitter in the optical portion of the probe head. In some of the embodiments in which one or more of a sender and receiver are included in a test, the detector in the optical portion of the probe head that receives an optical signal from the first upturned mirror, sends an electrical signal to an optoelectrical emitter device in the optical probe head that then sends the emitted optical signal from the emitter to the second upturned mirror. In other embodiments, the detector on the probe head, activated by the signal from the first upturned mirror, sends an electrical signal to a parametric tester that in turn triggers emitting device or devices in the optical probe head to emit an optical signal to the second upturned mirror. In embodiments in which the detector and emitter are electrically connected, the probe head acts similarly to embodiments having an optical fiber loop in the probe head in that the optical signal from the first mirror is received by the detector in the optical probe head, and redirected through the re-emission of an optical signal from the electrically connected emitter, to the second upturned mirror. Using the activated detector to initiate the subsequent emission of an optical signal from an emitter on the optical probe head to the second mirror, performs a similar function to the optical loop with the exception that the optical signal that is provided to the second upturned mirror differs from the optical signal that was delivered to the optical probe head by the first optoelectrical circuitry. Importantly, however, in embodiments in which the probe head includes a detector for receiving an optical signal from the first upturned mirror and an emitter for sending an optical signal to the second upturned mirror, the detector and emitter devices in the probe head can also be configured in embodiments, to act independently, such that either the first optoelectrical sending circuitry or the second optoelectrical receiving circuitry of a PIC die are tested, or alternatively, both the first and second optoelectrical circuitries are tested. Independent control of the detector and the sender in the probe head offers a greater level of flexibility in testing options than simply rerouting the optical signal from the sending portion of the PIC through the optical probe head to the receiving portion of the PIC, as described in some embodiments with a looped waveguide in the optical probe head. In embodiments with independent control of the detecting and emitting devices in the optical probe head, the wafer level test structure, that includes the first and second upturned mirrors, and the methodology associated with the use of the upturned mirrors, are used to evaluate the any one or more of the sending device, the sending circuit, the receiving device, the receiving circuit, the electrical interconnect layer, the optical planar waveguides, an optical circuit on the PIC, or any other aspect of devices mounted on or to the photonic integrated circuit that are influenced by one or more electrical signals from the contact pad or by optical signals that are propagating through at least a portion of the PIC.

A "semiconductor" as used herein refers to, but is not limited to, a material having an electrical conductivity value falling between that of a metal conductor and an insulator. The material may be an elemental material such as silicon and germanium, or a compound material such as from the III-V family of semiconductors, including those between indium (In), gallium (Ga), and aluminum (Al) with nitrogen (N), phosphorous (P), arsenic (As), including for example InP, GaAs, GaN, GaP, InAs, and AlAs, and further including InGaAsP, GaAlAs, and other multi-elemental semiconducting alloys commonly utilized in photonic structures. A "metal" as used herein and throughout this disclosure refers to, but is not limited to, a material (element, compound, and alloy) that has good electrical and thermal conductivity. This may include, but not be limited to, aluminum, copper, gold, chromium, titanium, tantalum, tungsten, tin, silver, platinum, nickel, palladium, and combinations of such materials.

An "electrical interconnect" or "trace" as used herein refers to, but is not limited to, a material having good electrical conductivity and includes structures formed from thin films, thick films, and plated films for example of materials including, but not limited to, metals such as aluminum, copper, gold, chromium, tantalum, tungsten, tin, silver, platinum, nickel, palladium, titanium, and combinations of such materials, among others. An "electrode" or "contact", or "terminal" as used herein refers to, but is not limited to, a material having good electrical conductivity and that is formed on a surface. This includes structures formed from thin films, thick films, and plated films for example of materials including, but not limited to, metals and metal alloys.

A "planar waveguide layer" as used herein refers to, but is not limited to, a material that has good optical transmission properties with low optical signal attenuation, and through which the direction of optical signal propagation is parallel, or substantially parallel to the surface of a substrate. This may include, but is not limited to InP and alloys of InP, a wide range of alloys of Si, O, and N in the form of silicon oxynitride, and silicon oxide, among others. Additionally, multilayer structures of silicon oxynitride and silicon oxide are included. "Waveguides", as used herein include the core of the waveguide through which optical signal substantially propagates and may include the cladding layers, either above or below the core layer, or both above and below the core layer.

An "interposer" as used herein refers to a substrate with an electrical interconnect layer and a planar waveguide layer that are formed on the substrate as further described herein. A "substrate" as used herein refers to, but is not limited to, a mechanical support such as a semiconductor, an insulator, or a metal, or a combination of layers of one or more of a semiconductor, insulator, and metal upon which semiconductor structures, such as a photonic integrated circuit (PIC) and embodiments of the invention may be formed. This may include, but not be limited to, InP, GaAs, silicon, silica-on-silicon, silica, silica-on-polymer, glass, a metal, a ceramic, a polymer, or a combination thereof.

An "optical signal" as referred to herein refers to, but is not limited to, a signal that includes one or more wavelengths of light in the range of the visible and near infrared portions of the electromagnetic spectrum that include the range from 100 nm to 3000 nm. Particular applications are relevant to telecommunications applications, but not limited to, the ranges of the infrared spectrum from 1260 to 1565 nm, and more particularly to the range of 1530-1565 nm.

References to "an embodiment", "another embodiment", "yet another embodiment", "one example", "another example", "yet another example", "for example" and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment. Additionally, a planar waveguide layer 105 is formed on the electrical interconnect layer 103.

In embodiments, PICs with upturned mirrors are formed on interposer substrates that include the substrate, an electrical interconnect layer, and a planar waveguide layer. The upturned mirror provides access from a position normal to the surface for transmitting optical signals to, and receiving optical signals from, planar waveguides formed from the planar waveguide layer on the interposer. Light can be delivered to the planar waveguides in the interposer structure by reflection of light incident on the mirror from above. Similarly, light that originates from within the PIC can be reflected from the planar waveguides in the PIC by the upturned mirrors to a detector or other destination above the mirror.

In FIG. 1A(i), a cross sectional schematic view is shown of an interposer 109 that includes a planar waveguide layer disposed on a base structure 101. The base structure 101 in this embodiment includes an electrical interconnect layer 103 formed on a substrate 100. In embodiments, the base structure 101 forms a base or substrate for the formation of Photonic Integrated Circuits (PICs) using wafer level processing. Wafer level processing, as used herein, is a form of processing whereby a plurality of die is created on a substrate, and which is subsequently diced or singulated into individual die prior to packaging.

Substrate 100 in FIG. 1A(i) is a support structure upon which PICs can be formed in embodiments. Substrate 100 can be formed from one or more of a semiconductor, an insulator, or a metal, or a composite structure that includes, one or more layers of one or more semiconductors, one or more insulators, and one or more metals. Crystalline silicon is a commonly used semiconductor substrate and is an example of a material that can be used to form substrate 100. Other semiconductor such as indium phosphide and gallium arsenide can also be used. Other types of substrates may also be used.

In addition to the substrate 100, the base structure 101 also includes an electrical interconnect layer 103. Referring to the base structure 101 shown in FIG. 1A(i), and to the PIC structure shown in FIG. 1A(ii), metal traces 132 are shown in electrical interconnect layer 103. The metal traces 132 in layer 103, in embodiments, are metal lines, patterned, for example, using lithographic or damascene processing techniques. The electrical interconnect layer 103, in embodiments, is fabricated using multiple deposition and patterning steps to deposit and pattern the intermetal dielectric material 136 and metal traces 132. Techniques for forming electrical interconnect layers are understood in the art of semiconductor and photonic IC fabrication. It is important to note, that as used herein, the term "electrical interconnect layer" 103 refers to a layer that is a composite structure of multiple layers that may include multiple deposition and patterning steps to provide a structure of patterned and unpatterned insulating layers, and patterned metal layers within the patterned and unpatterned insulating layers, to form the electrical interconnect layer 103. The electrical interconnect layer 103 may also include, in embodiments, the addition of vertical interconnects 133 that extend, for example, between lateral metal lines or traces 132 within the electrical interconnect layer 103 and from the lateral metal traces 132 in the electrical interconnect layer 103 to, for example, contact pads 130 or other contacts at or near the surface of the PIC die 102 as discussed herein. Electrical interconnects 132,133 can also be used to form contacts with devices formed in the substrate 100.

A planar waveguide layer 105 is formed on the base structure 101 to form the interposer structure 109. The planar waveguide layer 105, in embodiments, can be a stacked film structure of dielectric layers, such as a stack of SiON layers, that includes a core layer, top and bottom cladding layers, and optionally, spacer layers, and buffer layers. The planar waveguide 102 can also be a semiconductor layer, and in some embodiments, a polymer layer. Optical signals propagate primarily in the core layer of waveguides 144, 146 formed from patterning of the planar waveguide layer.

Referring to FIGS. 1A(ii) and 1A(iii), an embodiment of a PIC die 102 is shown in the cross section and top down schematic views, respectively. The embodiment shown is formed on an interposer structure 109 that includes the planar waveguide layer 105 on base structure 101. The cross-section in FIG. 1A(ii) shows the various layers in the PIC die structure that includes the substrate 100, the electrical interconnect layer 103, and planar waveguides 144, 146. The patterned waveguides 144, 146 are formed from the patterning of the planar waveguide layer 105, and are also shown in the top-down view in FIG. 1A(iii). The PIC die 102 in FIGS. 1A(ii) and 1A(iii) show an optoelectrical circuit that includes one or more optoelectrical sending devices 122 and receiving devices 124, and one or more optical devices 140, 142. Optoelectrical devices 122, 124 on PIC die 102 can be formed in place on the die 102, or can be mounted devices that are formed elsewhere and mounted in place on the PIC die 102. Optoelectrical devices 122, 124 shown in the embodiment in FIG. 1A are optically connected to optical device 140, 142 through planar waveguides 144.

Optoelectrical sending device 122 is a device such as a laser, a light emitting diode (LED), or other light emitting device that emits an optical signal with the application of an electrical signal. Other forms of optoelectrical devices, such as a modulating device for encoding an optical signal with information, may also be combined with the laser or other sending devices to form a sending device 122. For example, in embodiments, a laser combined with a modulating device such as an electro-absorption modulator, or other form of signal modulating device is also a form of sending device within the scope of embodiments for a sending device 122.

Optoelectrical receiving device 124 is a device such as a photodiode that generates a voltage or current with the absorption of an optical signal. Other examples of a receiving device, in embodiments, include a photodetector, a charge coupled device (CCD), a detector, a spectrometer, or other light sensitive device that is capable of producing an electrical signal with incident light.

Optical device 140, 142 is a device or optical circuit such as a waveguide, an arrayed waveguide, an echelle grating, or combination of these devices, for example, through which the propagation of optical signals can be facilitated and guided, and through which the propagating signals can be interpreted, characterized, influenced, processed, modified, combined, or split, among others. By way of example, optical device 140,142, for example, can be used to combine one or more optical signals with individual wavelengths into one or more multi-wavelength signals, as in a multiplexer, or conversely can be used to separate a composite optical signal that includes one or more individual wavelengths into separate signals each at a given wavelength, as in a demultiplexer. Additionally, a range of these and other optical devices, and a range of combinations of these and other optical devices exist for the purposes of combining, separating, and otherwise influencing optical signals, and are within the scope of embodiments. In the embodiment shown in FIG. 1A(ii) and FIG. 1A(iii), a single optical device is shown for simplicity, although multiple optical devices 140, 142 and combinations of devices can be present within the PIC die 102 and remain within the scope of embodiments. As such, optical device 140 may be, for example, a multiplexing device used to combine the output from multiple sending devices, or a demultiplexing device for separating a multiplexed optical signal into individual wavelengths.

Similarly, a single optoelectrical device 122, 124 is shown in FIG. 1A(ii) and FIG. 1A(iii) for simplicity, although multiple optoelectrical devices and combinations of optoelectrical devices can be present within the PIC die 102 and remain within the scope of embodiments. Optoelectrical device 122, in some embodiments, for example is a set of eight lasers, each combined with an electro-absorption modulator to encode the optical signals from each of the lasers with information, and these eight signals can be combined into a single optical signal in an embodiment in which the optical device 140 is configured with a form of multiplexer 140, for example. In other embodiments, optoelectrical device 122 is another form and number of sending device 122 and optical device 140 is a multiplexer or other optical device 140. In other embodiments, the optoelectrical receiving device 124 is a set of eight photodiodes, and the optical device 142 is a demultiplexer. In other embodiments, optoelectrical device 124 is another form and number of receiving device 124 and optical device 142 is a demultiplexer or other optical device 142.

Electrical contact pads 130 on electrical interface 112, shown in the embodiment in FIGS. 1A(ii) and 1A(iii) are electrically connected to optoelectrical device 122, 124 through the metallization lines 132 in the interconnect layer 103. Vertical interconnections 133 provide electrical connections from the contact pads 130 to the underlying metallization lines 132 in the electrical interconnect layer 103. Electrical probe head 162a provides an interface through which electrical contact is made, in embodiments, between the electrical contact pads 130 on the PIC die 102, and electrical test equipment 160. Electrical test equipment, such as a parametric analyzer 160, is used to provide electrical signals 174 in the form of a voltage or current signal, for example, for activating some optoelectrical devices, such as sending devices 122, and for receiving information also typically in the form of a voltage or current from other optoelectrical devices, such as receiving devices 124.

In addition to the optoelectrical circuits that include optoelectrical and optical devices, the PIC die shown in FIG. 1A(ii) and FIG. 1A(iii) also show an upturned mirror structure 148 that is positioned to reflect optical signals 170 to and from the planar waveguide section 146 of the optoelectrical circuitry to enable optical coupling of the PIC die 102 to an optical probe head 162b for performing wafer level testing during the fabrication of the PIC die 102. Upturned mirror 148 is a structure incorporated into the PIC die 102 to facilitate functionality testing of the die prior to completion of the fabrication process, and is typically removed from the optoelectrical circuit upon completion of the fabrication process, prior to singulation of the die 102, as described herein. The upturned mirror can be configured to reflect upward an optical signal coming from a lateral direction, e.g., a direction parallel to a planar surface of the substrate, or to reflect an optical signal to a lateral direction from a direction above the planar surface. For example, the upturned mirror can reflect upward an optical signal coming from a waveguide disposed on the planar surface into a direction out of the planar surface, such as perpendicular to the planar surface, e.g., perpendicular to the substrate surface. Other directions can be used, such as directions making less than or equal to 5, 10, 15, 20, 25, 30, or 45 degrees from the perpendicular direction. In some embodiments, directions making greater than 45 degrees can be used. Further, the reflect signal can be focused or spread out. The upturned mirror can reflect an optical signal coming from above the substrate, such as from an optical probe head, to a waveguide disposed on the planar surface of the substrate.

Prior to singulation, a plurality of die 102 is formed concurrently on the substrate as is common in the art of semiconductor and photonic IC fabrication. Alignment of the optical probe head 162b with the upturned mirror on the PIC die 102 is achieved, in some embodiments, using one or more alignment marks 113, 114 in an automated aligning apparatus commonly used in semiconductor fabrication. In other embodiments, the probe head is aligned using optical or other pattern recognition techniques.

The upturned mirror 148 is optically coupled or connected to the optical device 140, 142 through planar waveguide 146. Layer 138 shown in the embodiment is a dielectric layer that could be one or more or a combination of a cladding layer, a passivation layer, a planarization layer, a spacer layer, and a buffer layer, and may include other properties and functionalities.

The upturned mirror structure 148 shown in FIG. 1A(ii) to have a concave surface. In some embodiments, the reflective surface is concave. In other embodiments, the reflective surface does not have curvature but rather has a surface that is not curved. In some embodiments for which the reflective surface is not curved, for example, the mirror is a non-curved surface at a forty-five degree angle from the plane of the wafer. In embodiments, the surface of the reflective mirror 148 has concave properties such that a substantial portion of the optical signal is reflected perpendicularly to the plane of the wafer as described herein. It is to be understood that the entire optical signal need not be reflected perpendicularly to the substrate, and that in embodiments with curved mirrors, some broadening of the reflected optical signal is anticipated.

Electrical probe head 162a and optical probe head 162b in some embodiments are two probe heads aligned independently to relevant features on the PIC die 102 as described herein. In these embodiments, for which probe heads 162a, 162b are configured for independent alignment, multiple alignment marks on the die 113, 114 can be used to facilitate the alignment of each of the probe heads to features on the PIC die 102. In other embodiments the electrical probe head 162a and optical probe head 162b are components of a single probe head 162 that are mechanically connected so that movement of electrical portion 162a causes a corresponding movement in the optical probe head 162b.

In the embodiment shown in FIG. 1A(ii) and FIG. 1A(iii), the upturned mirror structure is provided in a region of the die 102 allocated for scribing or dicing the plurality of die within a larger substrate or wafer into singulated die. The upturned mirror structure 148 is provided on the die to facilitate optoelectrical testing of the functionality of the optoelectrical circuitry and devices on the die and is removed from the optoelectrical circuitry on the die 102 after functionality or parametric testing. Fabrication steps, subsequent to testing, include the formation of v-grooves within the length of planar waveguide section 146. The scribe line 118 in FIGS. 1A(ii) and 1A(iii) illustrates an embodiment of the relative positions of the upturned mirror structure 148 and scribe line 118 that facilitates such removal of the upturned mirror 148 from the optoelectrical circuitry on the die 102.

Figure 1B:
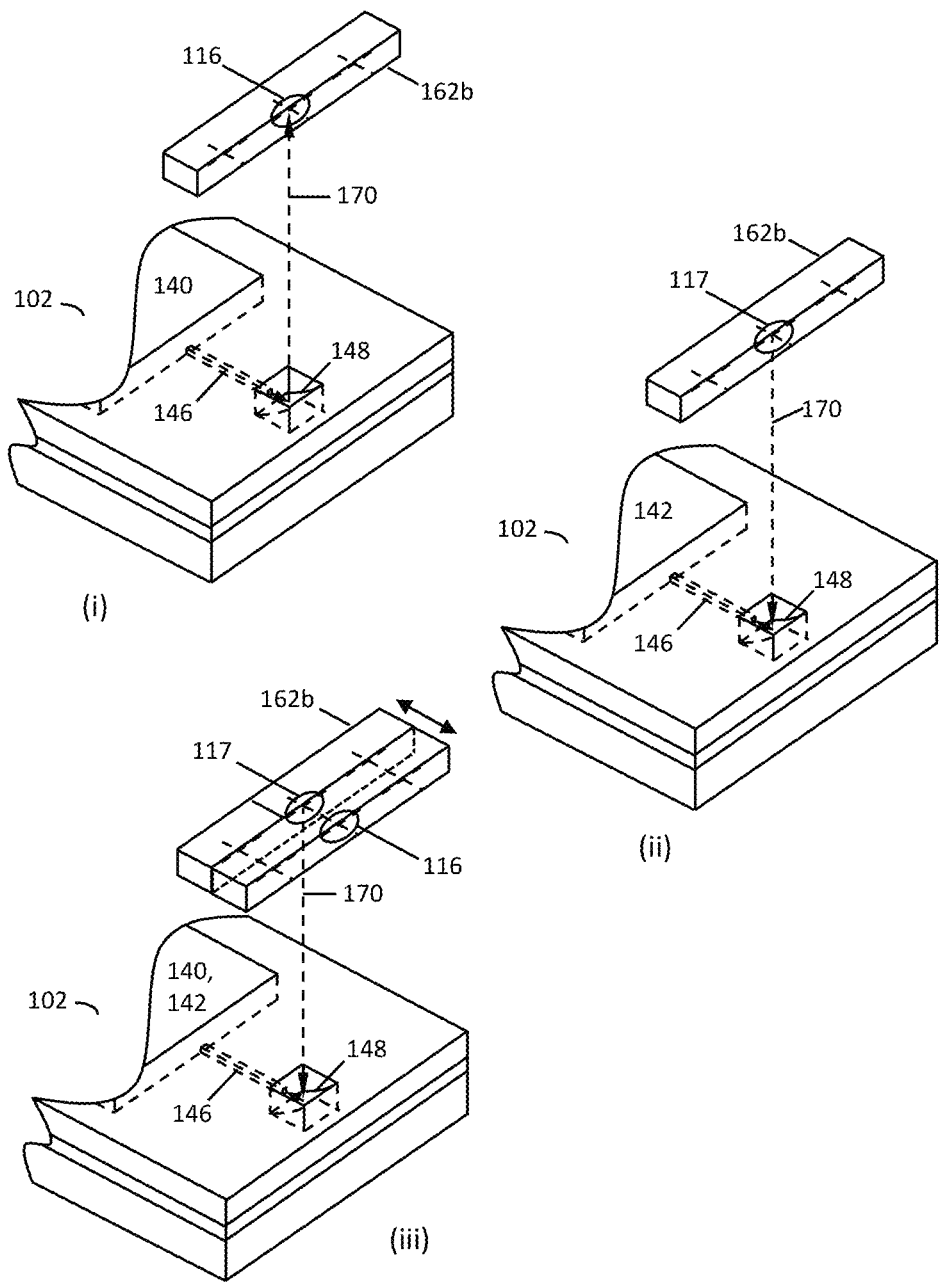
FIG. 1B. Optical portion 162b of the probe head 162 shown with embodiments of testing configurations (i) equipped with a detector 116 for testing of PIC 102 that includes one or more sending devices 122, and (ii) equipped with an emitter 117 for testing of PIC 102 that includes one or more receiving devices 124, and (iii) a probe head equipped with a detector 116 and emitter 117 for testing of PICs 102 that have sending devices 140 and receiving devices 142.

Referring to FIG. 1B(i), optical probe head 162b is shown in position for wafer level testing with detector 116 in embodiments in which optoelectrical device 122/124 includes one or more sending devices 122 in the PIC die 102. This figure shows planar waveguide section 146 optically connected to mirror structure 148 and to optical device 140. FIG. 1B(i) also shows optical probe head 162b configured with a detector 116 and in position for receiving a signal from the sending device 122 of the PIC 102. During a wafer level test, optical signal 170 is emitted from a sending device 122, and this signal propagates through the optical device 140 and through the planar waveguide section 144 to the mirror structure 148. Upon reflection by the mirror structure 148, optical signal 170 shown in FIG. 1B(i), is reflected perpendicularly from the direction of propagation in the planar waveguide 146, to the detector 116 in the optical probe head as in the embodiment shown. In some embodiments, the detector 116 can include an optical portion for receiving the optical signal 170, optoelectrical portion to convert the optical signal to an electrical signal, and an electrical portion to analyze the electrical signal. The optical portion can be aligned to the mirror structure 148, for example, having another aligned mirror structure to receive the optical signal from the mirror structure 148, an aligned waveguide, or an aligned focus lenses aligned to the optical signal 170. Alternatively, the optical portion can include a grating structure, which can facilitate the alignment with a large grating area for receiving the optical signal 170.

In FIG. 1B(ii), optical probe head 162b is shown in position for wafer level testing configured with emitter 117 in embodiments in which optoelectrical device 122/124 includes one or more receiving devices 124 in the PIC die 102. This figure shows planar waveguide section 146 connected to mirror structure 148 and to optical device 142. FIG. 1B(ii) also shows optical probe head 162b configured with an emitter 117 and in position for sending an optical signal to the receiving device 124 of the PIC 102. In this embodiment, during a wafer level test, optical signal 170 is emitted from an emitting device 117 on the optical probe head 162b, and this signal is incident on the upturned mirror 148 and is reflected by the mirror into planar waveguide section 146, within which all or part of the signal propagates through the optical device 142 and planar waveguides to the one or more receiving devices 124. In some embodiments, the emitting device 117 can provide a focusing signal 170 aligned to the mirror structure 148, such as through a focusing lens. Alternatively, the emitter device can provide a broad signal, e.g., a signal covering a large area, to facilitate the alignment with the received mirror structure.

In FIG. 1B(iii), an embodiment is shown for which the optical probe head 162b includes a detector 116 and an emitter 117 for embodiments of the PIC die 102 in which the optoelectrical device 122/124 includes one or more sending devices 122 and one or more receiving devices 124 for wafer level testing, or for which the optical probe head 162b is configured for testing of PICs with sending devices 122 and for testing of PICs with receiving devices 124.

In the embodiments shown in FIG. 1B, the detector 116 and emitter 117 in the probe head 162b are shown at the centers of the probes, and the upturned mirror 148 is shown below on the PIC die 102. Optical signals 170 are also shown. In other embodiments, the detectors 116 are positioned elsewhere on the optical probe head and the upturned mirrors 148 are positioned correspondingly to facilitate the alignment of the detector 116 in the probe head 162b with the upturned mirror 148 on the PIC die 102. In other embodiments, one or more detectors 116 and emitters 117 are provided in the optical probe head 162b to facilitate multiple tests within a single alignment step. In embodiments of the optical probe head 162b equipped with multiple detectors 116 or multiple emitters 117, or both, either serial or parallel testing of devices or circuits on the same die 102 or for serial or parallel testing of multiple PIC die 102 with a single alignment step could significantly reduce the setup time required between tests for a plurality of PIC die 102.

In FIG. 1B(iii), a probe head 162b is equipped with one or more detectors 116 and one or more emitters 117, the alignment of the optical probe head 162b with an upturned mirror 148 on the PIC die 102 can be accomplished with the use of alignment marks 114 as shown, for example, in FIG. 1A(iii). FIG. 1A(iii) shows alignment marks 113 and 114. In an embodiment, one or more alignment marks 114 are used, for example, to align the detector 116 in the optical probe head 162b with the upturned mirror 148 on the PIC die 102, and one or more of the same or different alignment marks are used, for example, to align the emitter 117 in the optical probe head 162b with the upturned mirror 148.

Referring again to FIG. 1A(ii) and FIG. 1A(iii), in embodiments for which the optoelectrical device is a sending device 122, electrical probe connections on the electrical probe head 162a are brought into contact with the electrical contact pads 130 on electrical interface 112 during wafer level testing to provide an electrical signal 174 to sending device 122. Electrical signal 174 activates the optoelectrical sending device 122 to form an optical signal 170. Electrical probe 162a is aligned to PIC die 102 using, for example, alignment marks 113 or other alignment mark or feature on the die 102 or elsewhere on the wafer. Activated optoelectrical sending device 122 emits an optical signal 170 that propagates through planar waveguides 144 and optical device 140 to the upturned mirror 148, is reflected perpendicularly from the direction of propagation in the planar waveguide (normal to the surface of the PIC die 102) and is incident on optical probe 162b as shown in FIG. 1A(ii) and FIG. 1B(i). Optical probe 162b is aligned in some embodiments with alignment marks 114, for example. Alignment marks enable automation of the alignment process with appropriately configured alignment systems. In an embodiment, optical probe 162b includes an optical detector 116 that receives the optical signal 170 and sends an electrical signal 174 to a parametric analyzer 160 or other measurement equipment for forming an assessment of the functionality of the PIC die 102, or an aspect of the functionality of the PIC die 102. If, for example, an optical signal 170 from one or more sending devices 122 is detected in the optical probe head 162b, and a corresponding electrical signal from the optical detector 116 in the optical probe head 162b is sent to a parametric analyzer 160, then the strength of the electrical signal can be used to assess the level of functionality of the PIC die 102. And, if, for example, no optical signal 170 is detected in the optical probe head 162b, then the PIC die 102 may be deemed to be non-functional. Data from each functionality test, is used for example in embodiments, to assess one or more aspects of the functionality of the PIC die 102, and to identify one of a number of post-testing options for the tested die that may depend on the outcome of the functionality test. If, for example, a weak signal is detected, or no signal is detected, at the optical probe head 162b during a test of a specific PIC die, then the die can be marked for exclusion from specific aspects of subsequent processing or testing. In another example, statistical data can be collected for within-wafer and for wafer-to-wafer comparison to assess the overall design of the PIC die 102, and other statistical information about the functionality of the devices, and the repeatability of the fabrication process.

In other embodiments, for which the optoelectrical device is a receiving device 124, electrical probe connections on the electrical probe head 162a are brought into contact with the electrical contact pads 130 on electrical interface 112 during wafer level testing to receive an electrical signal 174 from the receiving device 124 when the optoelectrical receiving device 124 receives an optical signal from the optical probe head 162b. During wafer level testing, optical probe head 162b includes an optical emitter 117, as shown in FIG. 1B(ii), that receives an electrical signal 174 from parametric tester 160, other voltage or current source, or other source of an optical or electrical signal, and that activates the emitting device 117 in the optical probe head 162b to emit an optical signal 170. The optical signal 170 from the emitting device 117 in the optical probe head 162b, upon being emitted from the optical probe head 162b, is incident on the upturned mirror 148 as shown in FIGS. 1A(ii) and 1B(ii). Optical probe 162b is aligned in some embodiments with alignment marks 114, or other alignment marks or features on the die 102 or elsewhere on the wafer. In other embodiments, alignment of the optical probe head 162b is achieved with optical pattern recognition, in which specific patterns on the surface of the PIC die 102 are used to align an optical emitter 117 in the optical probe head 162b with the upturned mirror 148 on the surface of the die 102. The optical signal 170 is reflected perpendicularly or substantially perpendicularly from the direction of travel from the optical probe 162b into the planar waveguide section 146 of the planar waveguide 144, through the planar waveguide section 146 and the optical device 142 to the one or more receiving devices 124. Receiving device 124, upon absorption of an optical signal 170 from the optical probe head 162b, sends an electrical signal through the metal traces 132 in the electrical interconnect layer 103, and through the contact pads 130 in the electrical interface 112, to the electrical probe head 162a, and to a parametric tester 160 or other measurement equipment for forming an assessment of the functionality, or an aspect of the functionality of the PIC die 102. If, for example, an electrical signal 174 is detected in the electrical probe head 162a from the one or more receiving devices 124, and an electrical signal from the detector in the electrical probe head 162a is sent to a parametric tester 160, then the strength of the electrical signal can be used to assess the level of functionality, or an aspect of the functionality of the PIC die 102. If, in another example, no electrical signal 174 is detected in the electrical probe head 162a, then the PIC die 102 may be deemed to be non-functional. Data from each functionality test, is used for example in embodiments, to assess one or more aspects of the functionality of the PIC die 102, and to identify one of a number of post-testing options for the tested die that may depend on the outcome of the functionality test. If, for example, a weak signal is detected, or no signal is detected, at the electrical probe head 162a during a test of a specific PIC die 102, then the die can be marked for exclusion from specific aspects of subsequent processing or testing. In another example, statistical data can be collected for within-wafer and for wafer-to-wafer comparison to assess the overall design of the PIC die 102, and other statistical information about the functionality of the devices, and the repeatability of the fabrication process. The strength of the electrical signal 174 is used, for example, in some embodiments, to assess optical losses in the PIC die 102 as measured by the magnitude of the voltage measured at the parameter analyzer 360, and the PIC die 102 are sorted by the optical loss measurement as anticipated from the voltage measurement. Other parameters related to the strength or measure of quality of the electrical signal are also used in other embodiments, for sorting, qualifying, or otherwise assessing the quality or functionality of the PIC die 102 after testing.

Upon completion of the testing, the upturned mirror 148 is removed, in embodiments, from the optoelectrical circuitry to facilitate the inclusion of a v-groove or mounting block to facilitate the subsequent mounting of an optical fiber to the PIC die 102. An outline 151 of a v-groove location, in an embodiment, is shown in the top-down view in FIG. 1A(iii). Optical fibers are mounted to the die 102 in the v-grooves in some embodiments, after fabrication, and these v-grooves are positioned such that the core of the fiber optic cable is aligned with the planar waveguide section 146 shown in the embodiment in FIG. 1A(iii). Insertion of the v-grooves after testing requires removal or isolation of the upturned mirror 148 from the optoelectrical circuitry on the PIC die 102. In some embodiments, the upturned mirror 148 is formed in a scribe line 118 to facilitate full or partial removal and in other embodiments, the upturned mirror 148 remains in place, fully or partially, on the die 102 for which it is used to perform a test, or on a neighboring die as described herein. In the embodiment shown in FIG. 1A(ii) and FIG. 1A(iii), the width of an example scribe line 116 is shown to illustrate an embodiment for the removal of the upturned mirror 148 as a consequence of its positioning within the scribe line 116. In this example embodiment, the placement of the upturned mirror 148 in the scribe line 116 provides a means for removal of the upturned mirror 148 and for the formation of the v-groove. Other example embodiments in which the scribe line 118 and the upturned mirror 148 are positioned for removal of all or part of the upturned mirror structure 148 are provided herein.

Figure 2A:
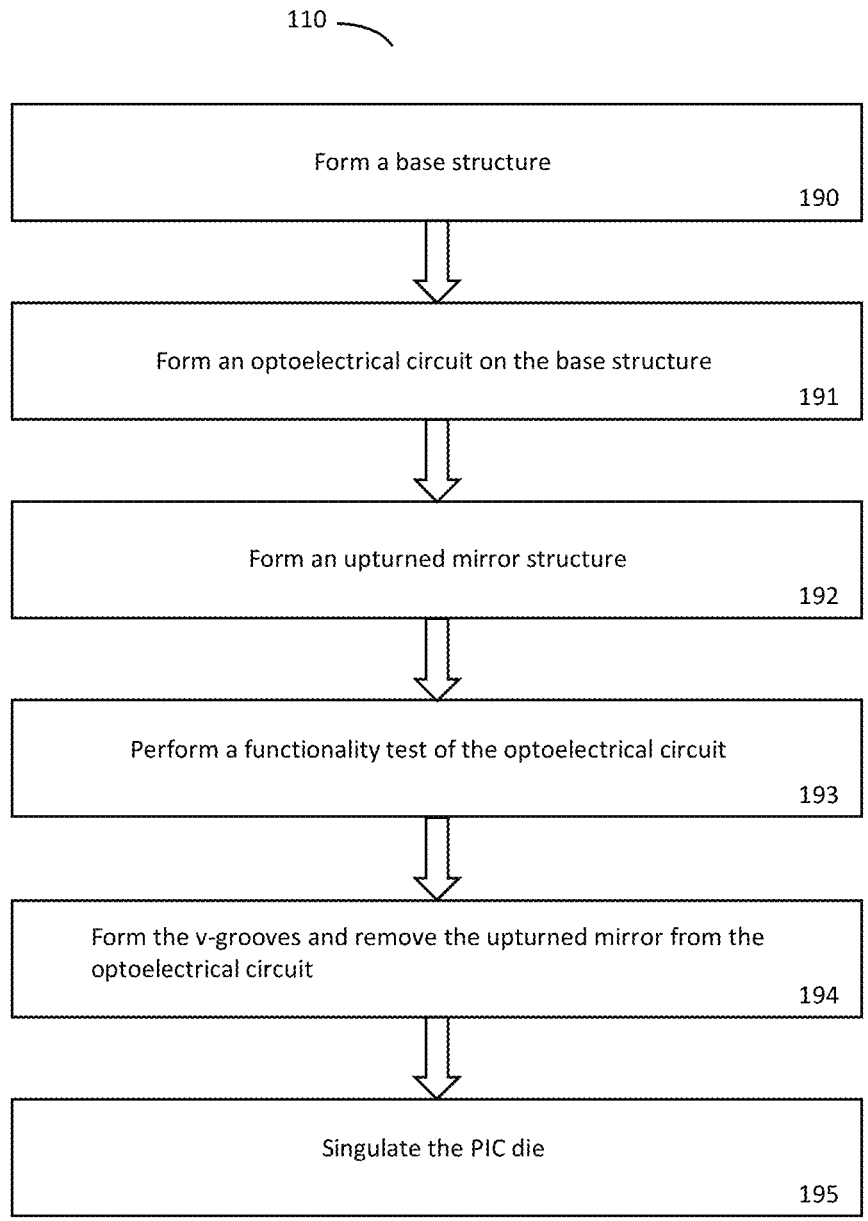
FIG. 2A. Flowchart for the method of the forming and testing of embodiments of a PIC die 102 formed on a base structure 101.

In FIG. 2A, a flowchart is provided to illustrate an embodiment of a method 110 for the formation and testing of a PIC die with one or more upturned mirrors. Method 110 is described in conjunction with the numbering of the elements of the embodiment described in FIGS. 1A and 1B. Step 190 shown in this embodiment is the formation of a base structure 101. The base structure 101, as described herein is a structure that includes an electrical interconnect layer 103 formed on a substrate 100.

In FIG. 2A, Step 191 in method 110 describes the formation of an optoelectrical circuitry on the base structure 101. An optoelectrical circuitry, refers to, but is not limited to, a circuit that includes optoelectrical devices 122, 124 and optical devices 140, 142. Additionally, the optoelectrical circuitry includes the electrical and optical interconnections required to facilitate the transport of electrical and optical signals. Electrical interconnections, for example, are required to connect optoelectrical devices to electrical contact pads, and in some embodiments to other optoelectrical devices and electrical devices in the circuitry. Similarly, optical interconnections are also provided in the optoelectrical circuitry to facilitate the transmission and propagation of optical signals between optoelectrical devices and optical devices. A planar waveguide layer 105 is formed on the electrical interconnect layer 103 of base structure 101, in embodiments, wherein the planar waveguide layer 105 is used to form the optical interconnections such as patterned waveguides 144,146.

In Step 192, one or more upturned mirrors 148 are formed on the base structure 101. Upturned mirror structures 148 facilitate optical communication between the patterned planar waveguides 144, 146 and optical probe head 162b. The upturned mirror structures 148 are formed on the base structure 101, in an embodiment, for example, using a process methodology further described herein.

Referring to Step 193, a functionality test of the optoelectrical circuitry is performed. A wafer or other form of substrate upon which the base structure 101 has been formed and a plurality of die 102 have been formed to an extent for which a functionality test is warranted, is placed, manually or in an automated loading process, into a testing apparatus and one or more probe heads and corresponding PIC die features are brought into alignment. Upon alignment of the corresponding PIC die features and probe head features, an electrical portion 162a of a probe head is brought into alignment with the electrical contact pads 130 on at least one PIC die 102. Additionally, an optical portion 162b is aligned with the upturned mirror structure 148 of the same die 102. In an example embodiment, for which the optoelectrical circuitry is configured with one or more sending devices 122, the parametric analyzer sends an electrical signal 174 to at least one of the optoelectrical sending devices 122 through the electrical probe head 162a, the contact pads 130, and the electrical interconnects 132 in the electrical interconnect layer 103 to the contact terminals on the sending device 122. This electrical signal causes the sending device 122 to form an optical signal 170 that propagates through planar waveguides 144 in the optoelectrical circuitry to the upturned mirror 148. The upturned mirror 148 reflects the optical signal into the optical probe head 162b as described herein. In embodiments, the optical probe head 162b is a probe head configured to detect and measure one or more properties of the reflected optical signals 170 from the mirror 148 that originate from the optoelectrical circuitry on the PIC die 102. In these embodiments, the optical probe head 162b is equipped with one or more detectors 116 that receive the optical signals 170 reflected by the upturned mirror 148 from the PIC die 102. Measurements of the one or more properties of the optical signals 170 are typically performed by a parametric analyzer 160 or other measurement device electrically connected to the detector 116 in the optical probe head 162b. Step 193 includes the acquisition and optional storage of one or more of the electrical measurements, a derivation from the electrical measurements, and a calculation that includes one or more of the electrical measurements, or other form of data derived in some manner from the information obtained from one or more of the electrical measurements from the detector into a database or storage medium, in this embodiment.

Other embodiments of Step 193 include the placing steps and aligning steps described in this example embodiment, but may differ with regard to the role of the parametric analyzer as described in other embodiments herein. In other embodiments for example, the optoelectrical circuitry is configured with one or more receiving devices 124. In Step 193 of the embodiment with a plurality of PICs with one or more receiving devices 124, a wafer or other form of substrate upon which the PICs 102 have been formed to an extent for which a functionality test is warranted, is placed, manually or in an automated loading process, into a testing apparatus and one or more probe heads and corresponding PIC die features are brought into alignment. Upon alignment of the corresponding PIC die features and probe head features, an electrical portion 162a of a probe head is brought into alignment with the electrical contact pads 130 on at least one PIC die 102. Additionally, an optical portion 162b is aligned with the upturned mirror structure 148 of the same die 102. In an example embodiment, for which the optoelectrical circuitry is configured with one or more receiving devices 124, the optical probe head 162b is a probe head configured to emit optical signals 170 that are incident upon and reflected by the upturned mirror 148 into the optical circuitry 108 on the PIC die 102. In these embodiments, the optical probe head 162b is equipped with one or more emitters 117 that emit optical signals 170 that are reflected by the upturned mirror 148 into the optical circuitry in the PIC die 102. The optical signals 170 in the optoelectrical circuitry in these embodiments, are received by receiving devices 124 in the optoelectrical circuitry, causing electrical signals to be generated by the one or more receiving devices 124. One or more properties of these electrical signals from optoelectrical receiving devices 124 are then detected, measured, or otherwise received by a parametric analyzer 160 in electrical communication with the receiving devices 124, and information obtained from the test is optionally stored in a database or storage medium, concluding Step 193 in this example embodiment.

In Step 194, the upturned mirror 148 is removed from the optoelectrical circuit. Removal of the upturned mirror 148 is performed in embodiments, to enable the attachment of external fiber optic cables or other waveguides to the PIC die 102 in proximity to the planar waveguide section 146. The optical output from the optoelectrical circuitry, in embodiments with sending devices 122, exits the optoelectrical circuitry through the planar waveguide section 146. And in embodiments, with receiving devices 124, the optical input is provided through planar waveguide section 146. Access to the edge facet of the waveguide section 146, therefore requires removal of the upturned mirror structure 148 from the optoelectrical circuitry. In embodiments, a portion of the planar waveguide section 146 is removed during the formation of the v-grooves to effectively remove the upturned mirror 148 from the optoelectrical circuit. The formation of the v-grooves within the length of the planar waveguide section 146 facilitates the removal of the upturned mirror 148 from the optoelectrical circuit. In some embodiments, physical removal of the upturned mirror structure 148 is preferred. In these embodiments, the mirror structure 148 can be placed in a scribe line to facilitate the removal of the mirror structure 148 from the die 102 while preserving area on the die 102.

In Step 195, upon completion of the formation of the v-groove, and any other required steps, the PIC die 102 are singulated into separate die. Singulation or isolation of the die is accomplished in embodiments with a dicing process, an etch process, a laser dicing process, a combination of an etching and a dicing process, or other method of die separation. In other embodiments, a partial etch, a partial dicing process, a laser dicing process, or a combination of a partial etch and a mechanical process is utilized to isolate the individual PIC die 102. Methods for die singulation or isolation are understood by those skilled in the art.

Figure 2B:
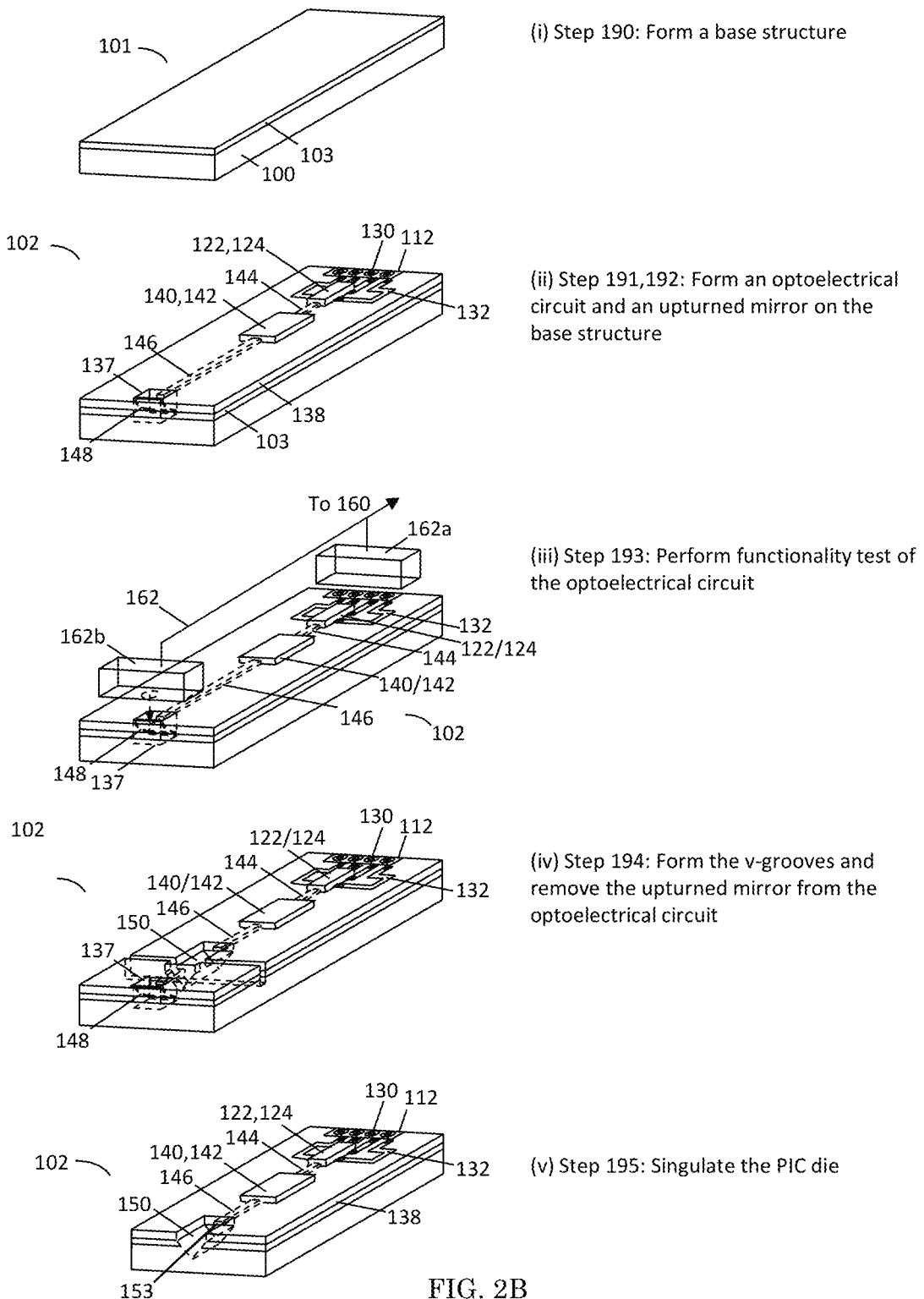
FIG. 2B. Schematic drawings of steps in an embodiment of a process flow for the fabrication and testing of a PIC die 102 with an upturned mirror formed in the interposer substrate.

Referring to FIG. 2B, a sequence of isometric drawings is shown that further illustrate the process steps in FIG. 2A and that further describe the process flow for the formation and testing of PIC die 102 using upturned mirror 148. In FIG. 2B(i), corresponding to Step 190, a base structure 101 is formed that includes an electrical interconnect layer 103 on a substrate 100. The substrate 100 refers to, but is not limited to, a mechanical support such as a semiconductor, an insulator, or a metal, or a combination of layers of one or more of a semiconductor, insulator, and metal upon which semiconductor structures, such as a photonic integrated circuit (PIC) and embodiments of the invention may be formed. This may include, but not be limited to, InP, GaAs, silicon, silica-on-silicon, silica, silica-on-polymer, glass, a metal, a ceramic, a polymer, or a combination thereof.

Steps 191 and 192 of FIG. 2A, are further illustrated in FIG. 2B(ii) and include the formation of an optoelectrical circuit and an upturned mirror on the base structure 101. A planar waveguide layer 105 (See FIG. 1A) is formed and patterned to form patterned planar waveguides 144 and planar waveguide section 146. Planar waveguide section 146 in the embodiment shown, is the section of planar waveguide 144 that optically couples the optoelectrical circuitry that includes sending device 122 or receiving device 124 of PIC die 102 with the upturned mirror 148. The upturned mirror 148 is formed in recess 137. The optoelectrical circuit of die 102 includes the electrical interface 112 with electrical contact pads 130 that are electrically connected through the metal traces 132 in the electrical interconnect layer 103 to optoelectrical devices 122 or 124. Additionally, the optoelectrical circuit includes one or more of optical devices 140, 142. Insulation layer 138 is one or more of a layer or combination of layers that may include a planarization layer, a spacer layer, a buffer layer, and a cladding layer, among other layers required in the formation of the optoelectrical circuitry.

Step 193 of FIG. 2A is further illustrated in FIG. 2B(iii) in which probe head 162 is shown to provide electrical and optical connections between the PIC die 102 and a parametric analyzer 160 or other form of voltage source and means for measuring voltage, current, or other electrical parameter. Probe head 162 includes an electrical probe head portion 162a that couples electrically to the PIC die 102 and an optical probe head portion 162b that couples optically to the PIC die 102. Step 193 includes the alignment of the electrical contacts of the electrical probe head portion 162a with electrical contact pads 130 on the PIC die 102 and the alignment of the optical probe head portion 162b of the probe head 162 with the upturned mirror 148. In an embodiment, the functionality testing that includes the electrical and optical probe heads 162a, 162b also includes one or more of an application of a voltage from the parametric tester 160 to activate sending device 122 and the application of an optical signal to the upturned mirror 148 that propagates through all or a portion of the optoelectrical circuitry 108 to activate the receiving device 124.

Step 194 of FIG. 2A is further illustrated in FIG. 2B(iv) in which additional processing of the PIC die 102 is performed and includes the formation of v-groove 150 within a portion of the PIC die 102 occupied by the planar waveguide section 146. V-grooves are commonly utilized in PICs to support the attachment or mounting of optical fibers to PIC die 102. The formation and use of the v-grooves 150 enables the alignment of the core of a mounted optical fiber cable with the planar waveguide section 146.

After the formation of the v-grooves 150 in Step 194 of the embodiment shown in FIG. 2B(iv), the PIC die 102 is scribed or diced to separate or otherwise remove the mirror structure 148 from the optoelectrical circuit as shown in Step 195 in FIG. 2B(v). Removal of the mirror structure 148 is typically performed, in embodiments, in the process of die singulation. Singulation or isolation of the die is accomplished in embodiments with a dicing process, an etch process, a laser dicing process, or a combination of an etching and a dicing process. In other embodiments, a partial etch, a partial dicing process, a laser dicing process, or a combination of a partial etch and a mechanical breaking process is utilized to singulate the individual PIC die 102. Methods for die singulation or isolation are understood by those skilled in the art.

Step 195 of FIG. 2A is further illustrated in FIG. 2B(v) in which an embodiment of a completed form of a PIC die 102 is shown after separation of the mirror structure 148 from the optoelectrical circuit as would be anticipated after an example die singulation process. Additional example embodiments of the separation or removal of the mirror structures are further described in herein.

Figure 3A:
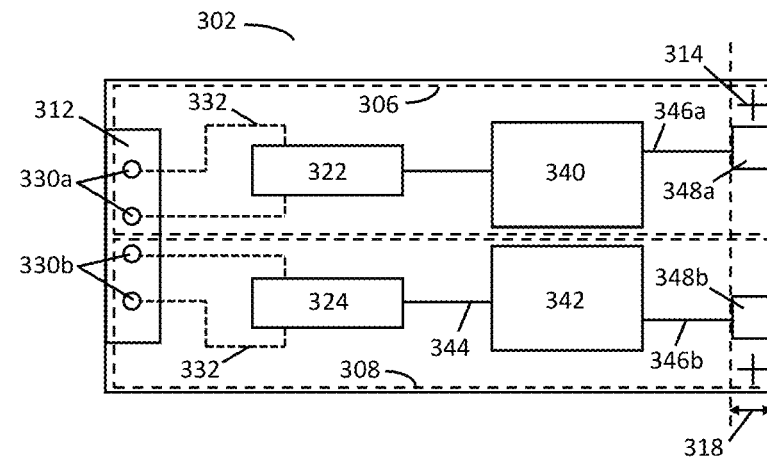
FIG. 3A. Schematic drawing that includes functionality test apparatus and an embodiment of a PIC 302 that includes a sender circuit 306 optically connected to an upturned mirror 348a and a receiver circuit 108 that is optically connected to an upturned mirror 348b: (i) top-down view, and (ii) cross section.
Figure 3A:
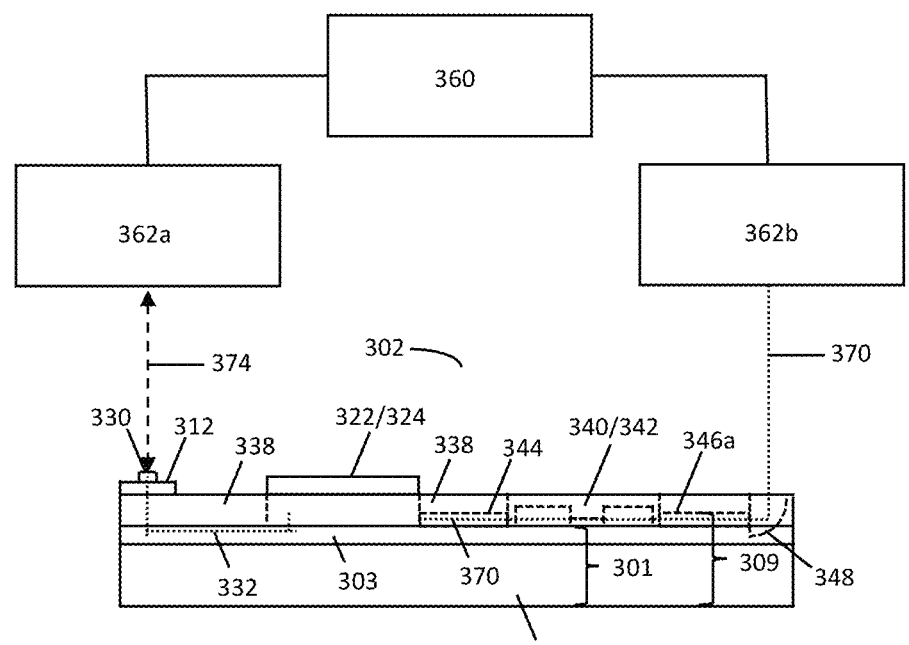

Referring to FIG. 3A(i), a top-down schematic view is shown and in FIG. 3A(ii) a cross-section schematic drawing is shown for an embodiment of a PIC die 302 that includes a first optoelectrical circuitry 306 and a second optoelectrical circuitry 308. The first optoelectrical circuitry for PIC die 302 is shown in the upper portion of FIG. 3A(i), and a second optoelectrical circuitry 308 is shown at the lower portion of FIG. 3A(i). The first optoelectrical circuitry 306 includes one or more sending devices 322 and the second optoelectrical circuitry 308 includes one or more receiving devices 324. The cross section in FIG. 3A(ii) shows an interposer structure 309 that includes an optical planar waveguide layer (see, for example, layer 105 in FIG. 1A(i)) from which patterned optical waveguides are formed 344, 346, and a base structure 301. The base structure 301 includes electrical interconnect layer 303 on substrate 300. The cross section in FIG. 3A(ii) also includes an electrical interface 312 with electrical contact pads 330, and first and second reflective mirrors 348a, 348b.

In the embodiment shown in FIGS. 3A, the first optoelectrical circuitry 306 is a sending portion 306 of the PIC die 302 and includes at least one sending device 322 such as a laser. Other optoelectrical devices, such as an electroabsorption modulator or other form of optoelectrical device, electrical device, and optical device may also be included in optoelectrical device 322 and remain within the scope of embodiments. The first optoelectrical circuitry also includes one or more optical devices or optical circuits 340, such as a multiplexer, an arrayed waveguide, a grating, and a waveguide, among others. Any one or a number of optical devices and optical circuitry can be included in optical device 340 and remain within the scope of embodiments.

Also shown in the embodiment in FIG. 3A, the second optoelectrical circuitry 308 is a receiving portion 308 of the PIC die 302 and includes at least one receiving device 324, such as a photodiode. Other optoelectrical devices, electrical devices, and optical devices may also be included in optoelectrical device 324 and remain within the scope of embodiments. The second optoelectrical circuitry 308 also includes one or more optical devices or optical circuits 342, such as a demultiplexer, an arrayed waveguide, a grating, and a waveguide, among others. Any one or a number of optical devices and optical circuitry can be included in optical device 342 and remain within the scope of embodiments.

Contact pads 330 in electrical interface 312 provide a means for external connections, such as a probe, wire bonds, and flip chip contacts, for example, to the sending devices 322 and receiving devices 324, and are used in embodiments for providing electrical contact from the optoelectrical devices 322, 324 to the electrical probe head 362a shown in FIG. 3A(ii). Planar waveguides 344 are patterned from a planar waveguide layer 105 as described, for example, in FIG. 1A, and planar waveguide sections 346 are the lengths or sections of the planar waveguide 344 that interface with the mirror structures 348a, 348b. Planar waveguide section 346a is in optical alignment with the first upturned mirror 348a of the sending circuit 306 to facilitate the transfer of optical signals 370 between the planar waveguide 346a and the upturned mirror 348a. Similarly, waveguide section 346b is in optical alignment with the second upturned mirror 348b of the receiving circuit 308 to facilitate the transfer of optical signals 370 between the planar waveguide section 346b and the upturned mirror 348b. Other features shown in the embodiment in FIG. 3A(ii) include the dielectric layer 338. In some embodiments, the dielectric layer 338 is a single layer. In other embodiments, the dielectric layer is a composite structure consisting of a number of dielectric layers. Dielectric layer 338 in some embodiments is one or more of an insulating layer, a spacer layer, a buffer layer, a cladding layer, and a planarization layer, for example. In some embodiments, receptacles are formed in the layer 338 for mounting of one or more optoelectrical, electrical, or optical devices or combinations of these or other devices onto the PIC die 302. Receptacles in the layer 338 are utilized in some embodiments, for example, to receive optoelectrical devices 322, 324, and optical devices 340, 342. Receptacles formed in the insulating layer 338, in some embodiments, may have electrical contacts 332 formed within the receptacles to provide electrical contact to surface mounted devices, mounted in the receptacles.

FIG. 3A(ii) further shows electrical probe head 362a and optical probe head 362b. Electrical probe head 362a and optical probe head 362b in some embodiments, are combined into a single probe head with both electrical and optical probing functionalities as described herein. The electrical probe head 362a is connected to a parametric analyzer 360 or other form of voltage or current source and measurement device, capable of sending and receiving electrical signals for the purpose of providing an electrical voltage or current to the electrical interface of the PIC die 302, for example, to activate sending device 322, and for receiving an electrical signal for example, from receiving device 324. In embodiments, electrical probe head 362a provides electrical signals to the contact pads 330 of the electrical interface 312 on the PIC die 302 as shown that are connected to the at least one sending device 322 through the electrical interconnects 332 in the electrical interconnect layer 303. The one or more sending devices 322 form optical signals 370 resulting from the activating electrical signals 374 applied to the contact pads 330 of the electrical interface 312, and subsequently to the sending device 322. The optical signal 370 from the sending device 322 propagates through the planar waveguides 344 and optical devices 340 of the PIC die 302 and through the section 346a of the planar waveguide 344 to the first mirror 348a, which in turn directs the optical signal 370 perpendicularly to be received by the optical probe head 362b.

In a first example embodiment of a configuration for the optical probe head 362b, as illustrated in FIGS. 3A(ii) and 3B(i), an optical probe head 362b is configured to receive the optical signal 370 from an optoelectrical circuitry that is reflected by the first upturned mirror 348a, and to provide an optical path such that this received optical signal 370 is re-directed to the reflective surface of the second mirror 348b. In this first example embodiment, the optical probe head 362b includes waveguide loop 365, for example, which includes in an embodiment, a lens that is configured to receive the reflected optical signal 370 from the first upturned mirror 348a and to focus the signal into a length of optical fiber cable or other waveguide that routes the optical signal 370 from the optical probe head 362b to the second upturned mirror structure 348b. The second mirror structure 348b receives the optical signal 370 from the optical probe head 362b and directs it into the planar waveguide layer 346b of the receiving portion 308 of the PIC die 302. (Receiving portion 308 is shown in FIG. 3A(i).) The reflected signal 370 can thus be received by the one or more receiving devices 324 in the optical receiving circuit portion 308 of the PIC die 302. Optical signals 370 received by at least one receiving device 324 in the receiving portion 308 of the optoelectrical circuit 308, also shown in FIG. 3A(ii), are converted to electrical signals that are detectable at the contact pads 330 on the electrical interface 312 of the PIC die 302.

In some embodiments, the optical probe head 362b includes an optical circuit configured to receive an optical signal, such as from optical signal 370 from the first upturned mirror 348a, process the optical signal, and send the processed optical signal to the second upturned mirror 348b.

In summary, in this first example embodiment illustrated in FIGS. 3A(ii) and 3B(i), electrical signals 374 from a voltage or current source are received by electrical probe 362a, and are used to activate a sending device 322 to send an optical signal 370 through the sending portion 306 of the PIC die 302, and through planar waveguide 344 and the optical device 340. The optical signal 370 exits the planar waveguide section 346a to the first mirror 348a, propagates through a loop in the optical probe head 362b to the second upturned mirror 348b on the PIC die 302, through the planar waveguide section 346b, optical device 340, and the planar waveguide 344 to the receiving device 324 of the receiving portion 308 of the PIC die 302. The optical signal activates the receiving device 324 to send an electrical signal 374 through the electrical contact pads 330 of the electrical interface 312 to the electrical probe head 362a and to an electrical measurement device to complete the circuit, and the measurement, in this embodiment. Data from the measurement can be used, for example, to initiate a specific type of marking of the die that is indicative of the outcome of the measurement. Alternatively, or additionally, the data from the measurement can be stored in a database for use in a subsequent step of the processing and for statistical evaluation of the devices on the wafer.

In an example embodiment, the optical probe head 362b receives and redirects the optical signal from the first upturned mirror 348a to the second upturned mirror 348b.

In another example embodiment configuration, as illustrated in FIGS. 3A(ii) and 3B(ii), the probe head 362b receives the optical signal 370 upon reflection by a first mirror 348a and this optical signal 370 is converted to an electrical signal in the optical probe head 162b for further processing. In some embodiments, the optical probe head 162b is configured with optoelectrical detectors 316 and optical emitters 317 to receive and emit optical signals in conjunction with the performance of wafer level testing in embodiments, as described for example in Step 193 of FIG. 2A and the description herein.

In the second example embodiment, optical signal 370 is received by the detector 316 in the optical probe head 362b. In embodiments, the detector 316 is a photodiode, for example. In other embodiments, the detector is one or more of another optoelectrical device that converts an optical signal to an electrical signal. In this second example embodiment for the probe head 362b, shown in FIG. 3B(ii) the optical signal 370 received by the probe head 362b is converted to a first electrical signal upon absorption of the signal 370 by the detector 316, and this first electrical signal triggers a second electrical signal that is received by emitter 317. The second electrical signal can be received by the emitter 317 directly from the detector 316, or can be received by an intermediate device that receives the signal which then causes the generation of a second electrical signal received by the emitter 317. The physical location of the detector 316 and the emitter 317 in some embodiments, is in the probe head 362b. In other embodiments, the detector 316 and the emitter 317 are positioned remotely from the probe head 362b and are optically connected to the probe head 362b with one or more of an optical fiber, a waveguide, and a mirror. In some embodiments, for example, of the remotely positioned devices, the detectors 316 and emitters 317 are positioned in a measurement device such as a parametric analyzer 360 and optical signals are routed from the optical probe head 362b to the detectors 316 and emitters 317 in the remotely positioned analyzer 360 or other measurement component connected to the analyzer 360. In some embodiments, the detector 316 is positioned in the optical probe head 362b and the emitter 317 is positioned remotely in the measurement device or parametric analyzer and the output from the emitter 317 is optically connected to the probe head 362b via an optical fiber to route the optical signal 370 from the emitter 317 back to the optical probe head 362b. Alternatively, in some other embodiments, the detector 316 is positioned remotely in the measurement device or parametric analyzer and the input from the probe head 362b is optically connected to the detector via an optical fiber to route the optical signal 370 from the probe head 362b to the remotely positioned detector in, for example, a measurement device or parametric analyzer 360, and the emitter 317, positioned in the optical probe head 362b receives an electrical signal from the detector or measurement device back to the emitter 317 in the probe head 362b.

Figure 3B:
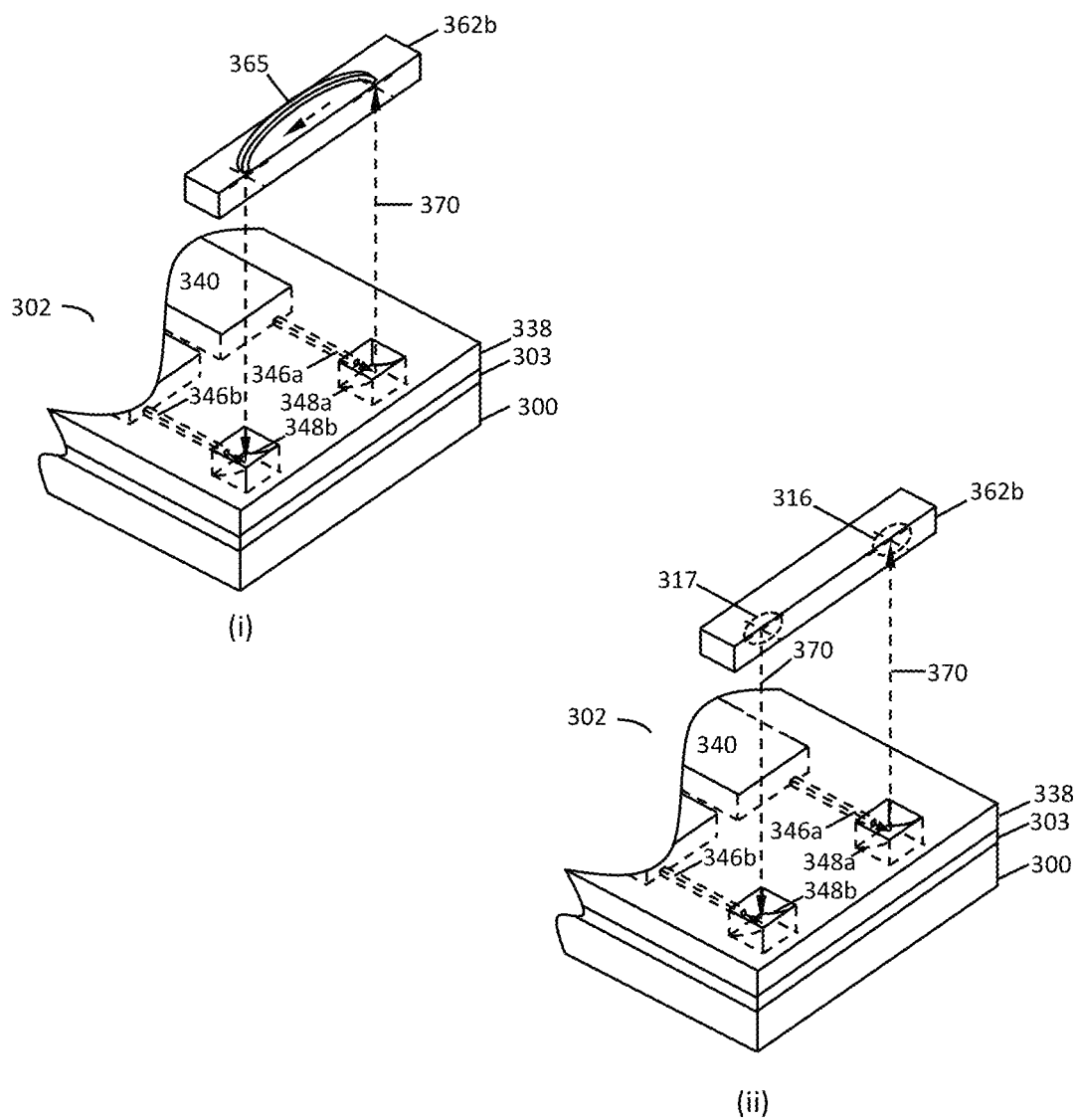
FIG. 3B. Schematic drawings of steps in an embodiment of a process flow for the fabrication and testing of a PIC die 302 with multiple upturned mirrors formed in the interposer substrate.
Figure 3B:
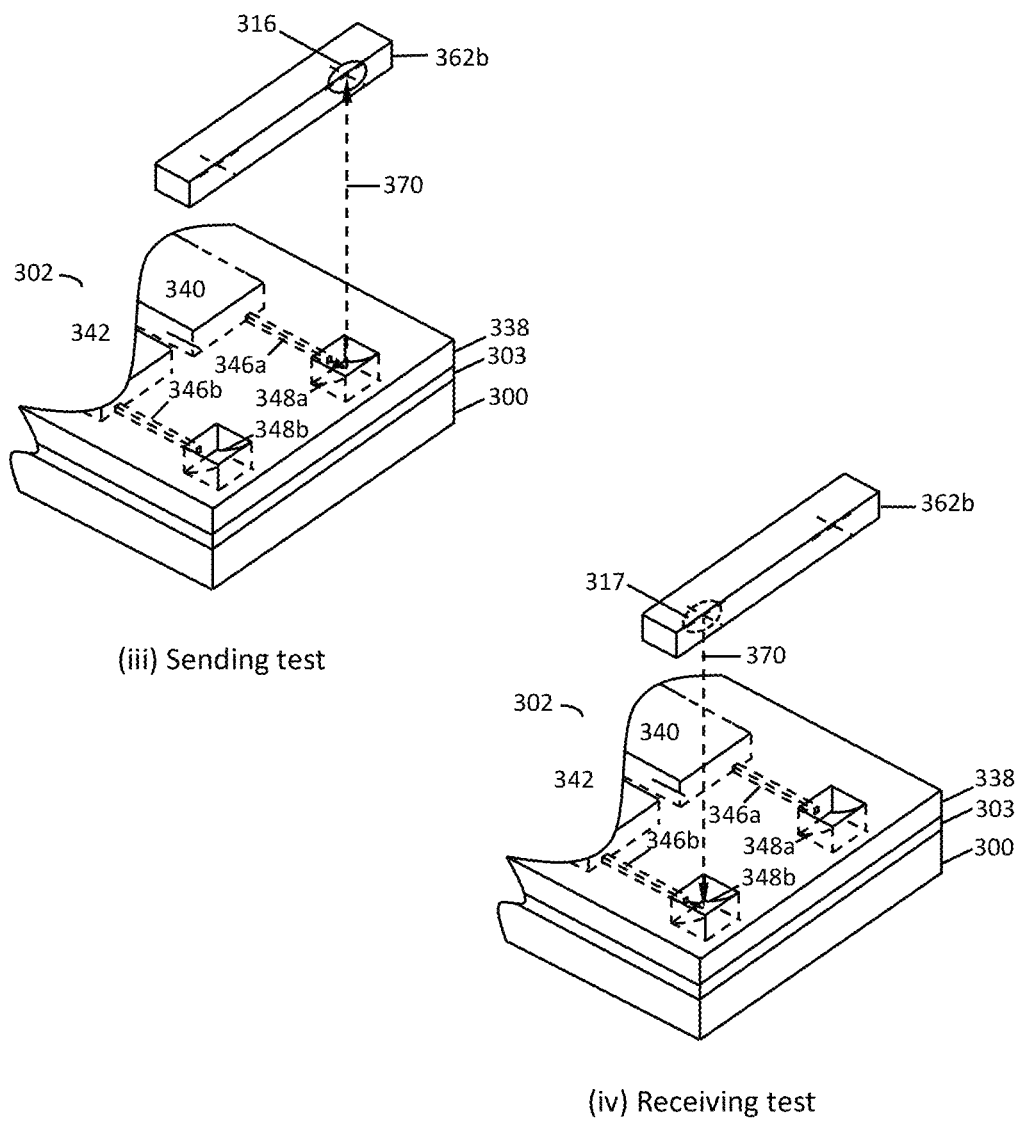

The second example configuration shown in FIG. 3B(ii) for the optical probe head 362b provides an increased level of flexibility in the processing of the optical signals 370 entering the probe head 362b from the first upturned mirror 348a in comparison to the configuration of the optical probe head 362b shown in FIG. 3B(i) in which the optical signal 370 simply passes through the probe head. By receiving the optical signal 370 in the detector 316 and converting this optical signal 370 to an electrical signal, the electrical signals can be adjusted in strength, changed in frequency, modulated, pulsed, or any of a number of other ways in which a signal that differs between a test designed for the sending portion 306 of the PIC die 302 can differ from a test designed for the receiving portion 308 of the PIC die 302. Additionally, independent control of the detectors 316 and emitters 317 in the probe head provide for parallel testing of the sending portions 306 and the receiving portions 308 of the PIC die 302. The advantages of an optical probe head 162b with independently controllable detectors 316 and emitters 317 for flexibility in testing are numerous.

Additionally, in some embodiments, it may be desirable to independently test the sending portion 306 and the receiving portion 308 of the PIC die 302, or to limit the test to either the sending portion 306 or the receiving portion 308. These options are more easily accomplished with the independent control offered by the embodiment of the second example probe head 362b illustrated in FIG. 3B(ii). FIG. 3B(iii), for example, shows an embodiment of a test configuration for the sending portion of PIC die 302 that includes optical device 340 and waveguide 346a in which an optical signal 370 is reflected from the optical waveguide 346a by mirror 348a to detector 316 in the probe head 362b. Similarly, FIG. 3B(iv) shows and embodiment of a test configuration for the receiving portion of PIC die 302 that includes optical device 342 and waveguide 346b in which an optical signal 370 is initiated in the emitter 317 in the probe head 362b and directed to the mirror 348b in the receiving circuitry 308 of the PIC die 302 to test an aspect of the optoelectrical receiving circuitry 308.

Figure 4A:
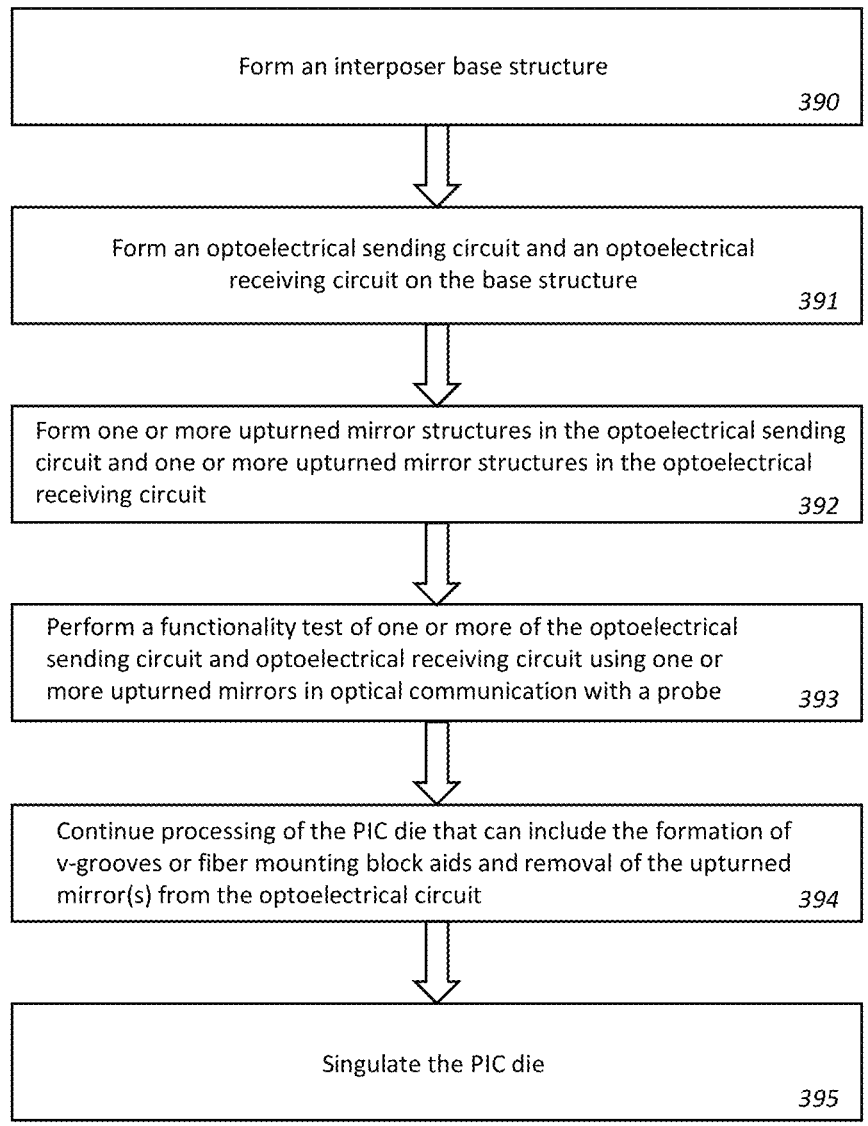
FIG. 4A. Embodiments of optical probe head portions 362b configured (i) to receive the optical signal 370 from a first upturned mirror 348a and to route the signal 370 through a loop 365 to a second upturned mirror 348b on the PIC die 102, and (ii) to receive the optical signal 370 from a first upturned mirror 348a in an optical detector 316 and send an electrical signal to emitter 317 or parametric analyzer 360.

In FIG. 4A, a flowchart is provided to illustrate an embodiment of a method 310 for the formation and testing of a PIC die with one or more upturned mirrors. Method 310 is described in conjunction with the numbering of the elements of the embodiment described in FIGS. 3A and 3B. Step 390 shown in this embodiment is the formation of a base structure 301. The base structure 301, as described herein is a structure that includes an electrical interconnect layer 303 formed on a substrate 300.

In FIG. 4A, Step 391 in method 310 describes the formation of an optoelectrical circuitry on the base structure 301 that includes an optoelectrical sending circuit 306 and an optoelectrical receiving circuit 308. Optoelectrical sending circuit 306, refers to, but is not limited to, a circuit that includes optoelectrical devices 322 and optical devices 340. And optoelectrical receiving circuit 306, refers to, but is not limited to, a circuit that includes optoelectrical devices 324 and optical devices 342. Additionally, the optoelectrical circuitry includes the electrical and optical interconnections required to facilitate the transport of electrical and optical signals. Electrical interconnections, for example, are required to connect optoelectrical devices to electrical contact pads, and in some embodiments to other optoelectrical devices and electrical devices in the circuitry. Similarly, optical interconnections are also provided in the optoelectrical circuitry to facilitate the transmission and propagation of optical signals between optoelectrical devices and optical devices. A planar waveguide layer 305 is formed on the electrical interconnect layer 303 of base structure 301, in embodiments, wherein the planar waveguide layer 305 is used to form the optical interconnections such as patterned waveguides 344, 346.

In Step 392, one or more upturned mirrors 348 are formed on the base structure 301. Upturned mirror structures 348 facilitate optical communication between the patterned planar waveguides 344, 346 and optical probe head 362b. The upturned mirror structures 348 are formed on the base structure 301, in an embodiment, for example, using a process methodology further described herein. At least one upturned mirror structure 348a is used in embodiments, in the optoelectrical sending circuit 306 to facilitate optical communication between the sending circuit 306 and optical probe head 362b and at least one upturned mirror structure 348b is used in embodiments, in the optoelectrical receiving circuit 308 to facilitate communication between the receiving circuit 308 and the optical probe head 362b.

Referring to Step 393, a functionality test of the optoelectrical circuitry is performed. A wafer or other form of substrate upon which the base structure 301 has been formed and a plurality of die 302 have been formed to an extent for which a functionality test is warranted, is placed, manually or in an automated loading process, into a testing apparatus and one or more probe heads and corresponding PIC die features are brought into alignment. Upon alignment of the corresponding PIC die features and probe head features, an electrical portion 362a of a probe head is brought into alignment with the electrical contact pads 330 on at least one PIC die 302. Additionally, an optical portion 362b is aligned with one or more of upturned mirror structures 348a, 348b of the same die 302. In an example embodiment, for which the optoelectrical circuitry is optoelectrical circuit 306 and is configured to test one or more sending devices 322, the parametric analyzer sends an electrical signal 374 to at least one of the optoelectrical sending devices 322 through the electrical probe head 362a, the contact pads 330, and the electrical interconnects 332 in the electrical interconnect layer 303 to the contact terminals on the sending device 322. This electrical signal causes the sending device 322 to form an optical signal 370 that propagates through planar waveguides 344 in the optoelectrical circuitry to the upturned mirror 348a. The upturned mirror 348a reflects the optical signal into the optical probe head 362b as described herein. In embodiments, the optical probe head 362b is a probe head configured to detect and measure one or more properties of the reflected optical signals 370 from the mirror 348a that originate from the optoelectrical circuitry 306 on the PIC die 302. In these embodiments, the optical probe head 362b is equipped with one or more detectors 316 that receive the optical signals 370 reflected by the upturned mirror 348a from the PIC die 302. Measurements of the one or more properties of the optical signals 370 are typically performed by a parametric analyzer 360 or other measurement device electrically connected to the detector 316 in the optical probe head 362b.

Step 393 can include the acquisition and optional storage of one or more of the electrical measurements, a derivation from the electrical measurements, and a calculation that includes one or more of the electrical measurements, or other form of data derived in some manner from the information obtained from one or more of the electrical measurements from the detector into a database or storage medium, in this embodiment.

Other embodiments of Step 393 include the placing steps and aligning steps described in this example embodiment, but may differ with regard to the role of the parametric analyzer as described in other embodiments herein. In other embodiments for example, the optoelectrical circuitry is configured with one or more receiving devices 324. In Step 393 of the embodiment with a plurality of PICs with one or more receiving devices 324, a wafer or other form of substrate upon which the PICs 302 have been formed to an extent for which a functionality test is warranted, is placed, manually or in an automated loading process, into a testing apparatus and one or more probe heads and corresponding PIC die features are brought into alignment. Upon alignment of the corresponding PIC die features and probe head features, an electrical portion 362a of a probe head is brought into alignment with the electrical contact pads 330 on at least one PIC die 302. Additionally, an optical portion 362b is aligned with the upturned mirror structure 348b of the same die 302. In an example embodiment, for which the optoelectrical circuitry is configured with one or more receiving devices 324, the optical probe head 362b is a probe head configured to emit optical signals 370 that are incident upon and reflected by the upturned mirror 348b into the optical circuitry 308 on the PIC die 302. In these embodiments, the optical probe head 362b is equipped with one or more emitters 317 that emit optical signals 370 that are reflected by the upturned mirror 348b into the optical circuitry in the PIC die 302. The optical signals 370 in the optoelectrical circuitry in these embodiments, are received by receiving devices 324 in the optoelectrical circuitry, causing electrical signals to be generated by the one or more receiving devices 324. One or more properties of these electrical signals from optoelectrical receiving devices 324 are then detected, measured, or otherwise received by a parametric analyzer 360 in electrical communication with the receiving devices 324, and information obtained from the test is optionally stored in a database or storage medium, concluding Step 393 in this example embodiment.

In Step 394, one or more of the upturned mirrors 348a, 348b are removed from the optoelectrical circuits 306, 308, respectively. Removal of one or more of the upturned mirrors 348a, 348b is performed in embodiments, to enable the attachment of external fiber optic cables or other waveguides to the PIC die 302 in proximity to the planar waveguide section 346. The optical output from the optoelectrical circuitry, in embodiments with sending devices 322, exits the optoelectrical circuitry through the planar waveguide section 346. And in embodiments, with receiving devices 324, the optical input is provided through planar waveguide section 346. Access to the edge facet of the waveguide section 346, therefore requires removal of the upturned mirror structures from the optoelectrical circuitry. In embodiments, a portion of the planar waveguide section 346 is removed during the formation of the v-grooves to effectively remove the upturned mirrors from the optoelectrical circuits. The formation of the v-grooves in proximity to the planar waveguide section 346 facilitates the removal of the upturned mirrors from the optoelectrical circuits. In some embodiments, physical removal of the upturned mirror structures 348a, 348b is preferred. In these embodiments, the mirror structures 348a, 348b can be placed in a scribe line to facilitate removal from the die 302 while preserving area on the die 302.

In Step 395, upon completion of the formation of the v-groove, and any other required steps, the PIC die 302 are singulated into separate die. Singulation or isolation of the die is accomplished in embodiments with a dicing process, an etch process, a laser dicing process, a combination of an etching and a dicing process, or other method of die separation. In other embodiments, a partial etch, a partial dicing process, a laser dicing process, or a combination of a partial etch and a mechanical process is utilized to isolate the individual PIC die 302. Methods for die singulation or isolation are understood by those skilled in the art.

Figure 4B:
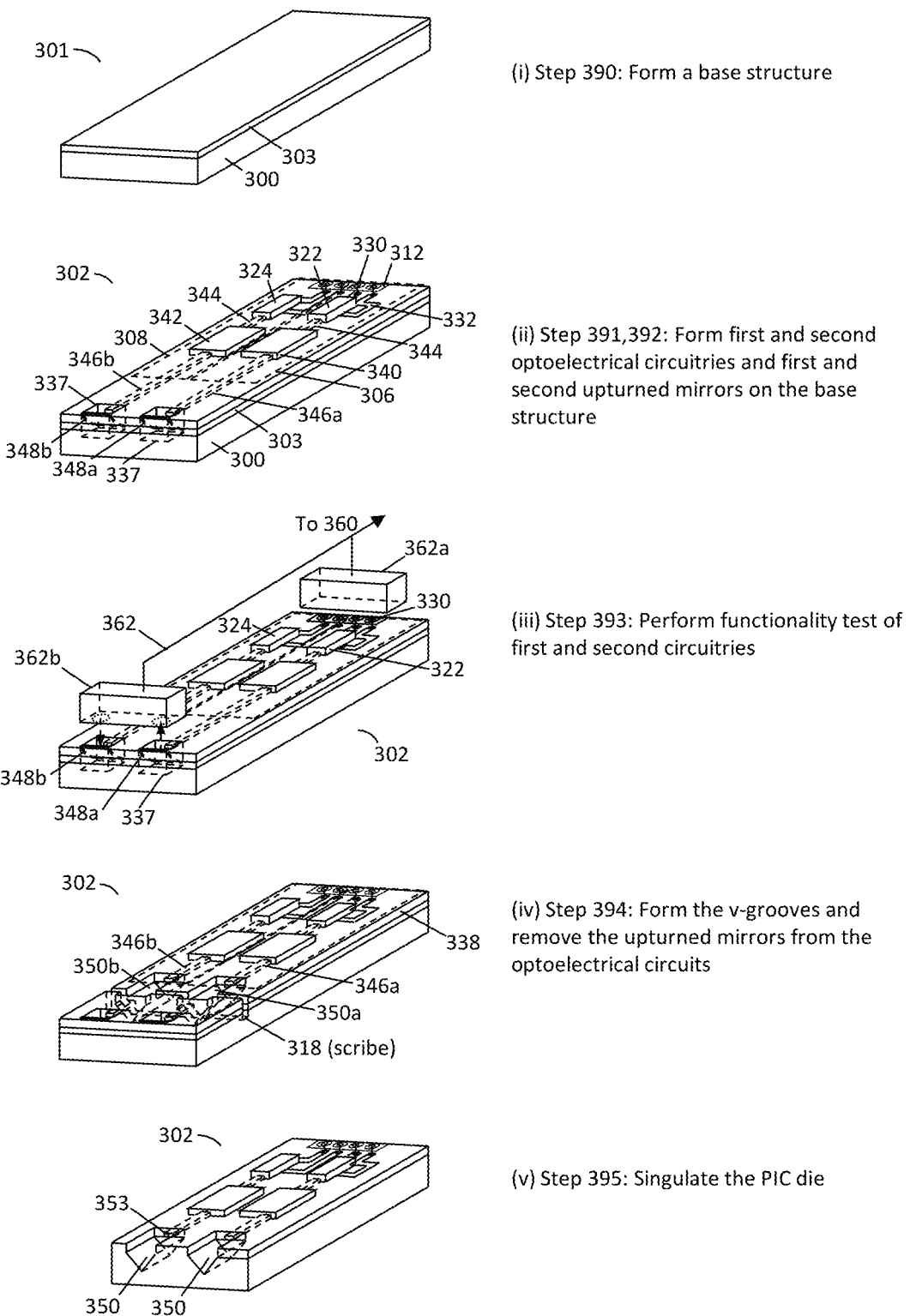
FIG. 4B. Embodiment of an optical probe head portion 362b shown configured for testing of PICs 302 that include both sender devices and receiver devices, (i) for testing of a sending portion of a PIC 302, and (ii) for testing of a receiving portion of a PIC 302.

Referring to FIG. 4B, a sequence of isometric illustrations is shown that further illustrate the process steps in FIG. 4A and that further describe the process flow for the formation and testing of PIC die 302 using one or more upturned mirrors 348a and 348b. In FIG. 4B(i), corresponding to Step 390 of FIG. 4A, an interposer base structure 301 is formed that includes an electrical interconnect layer 303 on a substrate 300. The substrate 300 refers to, but is not limited to, a mechanical support such as a semiconductor, an insulator, or a metal, or a combination of layers of one or more of a semiconductor, insulator, and metal upon which semiconductor structures, such as a photonic integrated circuit (PIC) and embodiments of the invention may be formed. This may include, but not be limited to, InP, GaAs, silicon, silica-on-silicon, silica, silica-on-polymer, glass, a metal, a ceramic, a polymer, or a combination thereof.

Steps 391 and 392 of FIG. 4A, are further illustrated in FIG. 4B(ii) and include the formation of a first and second optoelectrical circuitries 306, 308 and first and second upturned mirrors 348a, 348b on the base structure 301. A planar waveguide layer 305 is formed and patterned to form patterned planar waveguide 344, 346. The first and second optoelectrical circuitries include electrical interface 312 with electrical contact pads 330 that are electrically connected through the metal traces 332 in the electrical interconnect layer 303 to optoelectrical devices 322, 324. Additionally, optoelectrical circuitries 306, 308 include optical devices 340, 342, planar waveguides 344, and planar waveguide sections 346a, 346b. Planar waveguide section 346a, in the embodiment shown in FIG. 4B(ii), is the section of planar waveguide 344 that optically couples the first optoelectrical circuitry 306 that includes sending device 322 of PIC die 302 with the upturned mirror 348a. Planar waveguide section 346b in the embodiment shown, is the section of planar waveguide 344 that optically couples the second optoelectrical circuitry 308 that includes receiving device 324 of PIC die 302 with upturned mirror 348b. Mirror structures 348a, 348b are formed in mirror recesses 337.

Step 393 of FIG. 4A is further illustrated in FIG. 4B(iii) in which probe heads 362 is shown to provide electrical and optical connections between the PIC die 302 and a parametric analyzer 360 or other form of voltage or current source and means for measuring voltage, current, or other electrical parameter. Probe head 360 includes an electrical probe head portion 362a that electrically couples to the contact pads 330 on the PIC die 302 and an optical probe head portion 362b that couples optically to the mirror structures 348a, 348b the PIC die 302. Step 393 includes the alignment of the electrical contacts of the electrical probe head portion 362a with electrical contact pads 330 on the PIC die 302 and the alignment of the optical probe head portion 362b of the probe head 362 with the upturned mirrors 348a, 348b. In an embodiment, the functionality testing, for example, that includes the electrical and optical probe heads 362a, 362b also includes one or more of an application of a voltage from the parametric tester 360 to activate sending device 322 and the application of an optical signal to the upturned mirror 348b that propagates through all or a portion of the optoelectrical circuitry 308 to activate the receiving device 324.

Step 394 of FIG. 4A is further illustrated in FIG. 4B(iv) in which additional processing of the PIC die 302 is performed and includes the formation of v-grooves 350a, 350b in proximity to the planar waveguide section 346a and 346b, respectively. V-grooves are commonly utilized in PICs to support the attachment or mounting of optical fibers to PIC die 302. The formation and use of the v-grooves 350 enables the alignment of the core of a mounted optical fiber cable with the planar waveguide section 346a, 346b. Other methods of mounting optical fiber cables may also be used, such as the use of optical fiber mounting blocks for which an appropriate alternative mounting approach is used in place of, or in combination with the formation of the v-grooves.

After the formation of the v-grooves 350a, 350b, in Step 394 of FIG. 4B(iv), the PIC die 302 is scribed or diced to separate or otherwise remove the mirror structures 348a, 348b from the optoelectrical circuits 306, 308 as shown in Step 395 in FIG. 4B(v). A partial scribe cut in scribe line 318 in an embodiment is shown in the figure. Removal of the mirror structures 348a, 348b is typically performed, in embodiments, in the process of die singulation. Singulation or isolation of the die is accomplished in embodiments with a dicing process, an etch process, a laser dicing process, or a combination of an etching and a dicing process. In other embodiments, a partial etch, a partial dicing process, a laser dicing process, or a combination of a partial etch and a mechanical breaking process is utilized to isolate the individual PIC die 302. Methods for die singulation or isolation are understood by those skilled in the art.

Step 395 of FIG. 4A is further illustrated in FIG. 4B(v) in which an embodiment of a completed form of a PIC die 302 is shown after separation of the mirror structures 348a, 348b from the optoelectrical circuits 306, 308 is shown as would be anticipated after an example die singulation process. Additional example embodiments of the separation and removal of the mirror structures 348a, 348b are further described herein.

Figure 5A:
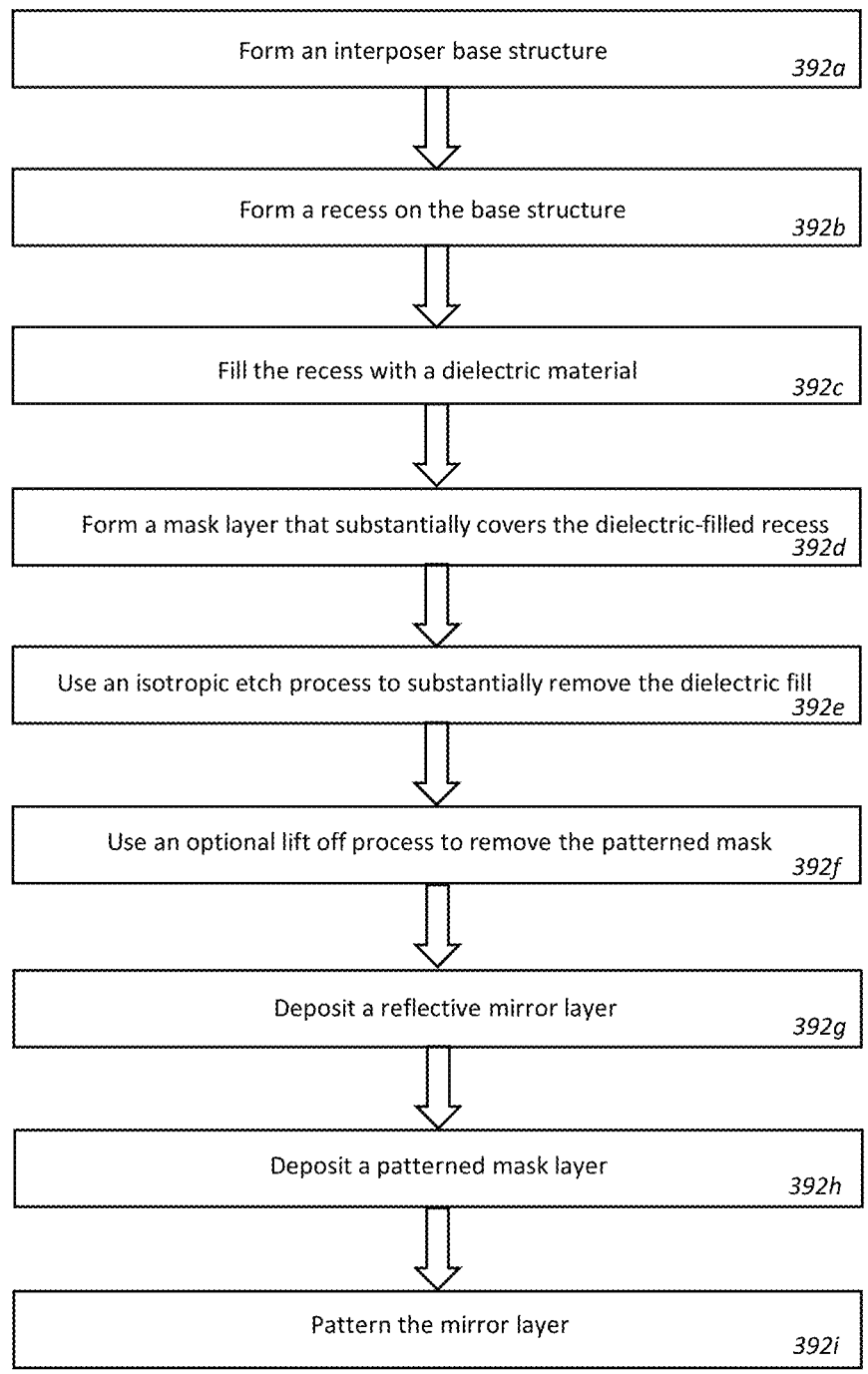
FIG. 5A. Flowchart for a method of forming an embodiment of an upturned mirror.
Figure 5B:
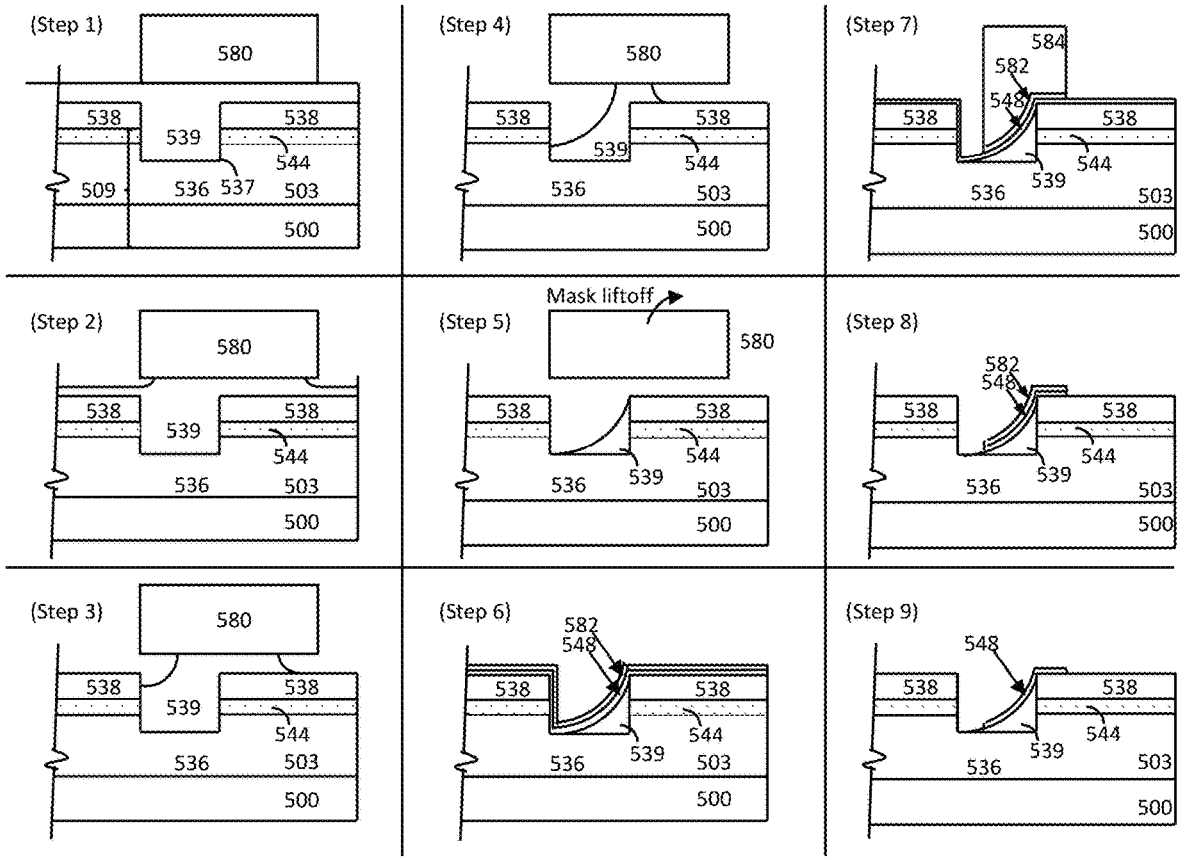
FIG. 5B. An embodiment of a fabrication process to form a mirror structure 548 on an interposer structure 509.

Referring to FIG. 5A, a flowchart for a method of forming an embodiment of an upturned mirror is shown. FIG. 5B shows a sequence of drawings in which the steps of the fabrication process are further illustrated for an embodiment of the PIC die 502 with upturned mirror structure 548. In embodiments, the mirror structure 548 is used in conjunction with an interposer structure 509 that includes the substrate 500, the electrical interconnect layer 503, and the planar waveguide layer 544.

FIG. 5A shows process steps 392a through 392i that describe an embodiment for the formation of an upturned mirror structure in the interposer. In Step 392a, an interposer base structure is formed that includes a substrate and an optional electrical interconnect layer. In Step 392b, a recess is formed in the interposer that will accommodate the upturned mirror. The recess formed in the interposer to accommodate the upturned mirror should intersect the waveguide and be sufficiently deep to enable an upturned mirror formed in the recess to intersect the path of the optical signal propagating in the opened waveguide. In Step 392c, the recess is filled with dielectric material such as silicon dioxide, silicon nitride, silicon oxynitride or another dielectric material. Polymer layers can also be used. The dielectric material should have favorable isotropic etching properties using either or both of a wet etch process and a dry etch process. In Step 392d, a patterned mask layer is formed over a substantial portion of the recess. In Step 392e, an isotropic etch process is used to remove a substantial portion of the dielectric fill material from below the mask layer and the recess. In Step 392f, an optional lift off process is used to remove the mask layer. In some embodiments, the mask layer may be removed during the isotropic eth process. In other embodiments, the mask layer may not be removed during the isotropic etch process but may be removed during a subsequent lift off process. Following the isotropic etch process and removal of the mask layer, and prior to the deposition of a reflective mirror layer, a base layer is formed in the recess upon which the mirror is to be formed. In some embodiments, the reflective layer is formed directly on the dielectric. In other embodiments, an intermediate layer is formed on the base layer prior to the deposition of the reflective layer. In Step 392g, the reflective layer is deposited onto the base layer. In Step 392h, a patterned mask layer is formed. The patterned mask layer can be a photoresist mask layer or a hard mask layer or a combination of a photoresist mask layer and a hard mask layer. The hard mask layer could be a silicon dioxide layer, a silicon nitride layer, a silicon oxynitride layer, an aluminum oxide layer, or another hard mask layer. Preferably, the hard mask layer, if used, should have an etch selectivity relative to the reflective mirror layer such that the integrity of the reflective mirror layer is maintained throughout the duration of the reflective layer patterning step. In Step 392i, the reflective mirror layer is patterned to form the upturned mirror structure. The reflective layer can be patterned using a wet etch chemistry or a dry etch process. For an aluminum-based reflective mirror, for example, an oxide hard mask can be used. A chlorine-based process chemistry having a high selectivity to the aluminum layer relative to the oxide hard mask (etch rate of aluminum is greater than the etch rate of the silicon dioxide) can be used to pattern the mirror layers. Wet chemistries can also be used to etch the aluminum. Steps 392a through 392i are further illustrated in FIG. 5B.

In Step 1 of FIG. 5B, an illustration is provided that shows an initial film structure for forming the mirror structure 548. The film structure in FIG. 5B shows a planar waveguide 544 on intermetal dielectric layer 536 of the electrical interconnect layer 503 on substrate 500. In the embodiment shown, layer 538 is a dielectric layer such as silicon dioxide, silicon nitride, or silicon oxynitride. In other embodiments, other dielectrics can be used. In this initial structure, a recess 537 is shown to extend through the planarized dielectric layer 538, through the planar waveguide 544, and partially through the intermetal dielectric 536 of the interconnect layer that is filled with dielectric material 539. In some embodiments dielectric layer 539 is silicon dioxide. In other embodiments, the dielectric layer 539 is silicon oxynitride. In these and other embodiments, materials are selected that have a high etching preference or etch selectivity for isotropic etching relative to the dielectric layer 538 or to a top layer of a multilayer dielectric layer 538. Mask 580 is a patterned layer. In some embodiments, the mask layer is a patterned photoresist. Other mask materials are used in other embodiments. Planar waveguide structures 544 can be in the range of a few microns to tens of microns in width. Although not drawn to scale, the top down view of FIG. 1A shows an embodiment how the planarized dielectric layer 138 can cover the width of the planar waveguides 144. The planar waveguides 546 are also in the range of a few microns to tens of microns in width. Similarly, in embodiments, the recess 537 within which the mirror is formed is typically wider than the width of the planar waveguide 546 as shown, for example, in FIGS. 1A and 3A.

In the illustration for Step 2 in FIG. 5B, the dielectric layer 539 is shown after a short exposure to a wet isotropic etch process that results in a partial removal of the layer. Illustrations for Steps 3 and 4 show the anticipated structure as the duration of the isotropic wet etch is increased and the layer 539 is removed, until a small amount remains in the recess 537 as shown in Step 5 of FIG. 5B. In Step 5, the curved surface shows the remainder of the layer 539 after etching that provides a base for a reflective mirror layer used in the formation of an upturned mirror structure. In the embodiment shown in Step 5, the mask is removed by liftoff as the undercutting isotropic etch of the layer 539 eliminates any contact between the mask layer 580 and the underlying layer 539. In Step 6, reflective mirror layer 548 is deposited to cover the surface of the curved insulating layer 539. In embodiments, the reflective mirror surface is typically a metal layer and may include a passivation layer. In an embodiment, an aluminum reflective layer is used to form the upturned mirror 548. Hard mask layer 582 is deposited over the reflective mirror layer 548 as shown in Step 6, and in the embodiment shown, is patterned with a photoresist layer 584 as shown in Step 7. In Step 7, the hard mask layer is shown patterned below the photoresist mask layer 584. In embodiments, the patterning of the hard mask layer 582 is accomplished by depositing and patterning a layer of photoresist and then exposing the hard mask layer 582 to a suitable wet chemical or dry etch process to remove the hard mask material in areas not covered by the photoresist mask 584. After patterning of the hard mask, the photoresist is shown removed in Step 7, although in some embodiments, the photoresist layer 584 can remain during the patterning etch of the reflective mirror layer 548. Step 9 of FIG. 5B shows the mirror layer 548 after removal of the hard mask layer 582. The reflective layer in the mirror structure 548 is shown in substantial alignment with the planar waveguide 544 to receive the optical signal from the waveguide (as shown, for example, in the embodiment, in FIG. 1A and FIG. 3A.

Figure 5C:
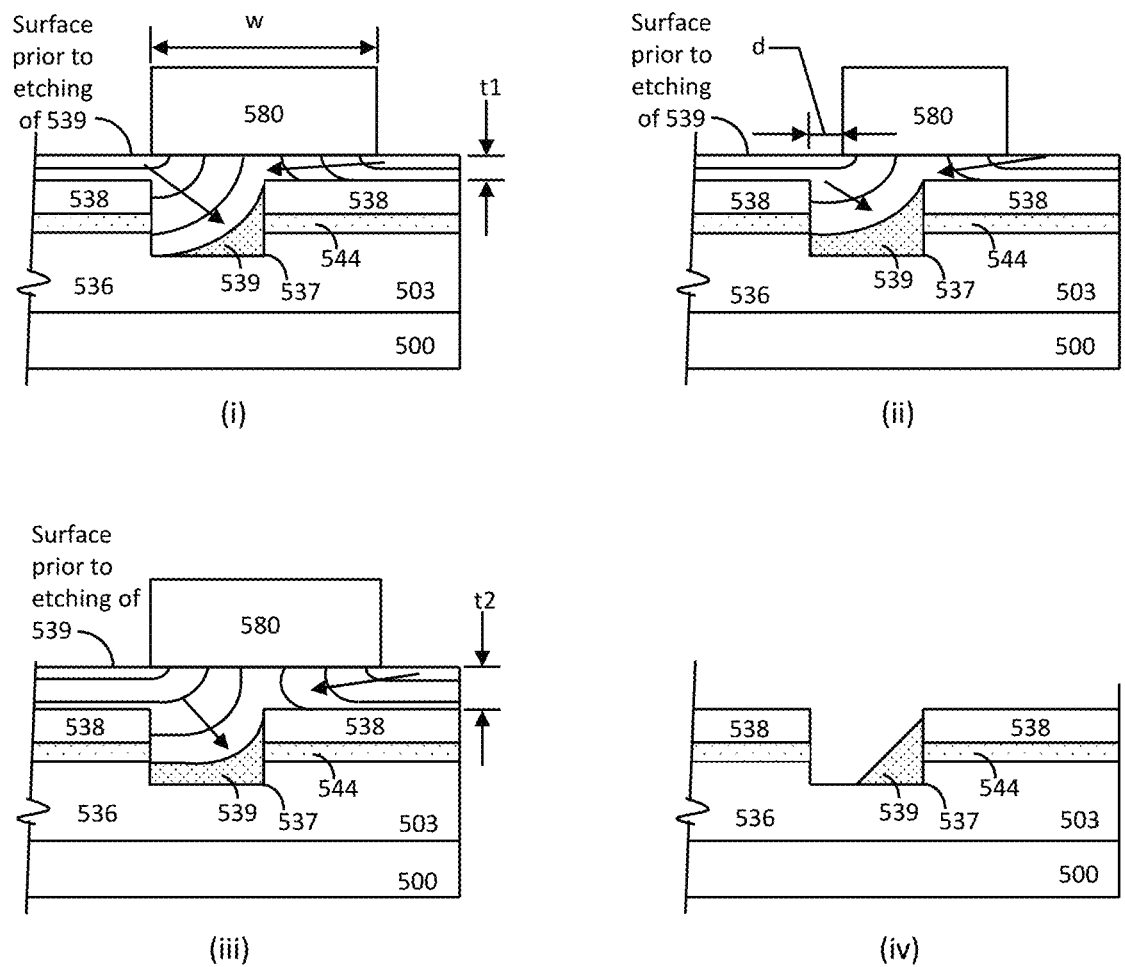
FIG. 5C. Embodiments showing various curvatures anticipated in the mirror underlayer as a result of the wet etching process and variations in the mask width, overlap of the mask 580 to the mirror recess 537, and initial thickness of the mask underlayer 539 (i) intermediate curvature, (ii) flat curvature, (iii) steeper curvature, and (iv) no curvature.

Referring to FIG. 5C, schematic drawings of upturned mirror structures on mirror-containing portions of embodiments of PIC die 502 are shown. PIC die 502 shows planar waveguide layer 544 on electrical interconnect layer 503, and the electrical interconnect layer 503 on substrate 500. Insulating layer 538 is a dielectric material or composite layer of dielectric materials that includes one or more of a passivation layer, a planarization layer, a spacer layer, a buffer layer, and a cladding layer, among others. Recess 537 is formed through the insulating layer 538, and through the planar waveguide layer 544. In some embodiments, the recess 537 extends into the underlying intermetal dielectric layer 536 of the electrical interconnect layer 503 as shown, by example, in FIG. 5C(i). Recess 537 is filled with a dielectric fill material 539a such as silicon oxide or silicon oxynitride, for example. Dielectric material 539 is in some embodiments, a doped dielectric material.

In the embodiment shown in FIG. 5C(i), example contour lines are shown that illustrate the progression of the shape of the dielectric material 539 upon exposure to an isotropic etch process with a high selectivity over the underlying layer 538. The "Surface prior to etching of 539" shows an embodiment of the surface of the layer 539 prior to etching, and each contour line represents a increment in time of exposure of a wet etch process to isotropically and selectively remove the layer 539 until a base for the mirror 548 is formed. An example base for the mirror 548 is shown by the shaded portion of the 539 layer in FIG. 5C(i). A high etch selectivity to the layer 539 implies herein that the etch rate of the layer 539 is substantially higher than that of the underlying layer 538. As the etch front progresses, a cross sectional profile suitable for the base of the upturned mirror 548 is formed in the remainder of the layer 539, as indicated by the shaded area 539. The remaining thickness of layer 539 after exposure to a suitable etch process provides the base of the reflective mirror structure 548 as shown.

The resulting curvature of the mirror base 539 is influenced by a number of factors that include the choice of material 539 used to fill the recess 537, and the etching properties of the material used in fill material 539 as well as the etching properties of the underlying material 538. Additionally, the resulting curvature is influenced by a number of structural dimensions such as the thickness "t1" between the top of underlying insulating layer 538 and the bottom of patterned mask layer 580 as shown in FIG. 5C(i), the width "w" of the mask 580 shown in FIG. 5C(i), and the offset distance "d" between the mask 580 and the recess 537 shown in FIG. 5C(ii). Other factors may also influence the resulting curvature of the insulating layer 539 after exposure to the etch process. In FIG. 5C(ii), for example, etch contour lines are shown that illustrate the anticipated progression of the etch front and the resulting curvature of the remainder of layer 539 with an offset distance "d" between the left edge of the recess 537 as shown in FIG. 5C(ii) and the left edge of the mask 580. The offset distance "d" allows more etchant into the recess resulting in a flatter contour for the mirror.

Similarly, referring to FIG. 5C(iii), etch contour lines are shown that illustrate the anticipated progression of the etch front and the resulting curvature of the remainder of layer 539 with an increased thickness "t2" between the top of underlying insulating layer 538 and the bottom of patterned mask layer 580. In some embodiments, the increased initial thickness of the layer 539 prior to etch results in a more vertical profile with greater curvature after etching in comparison to the thickness "t1" of the layer 539 shown in FIG. 5C(ii).

Embodiments in FIG. 5C illustrate a number of ways in which the resulting profile of the mirror surface can be varied. Variations in the curvature of the mirror will affect the direction of the reflected optical signal that propagates both from the planar waveguide layer 544 to the optical probe head (162b, for example) and from the optical probe head (162b, for example) to the planar waveguide layer 544.

Referring to FIG. 5C(iv), an embodiment is shown for a mirror base that has minimal or no curvature. Methods for forming linear profiles in dielectric layers can include the use of a pull-back technique in which a photoresist or other mask layer (not shown) recedes as a dry plasma etch progresses. Alternatively, use of a passivating chemistry in a dry plasma etch process would result in an etch profile that increases in width relative to the initial mask thickness. An etch process with a high level of selectivity of layer 539 to that of layer 538 is required, in some embodiments, to maintain the thickness of layer 538.

Variations in the resulting shape of the base of the upturned mirror can be provided using a range of dry and wet etching processes and techniques, materials options, and mask layers. The profile shown in FIG. 5C(iv) is anticipated to yield the optimal signal transfer from the mirror between the planar waveguide 544 and the optical probe head (162b, for example). However, use of a curved mirror structure as shown in FIGS. 5C(i)-5C(iii) provides a means for broadening the spot size of the optical signal that can be more easily aligned with the optical probe head (162a, for example).

Figure 6A:
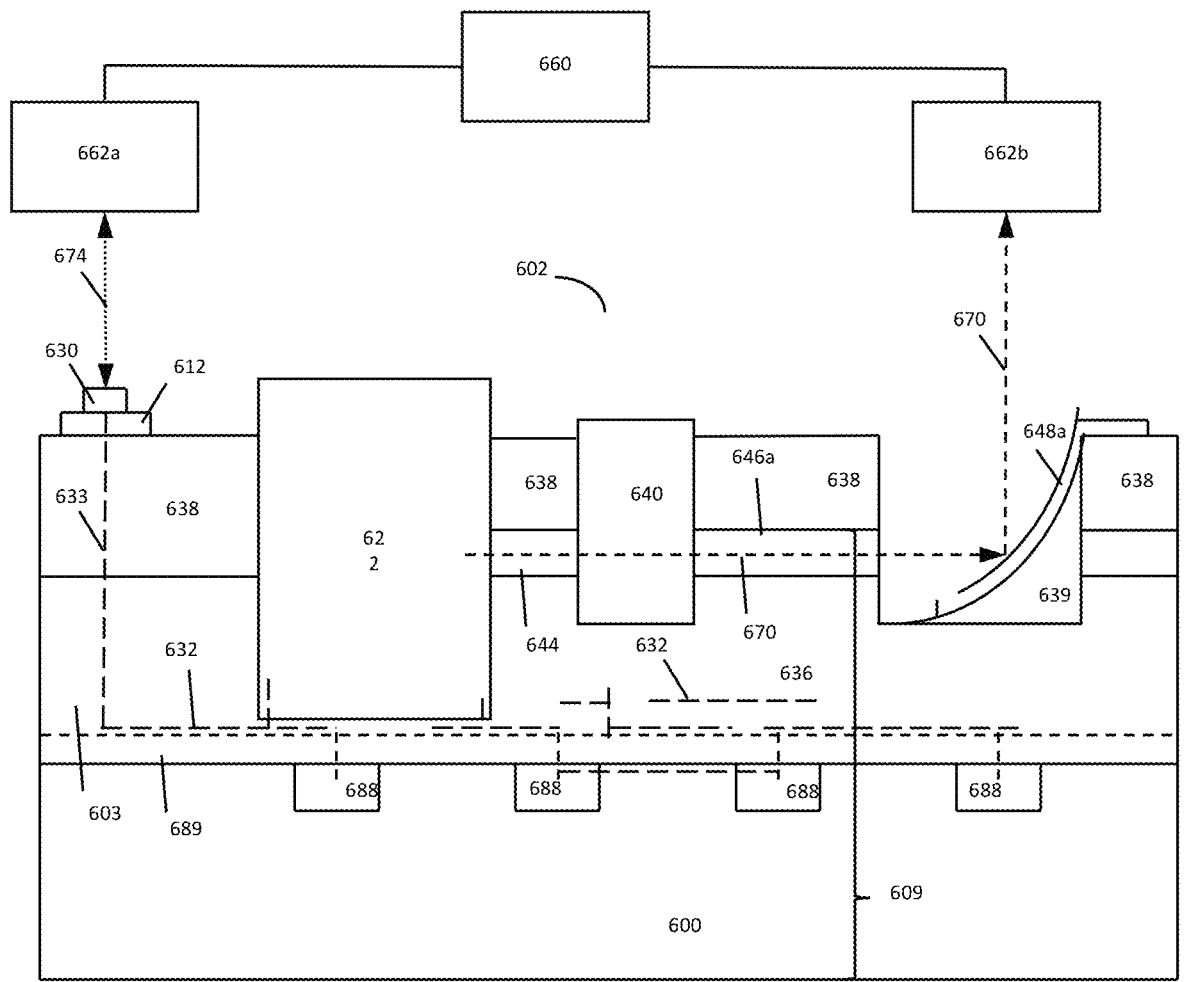

Referring to FIG. 6A, an illustration of an embodiment of the PIC die 602 with mirror structure 648 and other features is shown with additional detail. In the embodiment shown in FIG. 6A, PIC die 602 is configured with a sending device 622.

Planar waveguides 644 and 646a are formed in the planar waveguide layer of the interposer 609 as described herein. The interposer 609 includes the planar waveguide layer from which the planar waveguides 644, 646a are formed, the electrical interconnect layer 603, and the substrate 600. Insulating layer 638 is a thick electrically insulating dielectric layer. Mirror structure 648a is also shown. Electrical probe head 662a is connected to electrical contact pads 630 on electrical interface 612. Electrical interconnections 632 connect electrical contact pads 630 to the optoelectrical sending device 622 through electrical interconnect layer 603. Interconnect layer 603 includes metal interconnects 632 and intermetal dielectric layers 636. In some embodiments, the metal interconnects 632 are formed using one or more damascene processing steps to deposit and pattern the intermetal dielectric layer 636 and to fill and planarize the metal traces. In other embodiments, a metal layer is deposited on a layer of intermetal dielectric material, patterned, and then covered with another layer of intermetal dielectric material. In other embodiments, multiple layers of interconnect traces are formed in the interconnect layer 603 using one or more of damascene or other patterning processes. In these and other embodiments, vertical metal interconnects are formed by patterning through holes in the intermetal dielectric layer to form the vertical portions 633 of the metal interconnects 632. The formation of metallization traces in intermetal dielectric material to form interconnects using semiconductor manufacturing techniques are understood by those skilled in the art of semiconductor fabrication. Also shown in FIG. 6A are electrical devices 688, formed in the substrate 600 and interconnected with interconnect traces 632 in the electrical interconnect layer 603. In some embodiments, electrical devices 688 are CMOS transistors, arrays of CMOS transistors, bipolar transistors, or other electrical devices. In other embodiments, electrical devices are one or more capacitors, inductors, sensors, or other electrical devices. In other embodiments, electrical devices 688 are optoelectrical devices. In yet other embodiments, the electrical devices 688 are sensors.

In the embodiment, the PIC die 602 shows electrical interconnect layer 603 on optional thermally conductive layer 689 on substrate 600. Optional thermally conductive layer 689 in some embodiments, provides thermally conductive pathways to facilitate the removal and dissipation of heat from heat-generating devices in, on, or connected to the PIC die 602, such as lasers, photodiodes, and in some embodiments, the electrical devices 688. Thermally conductive layer 689 is a layer formed in the interposer structure of a material with a high thermal conductivity, such as aluminum nitride, for example. Other thermally conductive alloys of aluminum nitride can be also be used. And other materials with a high thermal conductivity can also be used. In embodiments in which the high thermal conductivity layer 689 is in contact with electrical interconnects 632 in the electrical interconnect layer 603, materials such as aluminum nitride are preferred. In embodiments in which the high thermal conductivity layer 689 is not in contact with the electrical interconnects 632 of the interconnect layer 603, the material in the thermally conductive layer 689 may be electrically conductive, such as a metal layer.

In some embodiments, the high thermal conductivity layer 689 is a single layer. In other embodiments, the high thermal conductivity layer 689 includes multiple layers. The high thermal conductivity layer 689 is shown on the substrate 600 in the embodiment shown in FIG. 6A. In other embodiments, the high thermal conductivity layer 689 is in other elevations or depths in the metal interconnect layer 103.

During a test, in an example embodiment shown in FIG. 6A, the optoelectrical sending device 622, upon activation with an electrical signal 674 from a parametric analyzer 660 or other voltage or current source connected to electrical probe head 662a through the electrical interconnects 632 and contact pads 630, sends an optical signal 670 through the planar waveguides 644, through optical device 640, and through the planar waveguide section 646a. The optical signal 670 emerges from the planar waveguide section 646a, is incident on reflecting mirror 648a, and reflects perpendicularly, or substantially perpendicularly, to be detectable by the optical probe head 662b. In some embodiments, a detector in the optical probe head 662b sends an electrical signal to the parametric analyzer 660.

Figure 6B:
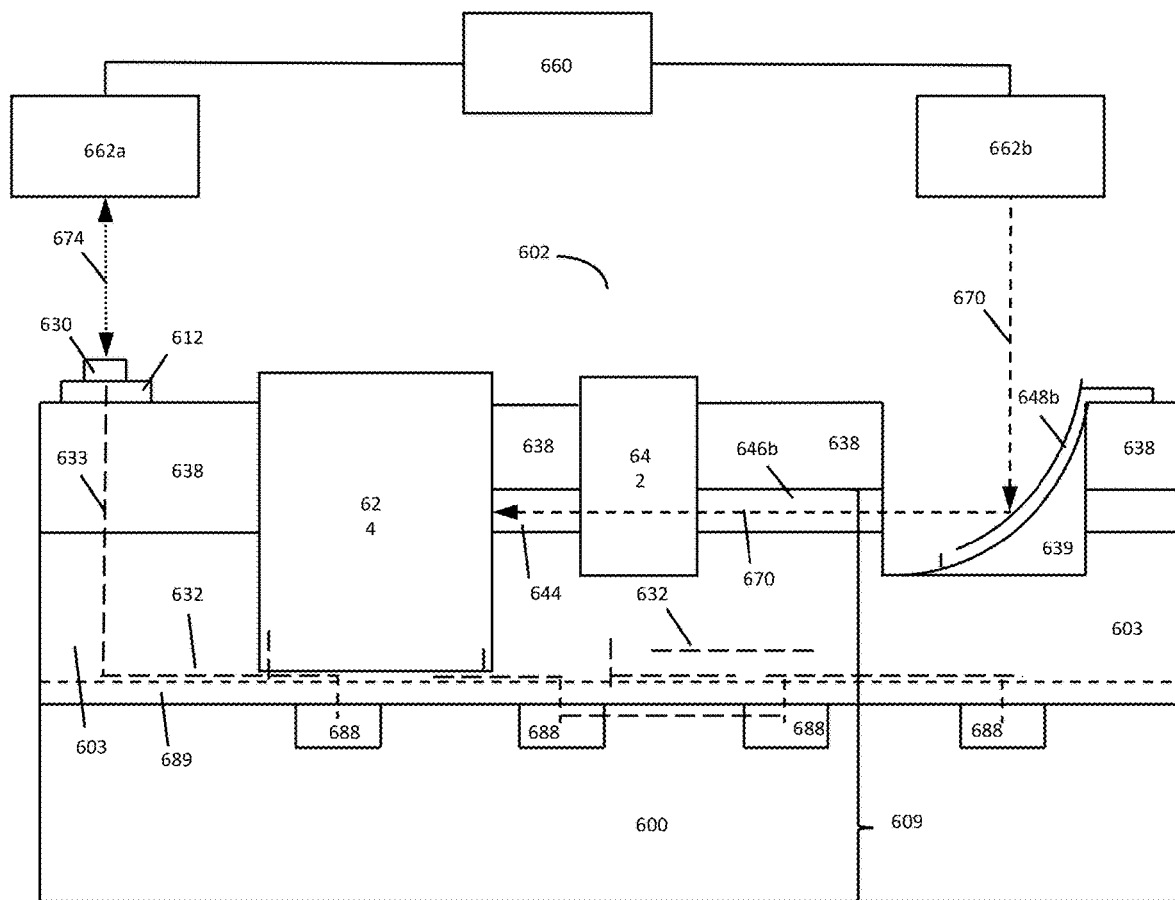
FIG. 6B. Cross sectional schematic of an embodiment of a wafer level testing configuration that includes a parametric analyzer 660, electrical probe head 662a, and optical probe head 662b configured for testing of an interposer-based PIC die 602 with a receiving circuit 608 and an upturned mirror 648b.

Referring to FIG. 6B, an illustration of an embodiment of the PIC die 602 with mirror structure 648b and other features is shown with additional detail. In the embodiment shown in FIG. 6B, PIC die 602 is configured with a receiving device 624. Planar waveguides 644 and 646a are formed in the planar waveguide layer of the interposer as described herein.

The interposer 609 includes the planar waveguide layer from which the planar waveguides 644, 646a are formed, the electrical interconnect layer 603, and the substrate 600. Insulating layer 638 is a thick electrically insulating dielectric layer. Mirror structure 648 is also shown. Electrical probe head 662a is connected to electrical contact pads 630 on electrical interface 612. Electrical interconnections 632 connect electrical contact pads 630 to the optoelectrical receiving device 624 through electrical interconnect layer 603. Interconnect layer 603 includes metal interconnect lines 632 and intermetal dielectric layers 636. In an embodiment, the metal interconnect lines 632 are formed using one or more damascene processing steps to deposit and pattern the intermetal dielectric layer 636 and to fill and planarize the metal traces. In other embodiments, a metal layer is deposited on a layer of intermetal dielectric material, patterned, and then covered with another layer of intermetal dielectric material. In these and other embodiments, vertical metal interconnects are formed by patterning through holes in the intermetal dielectric layer and filled with conductive material to form the vertical portions of the metal interconnects 632. In other embodiments, multiple layers of interconnect traces are formed in the interconnect layer 603 using one or more damascene or other patterning processes. The formation of metallization traces in intermetal dielectric material to form interconnects using semiconductor manufacturing techniques are understood by those skilled in the art of semiconductor fabrication. Also shown in FIG. 6B are electrical devices 688, formed in the PIC die structure and interconnected with interconnect traces 632 in the electrical interconnect layer 603. In some embodiments, electrical devices 688 are CMOS transistors, arrays of CMOS transistors, bipolar transistors, or other electrical devices. In other embodiments, electrical devices are one or more capacitors, inductors, sensors, or other electrical device. In other embodiments, electrical devices 688 are optoelectrical devices. In yet other embodiments, the electrical devices 688 are sensors.

In the embodiment, the PIC die 602 shows electrical interconnect layer 603 on optional thermally conductive layer 689 on substrate 600. Optional thermally conductive layer 689 in some embodiments, provides thermally conductive pathways to facilitate the removal and dissipation of heat from heat-generating devices in, on, or connected to the PIC die 602, such as lasers, photodiodes, and in some embodiments, the electrical devices 688. Thermally conductive layer 689 is a layer formed in the interposer structure of a material with a high thermal conductivity, such as aluminum nitride, for example. Other thermally conductive alloys of aluminum nitride can be also be used. And other materials with a high thermal conductivity can also be used. In embodiments in which the high thermal conductivity layer 689 is in contact with electrical interconnects 632 in the electrical interconnect layer 603, materials such as aluminum nitride are preferred. In embodiments in which the high thermal conductivity layer 689 is not in contact with the electrical interconnects 632 of the interconnect layer 603, the material in the thermally conductive layer 689 may be electrically conductive, such as a metal layer.

In some embodiments, the high thermal conductivity layer 689 is a single layer. In other embodiments, the high thermal conductivity layer 689 includes multiple layers. The high thermal conductivity layer 689 is shown on the substrate 600 in the embodiment shown in FIG. 6B. In other embodiments, the high thermal conductivity layer 689 is in other elevations or depths in the metal interconnect layer 103.

During a test, in an example embodiment for the structure shown in FIG. 6B, optoelectrical receiving device 624, the parametric analyzer 660 sends an optical signal, or an electrical signal to the optical probe head 662b causing an optical signal 670 to be emitted from the optical probe head 662b. Optical signal 670 is incident on the upturned mirror 648b and is reflected into the planar waveguide section 646b. The optical signal propagates through the planar waveguide section 646b, through the optical device 642, and through planar waveguides 644 to the receiving device 624. Upon activation with the optical signal 670, an electrical signal is generated by the receiving device 624, that propagates through the electrical interconnects 632 in the electrical interconnect layer 603 to the contact pads 630, to the electrical probe head 662a, and to the parametric analyzer 660. Optoelectrical sending device 324, upon activation with an optical signal from a n optical signal source connected to the optical probe head 362b, sends an optical signal 670 to the mirror 648b that is reflected perpendicularly, or substantially perpendicularly, from the surface of the mirror 648b and into the planar waveguide section 646, through optical device 640, and into the planar waveguide 644. The optical signal 670 emerges from the planar waveguide 644, is incident on receiving device 624, and activates the receiving device to generate an electrical signal at the electrical contact pads 630 that is detectable by a parametric analyzer or other voltage measurement device connected to the electrical probe head 662a.

Figure 7A:
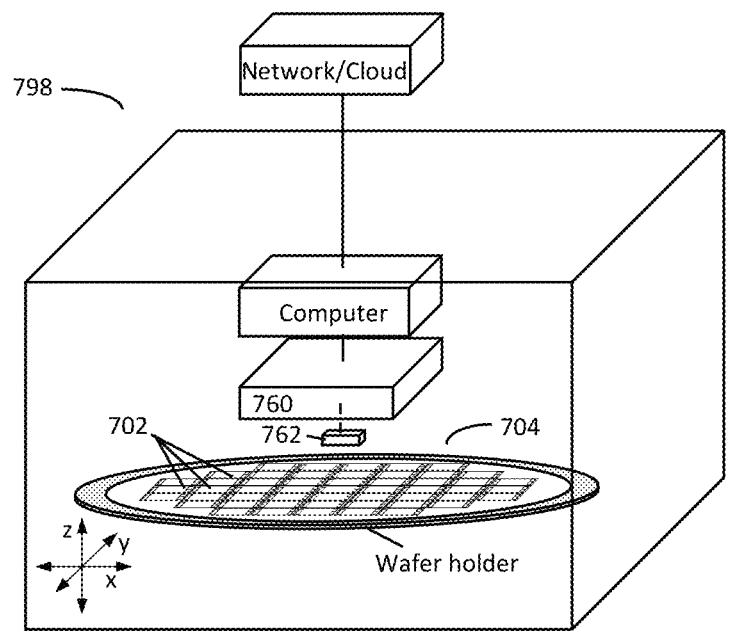
FIG. 7A. Example wafer probing apparatus.

Referring to FIG. 7A, an embodiment of a wafer probing apparatus 798 is shown. FIG. 7A shows plurality 704 of PIC die 702 formed on a wafer positioned below probe head 762. Wafer probe head 762 is electrically connected to a parametric analyzer 760. In some embodiments, the probe head is also connected optically to parametric analyzer 760 with optical fiber cables or other waveguides to transfer optical signals from the probe head 762 to the parametric analyzer, or to other devices connected to the parametric analyzer 760. The parametric analyzer 760 is shown connected to a computer to facilitate automated operation and data storage for the testing apparatus 798. The computer system can be a dedicated computer with self-contained programs for the operation of the testing apparatus 798 and storage of the information and data obtained from the testing of the PIC die. Alternatively, or additionally, the computer system can be a network connected computer system with storage of one or more of the programs, the data, calculations such as statistical calculations or statistical assessments obtained from the data, among other programs, data, and calculated or derived information for and from the testing of the PIC die 702.

Figure 7B:
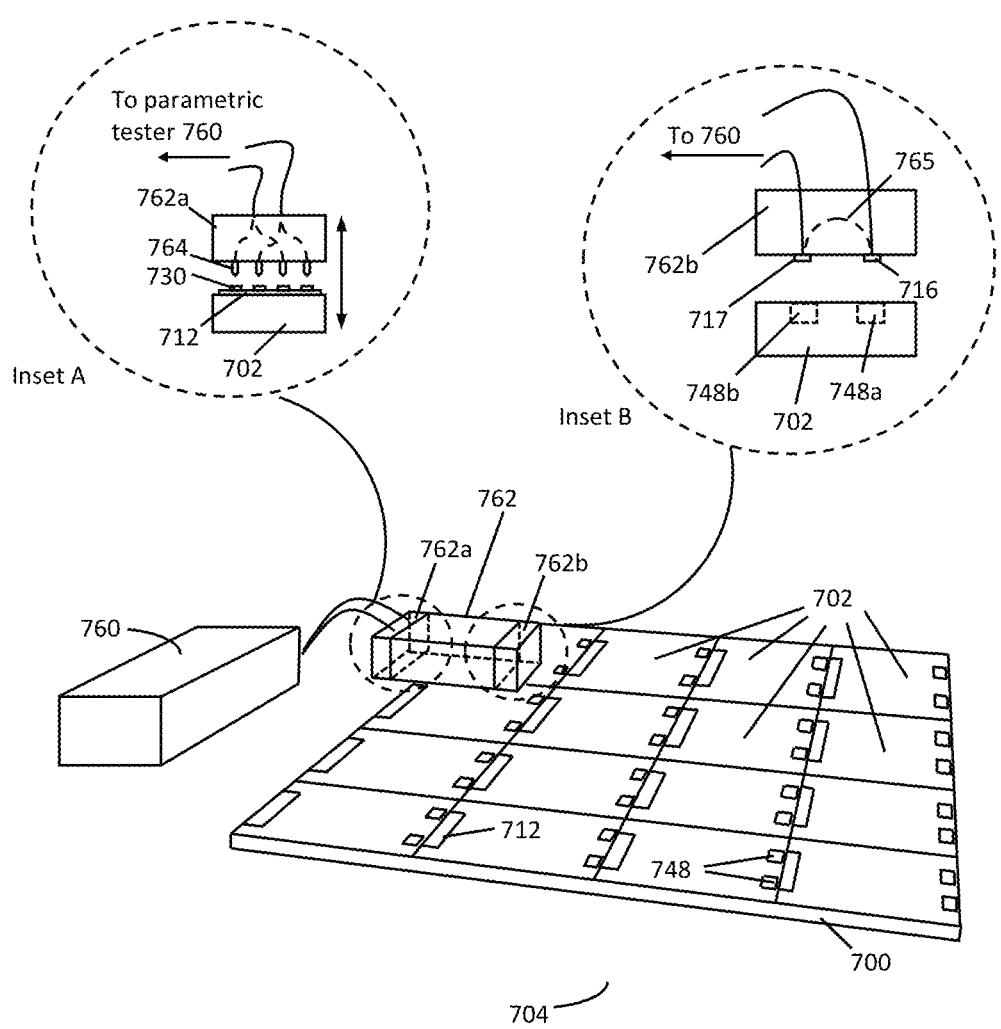
FIG. 7B. Plurality 704 of PICs 702 shown with electrical portion 762a and optical portion 762b of probe head 762 connected to parametric analyzer 760.

FIG. 7B shows an enlarged view of an embodiment of a probe head 762 with parametric analyzer 760 electrically connected to the probe head 762. FIG. 7B also shows a plurality 704 of PIC die 702 is shown positioned below the probe head 762 in FIG. 7B. In FIG. 7B, the plurality of PIC die 704 shown are magnified for clarity, but it should be understood that the plurality of devices shown, in preferred embodiments, a portion of a larger substrate. The plurality of PIC die 704, in embodiments, for example, is a portion of a round semiconductor or insulating substrate. In other embodiments, the plurality of PIC die is a small portion of a much larger square or rectangular substrate. The probe head 762 includes an electrical probe portion 762a and an optical probe portion 762b.

PIC die 702 contain one or more optoelectrical circuits and have an electrical interface 712 with contact pads 730 and reflecting mirrors 748. An enlarged illustration of the electrical probe head portion 762a is shown in the Inset A of FIG. 7B. Inset A shows a cross sectional drawing of a portion of the PIC die 702 with electrical contact pads 730 on electrical interface 712. The portion of the PIC die 702 is positioned below the electrical probe head portion 762a and shows electrical probe contacts 764. During a testing operation, the electrical probe contacts 764 and the electrical contact pads 730 are brought into contact with one another to facilitate the transfer of electrical signals between the probe contacts 764 and the electrical contact pads 730. The electrical probe contacts 764 are electrically connected to the parametric analyzer 760. The electrical contact pads 730 include electrical connections to the optoelectrical devices on the PIC die 702. The electrical probe head 762a includes an interface between the parametric analyzer 760 or other voltage source 760 and voltage measurement device 760. Device 760 provides a voltage to activate sending devices (122 and 322, for example) and a capability to provide a measurement of the output voltage from activated receiving devices (124 and 324, for example). During a testing operation, electrical probe contacts 764 of the electrical probe head portion 762a form an electrical contact with the electrical contact pads 730 on the electrical interface 712 of the PIC die 702 by raising the plurality of die 704 or by lowering the probe head 762a. The probe head 762 or electrical probe head portion 762a is aligned with one or more PIC die 702, in an embodiment, using one or more alignment marks to align the electrical contacts 764 of the probe head portion 762a with the electrical contact pads 730 on the PIC die 702, as shown and described for example, in the embodiment in FIG. 1A. In other embodiments, pattern recognition is used to align the electrical contacts 764 of the probe head 762a with the electrical contact pads 730 on the PIC die 702.

Similarly, an enlarged illustration of the optical probe head portion 762b is shown in the Inset B of the FIG. 7B. Inset B shows a cross sectional drawing of a portion of the PIC die 702 with upturned mirror structures 748a, 748b. The portion of the PIC die 702 that includes the upturned mirror structures 748a, 748b is positioned below the optical probe head portion 762b . . . . The optical probe head portion 762b shows the detector device 716 and emitter device 717 electrically connected to the parametric analyzer 760. Also shown in the optical probe head portion 762b is the optical loop 765 between the location of the detector and the location of the emitter 717. In some embodiments, the optical probe head 762b includes an optical loop 765. In other embodiments, the optical probe head 762b includes the detector 716 and the emitter 717. In other embodiments, both the optical loop 765 and the detector 716 and the emitter 717 are included. In some embodiments, the optical detector 716 and the optical emitter includes one or more detecting devices such as a photodiode or emitting devices 717 such as a laser for detecting optical signals from the PIC die 702. Prior to a testing operation, one or more of the detector 716, the emitter 717, and the ends of the optical loop 765 is brought into alignment below with the upturned mirror structures 748a, 748b to facilitate the transfer of optical signals between the optical probe head portion 762b and the upturned mirrors 748a, 748b, and subsequently to waveguides located on the PIC die 702. In operation for an embodiment, such as an embodiment that includes a sending portion and a receiving portion of the PIC die 702, the detector 716 of the optical probe head 762b is aligned with mirror 748a of the sender portion of the PIC die 702 and the emitter 717 of the optical probe head 762b is aligned with mirror 748b of the receiving portion of the PIC die 702. In these embodiments, the detector 716 and the detector 717 are configurable to enable testing of sending portions and receiving portions independently. Alternatively, in other embodiments, such as the embodiments for the optical probe head 362b shown in FIG. 3B(i), an optical link 365, 765 is provided to receive an optical signal from the mirror 348a, 748a and to re-send this received optical signal to mirror 348b, 748b as described further herein.

In some embodiments, the probe head 762 is a single probe head with an electrical probe portion 762a and an optical probe portion 762b. In other embodiments, the electrical probe portions 762a and the optical probe portions 762b are mechanically separated and move independently of one another. Alignment marks on the PIC die are used in conjunction with the wafer probing apparatus 798 to perform automated alignment of the PIC die 702 with the probe head 762 or with the electrical probe head portion 762a and the optical probe head portion 762b.

The parametric analyzer 760 is shown connected to a computer that, in some embodiments, includes programming for automated operation of the relative positioning of the probe head 762 or portions of the probe head, and features on the PIC die, such as for example, the alignment of a detector 716 or emitter 717 with upturned mirror structures on the PIC die 702.

Referring to FIG. 8 to FIG. 12, methods for the fabrication and wafer level testing utilized in embodiments for the formation of PIC die are illustrated in the form of the test apparatus and flowcharts for a number of example embodiments.

Figure 8A:
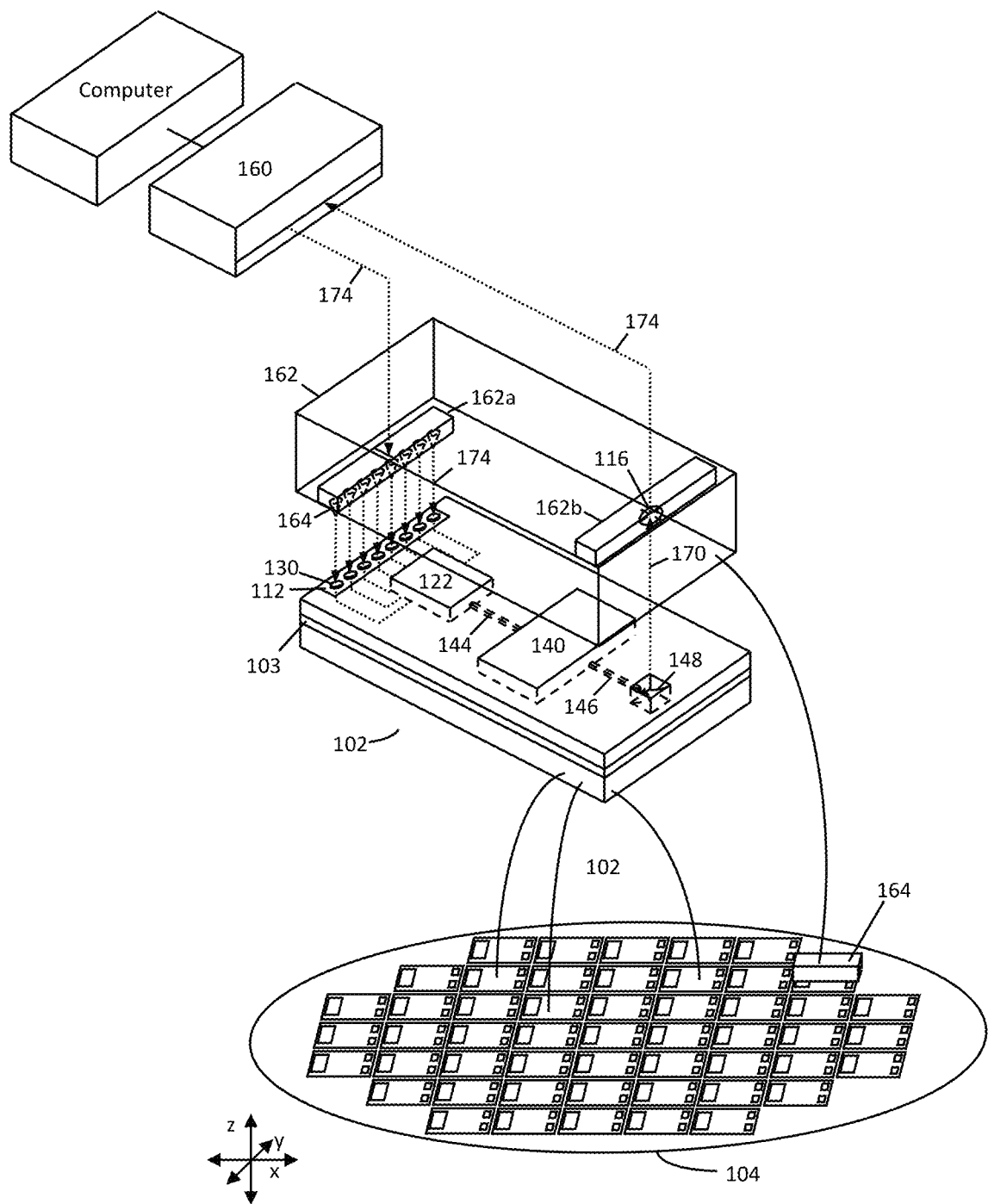
FIG. 8A. Plurality 104 of PICs 102 with one or more sending devices 122 shown with electrical portion 162a and optical portion 162b of probe head 162 connected to parametric analyzer 160.

Referring to FIG. 8A, an embodiment of the wafer level testing method and apparatus is shown for a plurality 104 of PIC die 102. An enlarged view of an embodiment of PIC die 102 with one or more sending devices 122 is shown with probe head 162. PIC die 102 in this embodiment includes a sending device 122, optical device 140, planar waveguides 144, 146, upturned mirror structure 148, and electrical contact pads 130 on electrical interface 112. Also shown in FIG. 8A is probe head 162 that includes an electrical probe head portion 162a with electrical probe contacts 164, and an optical probe head portion 162b that includes an optical detector 116. During a wafer level test in an embodiment, the wafer 104 is loaded into a wafer probing apparatus (see FIG. 7, for example) and the electrical probe contacts 164 on the electrical probe head portion 162a are brought into alignment and contact with the electrical contact pads 130 of the PIC die 102. Additionally, the optical detector 116 on the optical probe head 362b is brought into alignment with the upturned mirror structure 148. Once aligned, an electrical signal from the parametric analyzer 160 or other voltage source 160 is applied to the electrical probe contacts 164 on the electrical probe head 162a, and thusly to the electrical contact pads on the PIC die 102. Electrical signals 174 are transmitted from the electrical contact pads to the sending device 122 through the one or more electrical interconnects in the electrical interconnect layer 103, which activate the sending device 122 to send an optical signal 170 from the sending device 122 through the planar waveguides 144, optical device 140, and the waveguide 146 to the upturned mirror structure 148. The optical signal 174 is reflected in the reflective upturned mirror structure 148 to the detector 116 in the optical probe head 162b. In the embodiment shown, the optical probe head is equipped with a detector 116 that receives the reflected optical signal 170 and forms an electrical signal that is transmitted to the parametric analyzer 160 or other measurement device 160. The configuration shown in FIG. 8A includes a computer connected to the parametric analyzer 160 for the storage, manipulation, interpretation, compilation, or transfer of data, for example, that are obtained from the wafer level testing operations that are performed on the PIC die 102. The computer connected to the parametric analyzer may be configured to store, interpret, compile, transfer, or otherwise receive and manipulate the data, locally or attached to a network or to the internet for storage, interpretation, compilation, transfer, or manipulation elsewhere.

In the flowchart shown in FIG. 8B, the method for the fabrication and wafer level testing in embodiments that include at least one sending device 122 in optoelectrical circuitry is shown, such as described in FIG. 1A and FIG. 8A. In Step 890 of FIG. 8B, a base structure 101 is formed that includes an optional electrical interconnect layer 103 on a substrate 100.

In Step 891a, an optoelectrical device or circuitry is formed, in an embodiment, on the optional electrical interconnect layer 103 on the base structure 101 that includes at least one optical sending device 122, one or more optical devices 140, electrical contact pads 130 on electrical interface 112, electrical connections 132 between the electrical contact pads 130 and the sending device 122, and planar waveguides 144,146. In Step 891a, the optoelectrical circuitry with sending device 122 is configured to send an optical signal 170. In another embodiment, the optical waveguides and other optical devices are formed on the substrate 100 and the electrical connections 132 between the electrical contact pads 130 and the sending device 122 of the optoelectrical circuitry are formed above the waveguide layer 105.

In Step 892, an upturned mirror structure 148 is formed on the base structure 101 of the PIC die 102 that can receive the optical signal 170 from the sending device 122 through planar waveguides 144, 146, and through the one or more optical devices 140. The upturned mirror structure 148, in this embodiment, is configured to receive the optical signal, formed in the sending device 122, from the planar waveguide section 146.

In Step 893, a functionality test is performed of the optoelectrical circuitry during a wafer level testing procedure. Probe head 162 is provided in Step 893 that includes an electrical probe head portion 162a and an optical probe head portion 162b. The electrical probe head 162a and the optical probe head 162b, in some embodiments, are combined into a single probe head 162. In other embodiments, the electrical probe head 162a and the optical probe head 162b are separate probe heads. In addition to providing the probe heads 162a, 162b, a parametric analyzer 160 is also provided in Step 893. Parametric analyzer 160 is commonly used equipment in electrical device testing, and in particular in functionality testing of integrated circuits and photonic integrated circuits. A parametric analyzer 160 is a device, typically programmable, that contains one or more voltage or current sources (outputs), and the capability to measure one or more voltages or currents (inputs).

In a wafer level test of Step 893, the optoelectrical circuitry in this embodiment is configured to send one or more optical signals 170 from the one or more optical sending devices 122 through the optoelectrical circuitry, and through optical device 142 to an upturned mirror 144 as shown in FIG. 8A. In Step 893 shown in FIG. 8B, a functionality test is performed of the optoelectrical circuitry formed on the PIC die 102 using the parametric analyzer 160 connected to one or more of the electrical contact pads 130 and to the optical probe head 162b. In an embodiment, the parametric analyzer 160 provides a voltage to the electrical probe head 162a, in contact with the one or more electrical contact pads 130 on the electrical interface 112 of the PIC die 102. The voltage applied to the electrical contact pads 130 from the electrical probe head 162a reaches the sending device 122 through the electrical interconnects 132 in the electrical interconnect layer 103 on the substrate 100, activating the sending device 122. In an embodiment, the sending device is a laser, and when activated, the laser device sends an optical signal at a specific wavelength at which the laser is designed to emit. The emitted optical signal 170 from the sending device 122 is sent through the planar waveguides 144 to the optical device 140, and again through a waveguide section 146 to the upturned mirror structure 148. In an embodiment, one laser is formed on the PIC die 102. In this and other embodiments, the optical device 142 is a waveguide. In other embodiments, more than one laser is formed on the PIC die 102. In some embodiments in which multiple lasers 122 or other sending devices 122 are formed on the PIC die 102, the optical device 142 is a multiplexer device that is used to combine the optical signals from two or more sending devices 122. Upon reaching the upturned mirror structure 148, the optical signal is reflected perpendicularly (from the plane of propagation in the planar waveguide layer 105) by the reflective layer in the upturned mirror structure 148. The optical probe head 162b is positioned in proximity to the upturned mirror structure to receive the reflected optical signal 170. In an embodiment, the optical probe head 162b is configured with an optoelectrical detector 116 that is further configured to send electrical signals to the parametric analyzer 160 when the detector is activated by an incident optical signal such as the optical signal from the sending device 122. The optical signal that is reflected from the upturned mirror structure 148 provides information about the functionality of the optoelectrical circuitry on the PIC die 102. In an embodiment, for example, the functionality test is used to assess the presence of an optical emission from the one or more sending devices 122. In this embodiment, the optical signal from the sending device 122 will generate a voltage at the detector 116 in the optical probe head 162b that is measurable at the parametric tester. A voltage measured by the detector 216, indicates output from the sending device 122. In another example embodiment, the functionality test is used to assess the strength of the optical signal from one or more of the sending devices 122. In this embodiment, the magnitude of the voltage measured by the parametric tester 160 from the detector 116 in the optical probe head 162b is proportional to the strength of the optical signal from the sending device 122. In other similar embodiments, the strength of the voltage measured at the detector 116 in the optical probe head 162b is proportional to the optical output from the sending device less any losses or attenuation of the optical signal as it propagates through the optoelectrical circuitry on the PIC die 102. In yet another embodiment, the wavelength of the emission from the sending device is measured with a suitable detector in the optical probe head 162b for measuring optical wavelengths, such as a spectrometer, a CCD array, or a wavelength bandwidth filter in series with a photodetector, or a number of wavelength bandwidth filters, each with a differing bandwidth to allow only specific wavelengths of light to pass to a photodiode, for example. Any of a large number of functionality tests is conceivable with the appropriate detectors.

In Step 894 of FIG. 8B, upon completion of the functionality test performed in Step 893, fabrication of the PIC die 102 is resumed, and can include, for example, the removal of the upturned mirror structure 148 and the formation of v-grooves or other means to support the attachment of optical fiber cables to the PIC die 102.

In Step 895 of FIG. 8B, the plurality of PIC die is singulated into individual die 102. Having been subjected to wafer level testing during the fabrication process, PIC die that failed to meet specific functionality test criteria can optionally be excluded from some further processing steps. In an embodiment, for example, a PIC die that was found to have a faulty laser, is marked and eliminated from further processing such as packaging after singulation. Information about other defects in PIC die 102 that are identified during the functionality testing can be used to compile statistical information about the production processes and to mark, repair, adjust, tune, eliminate, or any of a number of other remedies or other options for treatments of defective or underperforming die.

Figure 9A:
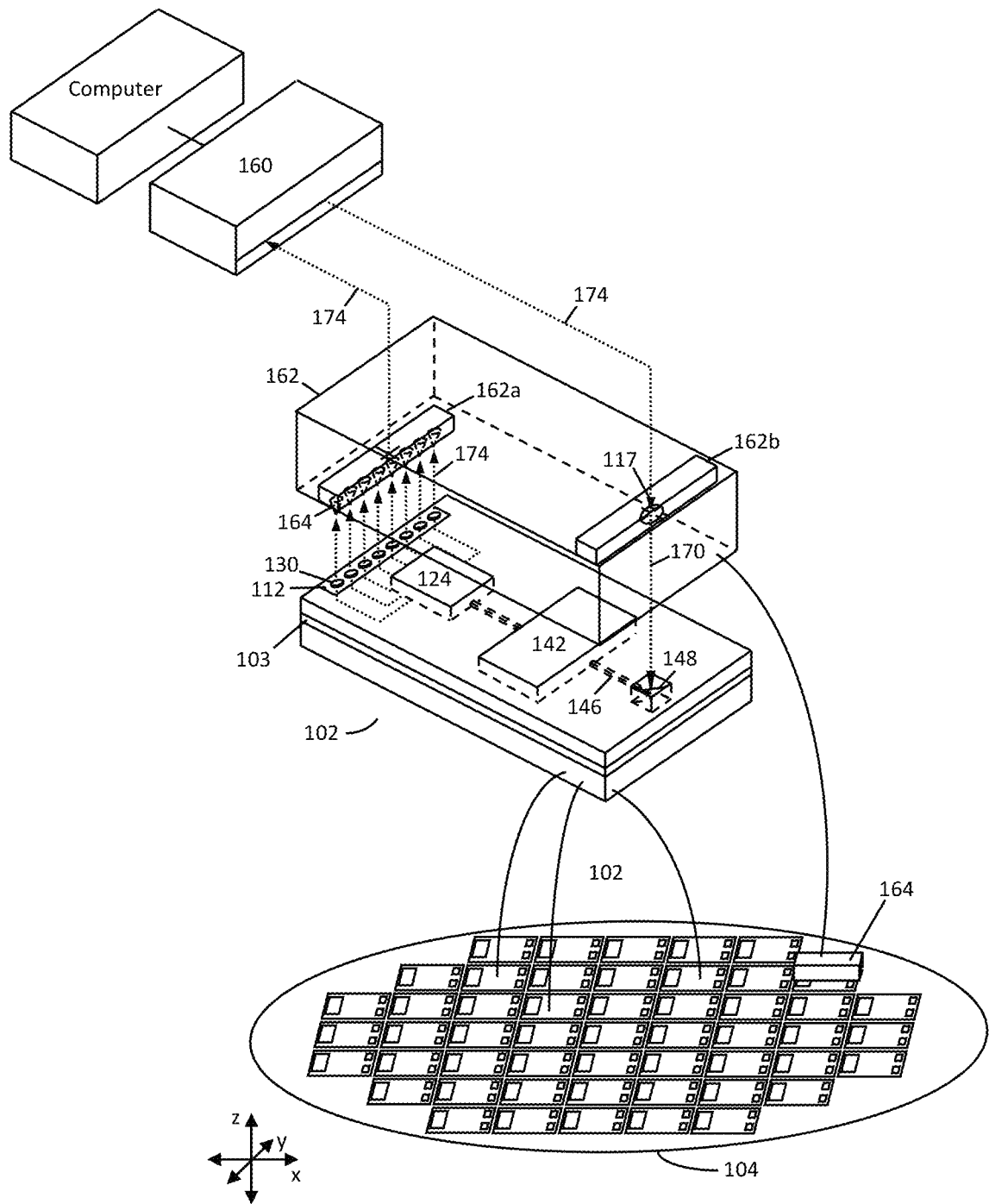
FIG. 9A. Plurality 104 of PICs 102 with one or more receiving devices 124 shown with electrical portion 162a and optical portion 162b of probe head 162 connected to parametric analyzer 160.

Referring to FIG. 9A, an embodiment of the wafer level testing method and apparatus is shown for a plurality 104 of PIC die 102. An enlarged view of an embodiment of PIC die 102 with one or more receiving devices 124 is shown with probe head 162. PIC die 102 in this embodiment includes a receiving device 124, optical device 142, planar waveguides 144, 146, upturned mirror structure 148, and electrical contact pads 130 on electrical interface 112. Also shown in FIG. 9A is probe head 162 that includes an electrical probe head portion 162*a* with electrical probe contacts 164, and an optical probe head portion 162*b* that includes an optical emitter 117. During a wafer level test in an embodiment, the wafer 104 is loaded into a wafer probing apparatus (see FIG. 7, for example) and the electrical probe contacts 164 on the electrical probe head portion 162*a* are brought into alignment and contact with the electrical contact pads 130 of the PIC die 102. Additionally, the optical emitter 117 on the optical probe head 362*b* is brought into alignment with the upturned mirror structure 148. Once aligned, an electrical signal 174 from the parametric analyzer 160 or other voltage source 160 is applied to emitter 117 on the optical probe head 162*b* to emit an optical signal 170 that is incident on the reflective upturned mirror 148 on the PIC die 102. The optical signal 170 is reflected by the mirror structure 148 into the planar waveguide section 146, and which propagates through the planar waveguide section 146, the optical device 142, and the planar waveguides 144 to the one or more receiving devices 124. The receiving device 124, upon receiving the optical signal 170, generates a voltage that is transmitted through the electrical interconnects in the electrical interconnect layer 103 to the electrical contact pads 130 and to the electrical probe contacts 164 on the electrical probe head portion 164. The electrical probe contacts 164 provide the electrical signal 174 to the parametric analyzer 160.

The configuration shown in FIG. 9A includes a computer connected to the parametric analyzer 160 for the storage, manipulation, interpretation, compilation, or transfer of data, for example, that are obtained from the wafer level testing operations that are performed on the PIC die 102. The computer connected to the parametric analyzer may be configured to store, interpret, compile, transfer, or otherwise receive and manipulate the data, locally or attached to a network or to the internet for storage, interpretation, compilation, transfer, or manipulation elsewhere.

In the flowchart shown in FIG. 9B, the method for the fabrication and wafer level testing in embodiments that include at least one receiving device 124 in optoelectrical circuitry is shown, such as described in FIG. 1A and FIG. 9A. In Step 990 of FIG. 9B, a base structure 101 is formed that includes an optional electrical interconnect layer 103 on substrate 100.

In Step 991*b*, in embodiments, an optoelectrical device or circuitry is formed on the optional electrical interconnect layer 130 of the base structure 101 that includes at least one optical receiving device 124, optical device 140, electrical contact pads 130 on electrical interface 112, electrical connections 132 between the electrical contact pads 130, the receiving device 124, and planar waveguides 144,146. In Step 991*b*, the receiving device 124 is configured to receive an optical signal 170. In another embodiment, the optical waveguides 144, 146 and other optical devices are formed on the substrate 100 and the electrical connections 132 between the electrical contact pads 130 and the receiving device 122 of the optoelectrical circuitry are formed above the waveguide layer 105.

In Step 992, an upturned mirror structure 148 is formed on the PIC die 102 that is configured to receive an optical signal 170 from an optical probe head 162*b* and reflect this optical signal 170 into planar waveguide section 146. The optoelectrical circuitry is configured to receive one or more reflected optical signals 170, wholly or in part in the one or more optical receiving devices 124 from an optical signal reflected into the planar waveguide 144 by the upturned mirror 144 as shown in FIG. 9A.

In Step 993, a functionality test is performed of the optoelectrical circuitry during a wafer level testing procedure. A probe head is provided that includes an electrical probe head 162*a* and an optical probe head 162*b*. The electrical probe head 162*a* and the optical probe head 162*b*, in some embodiments, are combined into a single probe head 162. In other embodiments, the electrical probe head 162*a* and the optical probe head 162*b* are separate probe heads. In addition to providing the probe heads 162*a*, 162*b*, a parametric analyzer 160 is also provided in Step 993. Parametric analyzer 160 is commonly used equipment in electrical device testing, and in particular in functionality testing of integrated circuits and photonic integrated circuits. A parametric analyzer 160 is a device, typically programmable, that contains one or more voltage or current sources (outputs), and the capability to measure one or more voltages or currents (inputs).

In Step 993 shown in FIG. 9B, a functionality test is performed of the optoelectrical circuitry formed on the PIC die 102 using the parametric analyzer 160 connected to the optical probe head 162*b* and to one or more of the electrical contact pads 130. In an embodiment, the parametric analyzer 160 provides a signal, optical or electrical, to an emitter 117 in the optical probe head 162*b*. The optical probe head 162*b* is aligned with the upturned mirror 148 such that the optical signal, initiated by the parametric analyzer 160, is emitted by the emitter 117 in the optical probe head 162*b* and this emitted signal is incident, or substantially incident on the upturned mirror 148 on the PIC die 102. The upturned mirror 148, in this embodiment, is configured to receive the optical signal from the optical probe head 162*b*, and to reflect the optical signal into the planar waveguide section 146 adjacent to the mirror 148 as shown in FIG. 9A. In an embodiment, the optical signal is a single wavelength signal from the optical probe head 162*b*. In other embodiments, the optical signal includes two or more wavelengths. In some embodiments in which the optical signal includes multiple wavelengths of light, the optical signal is generated by multiple optical signal generating devices in the emitter 117 of the optical probe head 162*a*, or from multiple optical signal generating devices in, connected to, or operating in conjunction with, the parametric analyzer 160. The incident optical signal on the upturned mirror structure 148 is reflected into the planar waveguide section 146 of planar waveguide 144, and propagates in the planar waveguide section 146 to the optical device 142, and through planar waveguides 144 to the receiving device 124. Other waveguides and devices may also be included in the optoelectrical circuitry in other embodiments. In an embodiment, the optical signal 170 received by the upturned mirror 148 from the optical probe head 162b and reflected into the planar waveguide section 146 is a single wavelength optical signal. In other embodiments, the optical signal received by the upturned mirror 148 from the optical probe head 162b and that is reflected into the planar waveguide section 146 includes multiple wavelengths. In some embodiments, the optical signal reflected by the upturned mirror structure 148 and received by the optical device 142 is an optical signal composed from a single wavelength. In other embodiments, the optical signal reflected by the upturned mirror structure 148 and received by the optical device 142 is an optical signal composed of multiple wavelengths of light. In some embodiments for which the optical signal includes multiple wavelengths of light, the optical device 142 is a demultiplexing device such as an arrayed waveguide or an echelle grating. In these embodiments, the optical signal 170 may be split into multiple wavelengths in the demultiplexing device 142 and separated into multiple planar waveguides 144, and received by one or more receiving devices 124. The one or more receiving devices 124 are electrically connected, through the electrical connections 132 in the electrical interconnect layer 103, to the one or more electrical contact pads 130 on the electrical interface 112. When activated by the optical signal, the receiving device 124 generates a voltage that is transmitted to the electrical contact pads 130 through the electrical connections 132. The electrical signal, typically a voltage, is detectable at the electrical probe head 162a in contact with the electrical contact pads 130, and at the parametric analyzer connected to the electrical probe head 162a. In an embodiment, the receiving device 124 is a photodetector, and when activated by the optical signal that originated at the optical probe head 162b, the photodetector generates the voltage that is detected at the parametric analyzer 160.

In embodiments, the electrical probe head 162b, is configured to send electrical signals to the parametric analyzer 160 when the receiving device is activated by an incident optical signal such as the optical signal 170 from the optical probe head 162b. The optical signal that is reflected from the upturned mirror structure 148, and received by the one or more receiving device 124, provides information about the functionality of the optoelectrical circuitry on the PIC die 102. In an embodiment, for example, the functionality test is used to assess the presence of an optical emission from the emitter 117 in the optical probe head 162b in the one or more receiving device 124. In this embodiment, the optical signal incident on a receiving device 124 generates a voltage that is measurable at the parametric analyzer 160 as described. A voltage measured by the parametric analyzer 160, indicates optical input to the receiving device 124. In another example embodiment, a functionality test is used to assess the strength of the optical signal or signals that are received by the one or more of the receiving devices 124. In this embodiment, the magnitude of the voltage measured by the parametric tester 160 by the receiving devices 124 in the optical probe head 162b is proportional to the strength of the optical signal received by the receiving devices 124. In other similar embodiments, the strength of the voltage measured at the parametric analyzer 160 through the electrical probe head 162a in contact with the electrical contact pads 130, is proportional to the strength of the optical signal received by a receiving device 124 less any losses or attenuation of the optical signal as it propagates through the optoelectrical circuitry on the PIC die 102. Any of a large number of functionality tests is conceivable that provides an assessment of the functionality of the optoelectrical circuitry and of the PIC die 102.

In Step 994 of FIG. 9B, upon completion of the functionality test performed in Step 993, fabrication of the PIC die 102 is resumed, and can include, for example, the removal of the upturned mirror structure 148 and the formation of v-grooves or other means to support the attachment of optical fiber cables to the PIC die 102

In Step 995 of FIG. 9B, the plurality of PIC die are singulated into individual PIC die 102. Having been subjected to wafer level testing during the fabrication process, PIC die that had failed to meet specific functionality test criteria can optionally be excluded from some further processing steps. In an embodiment, a PIC die that was found to have a faulty receiving device 124, for example, is marked and eliminated from further processing after singulation. Other defects in PIC die 102 that are identified during the functionality testing can be marked for removal or for another intention, or repaired, adjusted, tuned, or any of a number of other remedies in an attempt to provide the specified functionality for the die, or simply used in the compilation of statistical information about the die.

Figure 10A:
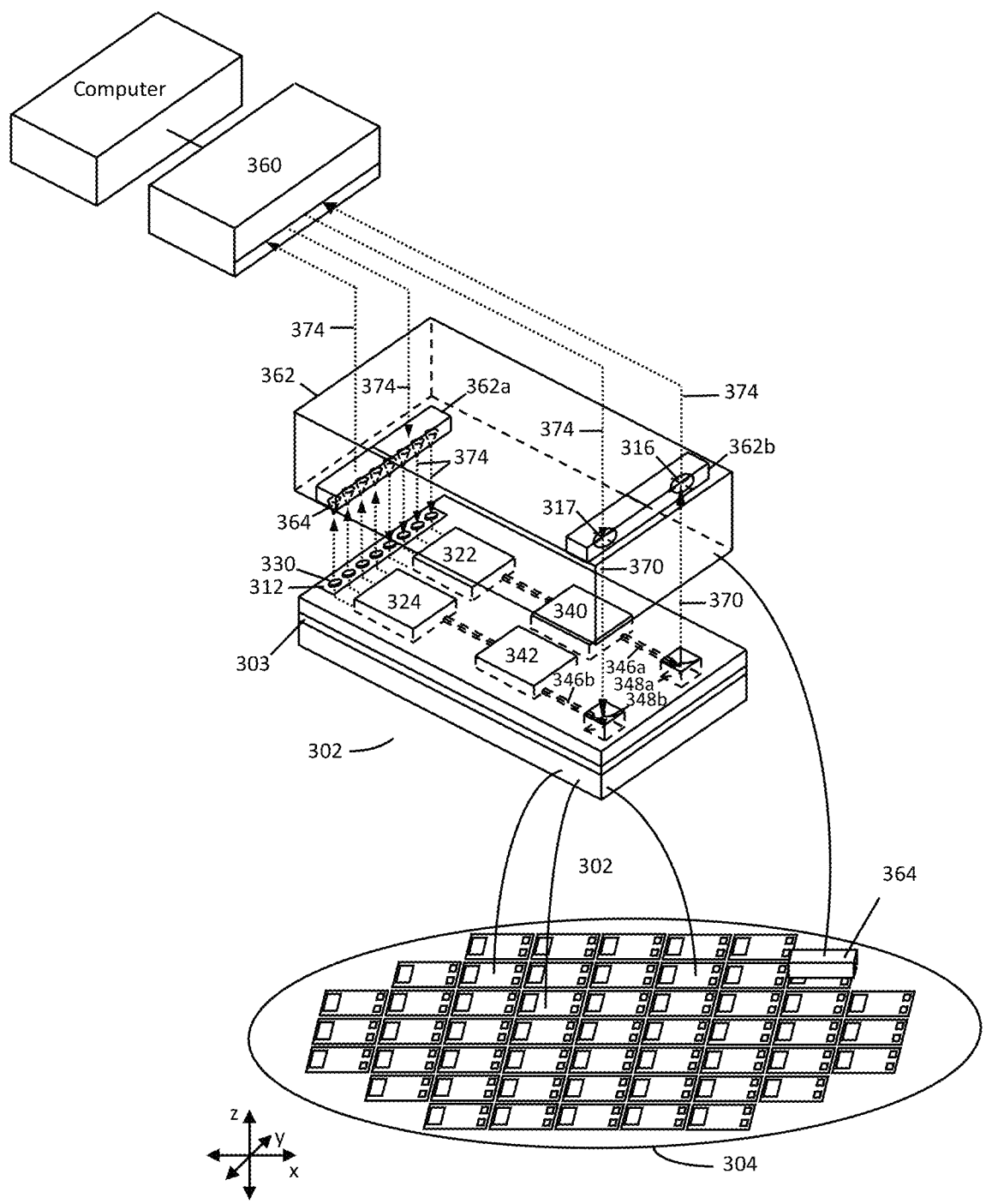
FIG. 10A. Plurality 304 of PICs 302 with one or more sending devices 322 and receiving devices 324 with independent detector 316 and emitter 317 in the optical portion 362b of probe head 362 connected to parametric analyzer 360.

Referring to FIG. 10A, an embodiment of the wafer level testing method and apparatus is shown for a plurality 304 of PIC die 302. An enlarged view of an embodiment of PIC die 302 with one or more sending devices 322 and one or more receiving devices 324 is shown with probe head 362. PIC die 302 in this embodiment includes a first optoelectrical circuitry that includes a sending device 322, optical device 340, planar waveguides 344, 346a, and electrical contact pads 330 on electrical interface 312 and also includes a second optoelectrical circuitry that includes a receiving device 324, optical sending device 342, planar waveguides 344, 346b, and electrical contact pads 330 on electrical interface 312. First optoelectrical circuitry is shown, for example, in sending circuitry 306 shown in FIG. 3A, and second optoelectrical circuitry is shown, for example, in receiving circuitry 308 also shown in FIG. 3A. PIC die 302 in this embodiment also includes upturned mirror structure 348a optically connected to the first optoelectrical circuitry through waveguide section 346a and upturned mirror structure 348b optically connected to the second optoelectrical circuitry through planar waveguide section 346b.

Also shown in FIG. 10A is an embodiment of a probe head 362 that includes an electrical probe head portion 362a with electrical probe contacts 364, and an optical probe head portion 362b that includes an optical detector 316 and an optical emitter 317. In this embodiment, the optical detector 316 is not electrically linked to the optical emitter 317 such that the detector 317 can be operated independently of the emitter 317.

During a wafer level test, the wafer 304 is loaded into a wafer probing apparatus (see FIG. 7, for example) and the electrical probe contacts 364 on the electrical probe head portion 362a are brought into alignment and contact with the electrical contact pads 330 of the PIC die 302. Additionally, the optical detector 316 on the optical probe head 362b is brought into alignment with the upturned mirror structure 348a and the optical emitter 317 on the optical probe head 362b is brought into alignment with the upturned mirror structure 348*b*. Once aligned, an electrical signal 370 from the parametric analyzer 360 or other voltage source 360 is applied to the electrical probe contacts 364 on the electrical probe head 362*a*, and thusly to the electrical contact pads 330 that are connected to the sending device 322 of the PIC die 302. Electrical signals 374 are transmitted from the electrical contact pads 330 to the sending device 322 through the one or more electrical interconnects in the electrical interconnect layer 303 in the embodiment, which activate the sending device 322 to send an optical signal 370 from the sending device 322 through the planar waveguides 344, optical device 340, and the waveguide 346 to the upturned mirror structure 348*a*. The optical signal 374 is reflected in the reflective upturned mirror structure 348*a* to the detector 316 in the optical probe head 362*b*. In the embodiment shown, the optical probe head is equipped with a detector 316 that receives the reflected optical signal 370 and forms an electrical signal that is transmitted to the parametric analyzer 360 or other measurement device 360.

The configuration shown in FIG. 10A includes a computer connected to the parametric analyzer 360 for the storage, manipulation, interpretation, compilation, or transfer of data, for example, that are obtained from the wafer level testing operations that are performed on the PIC die 302. The computer connected to the parametric analyzer may be configured to store, interpret, compile, transfer, or otherwise receive and manipulate the data, locally or attached to a network or to the internet for storage, interpretation, compilation, transfer, or manipulation elsewhere.

In the embodiment shown in FIG. 10A, a functionality is provided with independent control of the detector 316 and emitter 317 devices in the optical probe head 362*b*. In an embodiment with this level of independent control, the wafer level test can include a further test of the second optoelectrical circuitry of the PIC die 302. Continuation of the wafer level test on the PIC die 302 includes the sending of an electrical signal 374 from the parametric analyzer 360 to the emitter 317 on the optical probe head 362*b*. The electrical signal 374 transmitted from the parametric analyzer 360 in this embodiment, causes the emitter 317 to emit an optical signal 370 that is incident upon the reflected mirror structure 348*b* of the PIC die 302. This optical signal 370 is reflected by the mirror structure 348*b* into the planar waveguide section 346*b*, through the optical device 342, the planar waveguides 344, to the receiving devices 324. Upon absorption of the signal by the receiving device 324, an electrical signal 374 is generated that is transmitted through the electrical interconnects in the electrical interconnect layer 303, through the contact pads 330 to the electrical probe contacts 364 on the electrical probe head portion 362*a*, and to the parametric analyzer 360.

The configuration shown in the embodiment in FIG. 10A includes a computer connected to the parametric analyzer 360 for the storage, manipulation, interpretation, compilation, or transfer of data, for example, that are obtained from the wafer level testing operations that are performed on the PIC die 302. The computer connected to the parametric analyzer may be configured to store, interpret, compile, transfer, or otherwise receive and manipulate the data, locally or attached to a network or to the internet for storage, interpretation, compilation, transfer, or manipulation elsewhere.

In the embodiment shown in FIG. 10A with independently controllable detector 316 and emitter 317 in the optical probe head 362*b*, a functionality is provided that allows for testing of the first optoelectrical circuitry with the sending device 322, testing of the second optoelectrical circuitry with the receiving device 324, or both the first and second optoelectrical circuitries.

Referring to FIG. 10B, a flowchart is provided that shows the method for fabrication and wafer level testing in embodiments that include at least one sending device 322 in a first optoelectrical circuitry 306 and at least one receiving device 324 in a second optoelectrical circuitry 308, such as described in FIG. 3A and FIG. 10A. In Step 1090 of FIG. 10B, a base structure 301 is formed that includes an optional electrical interconnect layer 303 on substrate 300.

In Step 1091*a* of FIG. 10B, a first optoelectrical device or circuitry 306 is formed on the base structure 301 that includes at least one optical sending device 322, one or more optical devices 340, electrical contact pads 330*a* on electrical interface 312, and electrical connections 332 between the electrical contact pads 330*a* and the sending device 322, and planar waveguides 344, 346. In Step 1091*a*, the first optoelectrical circuitry 306 with sending device 322 is configured to send an optical signal 370.

In Step 1091*b* of FIG. 10B, a second optoelectrical device or circuitry 308 is formed on the base structure 301 that includes at least one optoelectrical receiving device 324, one or more optical device 342, electrical contact pads 330*b* on electrical interface 312, electrical connections 332 between the electrical contact pads 330*b* and the receiving device 324, and planar waveguides 344,346. In Step 1091*b*, the second optoelectrical circuitry 308 with receiving device 324 is configured to receive an optical signal 370.

In Step 1092*a*, a first upturned mirror structure 348*a* is formed on the base structure 301 on PIC die 302 that is optically connected to the one or more sending devices 322 and the optical device 340 through planar waveguides 344 and planar waveguide section 346*a*. This first upturned mirror structure 348*a* is configured to receive optical signals 370 from the sending device 322 through planar waveguides 344, and through the optical device 342. The first optoelectrical circuitry 306, in embodiments, is configured to send one or more optical signals from the one or more optical sending devices 322 through other components in the first optoelectrical circuitry 306 including the optical device 342 to the upturned mirror 348*a* as shown in FIG. 10A. The upturned mirror 348*a*, in this embodiment, is configured to receive the optical signal, formed in the one or more sending devices 322, from the planar waveguide section 346*a* of the first optoelectrical circuitry 306. In an embodiment, the optical signal is a single wavelength signal from a single sending device 322. In other embodiments, the optical signal is a multiplexed signal that includes two or more wavelengths from two or more optical sending devices 322.

In Step 1092*b*, a second upturned mirror structure 348*b* is formed on the base structure 301 on PIC die 302 that is optically connected to the one or more receiving devices 324 and the optical device 342 through planar waveguides 344, optical device 340, and planar waveguide section 346*b*. This second upturned mirror structure 348*b* is optically aligned with the planar waveguide section 346*b* such that this second upturned mirror structure 348*b* can receive an optical signal from an optical probe head 362 positioned above the PIC die 302 and reflect this signal into the planar waveguide section 346*b*. The second optical circuitry 308, in embodiments, is configured to receive one or more reflected optical signals, wholly or in part in the one or more optical receiving devices 324 from an optical signal reflected into the planar waveguide 346*b* by the upturned mirror 348*b* as shown in FIG. 10A.

In Step 1093 of FIG. 10B, a probe head is provided that includes an electrical probe head 362*a* and an optical probe head 362*b*. The electrical probe head 362*a* and the optical probe head 362*b*, in some embodiments, are combined into a single probe head 362. In other embodiments, the electrical probe head 362*a* and the optical probe head 362*b* are separate probe heads. In addition to providing the probe heads 362*a*, 362*b*, a parametric analyzer 360 is also provided in Step 1093. The parametric analyzer 360 is commonly used equipment in electrical device testing, and in particular in functionality testing of integrated circuits and photonic integrated circuits. A parametric analyzer 360 is a device, typically programmable, that contains one or more voltage or current sources (outputs), and the capability to measure one or more voltages or currents (inputs).

In embodiments described in FIG. 10B, the optical probe head 362*b* includes an electrical probe head portion 362*a* with electrical probe contacts 364, and an optical probe head portion 362*b* that includes an optical detector 316 and an optical emitter 317. In this embodiment, the optical detector 316 is configured to allow independent operation from the emitter 317 in that the electrical signals from the detector 316 are transmitted to the parametric analyzer 360, and the parametric analyzer sends electrical signals to the emitter 317. This configuration provides a variety of options not available with other embodiments of the optical probe head 362*b*. This optical probe head configuration is shown, for example, in FIG. 3B(ii).

In Step 1093 shown in FIG. 10B, a functionality test is performed of the first optoelectrical circuitry 306, the second optoelectrical circuitry 308, or the first and second optoelectrical circuitries 306, 308 formed on the PIC die 302 using the parametric analyzer 360 connected to one or more of the electrical contact pads 330 and to the detector 316 and the emitter 317 in the optical probe head 362*b*.

In the embodiments described in FIGS. 10A and 10B, the optical probe head 362*b* is configured with a detector 316 and emitter 317, and this configuration of the optical probe head 362*b* provides a high level of flexibility in the range of tests that can be performed on the PIC die 302 in comparison to other testing configurations described herein. In this probe head configuration, in which both the detector 316 and the emitter 317 are electrically connected to the parametric analyzer, each can be operated independently and concurrently from the other allowing for testing of the first optoelectrical circuitry 306, the second optoelectrical circuitry 308, or both.

In an embodiment for which the first optoelectrical circuitry is tested, the parametric analyzer 360 provides a voltage to the electrical probe head 362*a*, in contact with the one or more electrical contact pads 330 on the electrical interface 312 of the PIC die 302. The voltage applied to the electrical contact pads 330 from the electrical probe head 362*a* reaches the sending device 322 through the electrical interconnects 332 in the electrical interconnect layer 303 on the substrate 300, activating the sending device 322. In an embodiment, the sending device is a laser, and when activated, the laser sending device 322 sends an optical signal at a specific wavelength at which the laser is designed to emit. The emitted optical signal 370 from the sending device 322 is sent through the planar waveguide 344 to the optical device 340, and again through a waveguide layer section 346 to the upturned mirror structure 348*a*.

Upon reaching the upturned mirror structure 348*a*, the optical signal is reflected perpendicularly (from the plane of propagation in the planar waveguide layer 305) by the reflective layer in the upturned mirror structure 348*a*. The optical probe head 362*b* is positioned in proximity to the upturned mirror structure to receive the reflected optical signal 370. In an embodiment, the optical probe head 362*b* is configured with an optoelectrical detector 316 that is further configured to send electrical signals to the parametric analyzer 360 when the detector is activated by an incident optical signal such as the optical signal from the sending device 322. The optical signal that is reflected from the upturned mirror structure 348 provides information about the functionality of the optoelectrical circuitry on the PIC die 302. In an embodiment, for example, the functionality test is used to assess the presence of an optical emission from the one or more sending devices 322. In this embodiment, the optical signal from the sending device 322 will generate a voltage at the detector 236 in the optical probe head 362*b* that is measurable at the parametric tester. A voltage measured by the detector 316, indicates output from the sending device. In another example embodiment, the functionality test is used to assess the strength of the optical signal from one or more of the sending devices 322. In this embodiment, the magnitude of the voltage measured by the parametric tester 360 from the detector 316 in the optical probe head 362*b* is proportional to the strength of the optical signal from the sending device 322. In other similar embodiments, the strength of the voltage measured at the detector 316 in the optical probe head 362*b* is proportional to the optical output from the sending device less any losses or attenuation of the optical signal as it propagates through the optoelectrical circuitry on the PIC die 302. In yet another embodiment, the wavelength of the emission from the sending device is measured with a suitable detector in the optical probe head 362*b* for measuring optical wavelengths, such as a spectrometer, a CCD array, or a wavelength bandwidth filter in series with a photodetector, or a number of wavelength bandwidth filters, each with a differing bandwidth to allow only specific wavelengths of light to pass to a photodiode, for example. Any of a large number of functionality tests is configurable with the appropriate detectors.

Alternatively, or in addition to the testing of the first optoelectrical circuitry, a functionality test is performed of the second optoelectrical circuitry 308 on the PIC die 302 using the parametric analyzer 360 connected to the optical probe head 362*b* and to one or more of the electrical contact pads 330. In an embodiment, the parametric analyzer 360 provides a signal, optical or electrical, to an emitter 317 in the optical probe head 362*b*. The optical probe head 362*b* is aligned with the upturned mirror 348*b* such that the optical signal, initiated by the parametric analyzer 360, is emitted by the emitter 317 in the optical probe head 362*b* and this emitted signal is incident, or substantially incident on the second upturned mirror 348*b* on the PIC die 302. The second upturned mirror 348*b*, in this embodiment, is configured to receive the optical signal from the optical probe head 362*b*, and to reflect the optical signal into the planar waveguide section 346 adjacent to the mirror 348*b* as shown in FIG. 10A. In an embodiment, the optical signal is a single wavelength signal from the optical probe head 362*b*. In other embodiments, the signal includes two or more optical wavelengths. In some embodiments in which the optical signal includes multiple wavelengths of light, the optical signal is generated by multiple optical signal generating devices in the emitter 317 of the optical probe head 362*a*, or from multiple optical signal generating devices in, connected to, or operating in conjunction with, the parametric analyzer 360. The incident optical signal on the upturned mirror structure 348*b* is reflected into the planar waveguide section 346*b* of planar waveguide 344, and propagates in the planar waveguide section 346*b* to the optical device 342, and through planar waveguides 344 to the receiving device 324. Other waveguides and devices may also be included in the optoelectrical circuitry in other embodiments. In an embodiment, the optical signal 370 received by the upturned mirror 348b from the optical probe head 362b and reflected into the planar waveguide section 346 is a single wavelength optical signal. In other embodiments, the optical signal received by the upturned mirror 348b from the optical probe head 362b and that is reflected into the planar waveguide section 346b includes multiple wavelengths. In some embodiments, the optical signal reflected by the upturned mirror structure 348b and received by the optical device 342 is an optical signal composed from a single wavelength. In other embodiments, the optical signal reflected by the upturned mirror structure 348 and received by the optical device 342 is an optical signal composed of multiple wavelengths of light. In some embodiments for which the optical signal includes multiple wavelengths of light, the optical device 342 is a demultiplexing device such as an arrayed waveguide or an echelle grating. In these embodiments, the optical signal 370 may be split into multiple wavelengths in the demultiplexing device 342 and separated into multiple planar waveguides 344, and received by one or more receiving devices 324. The one or more receiving devices 324 are electrically connected, through the electrical connections 332 in the electrical interconnect layer 303, to the one or more electrical contact pads 330 on the electrical interface 312. When activated by the optical signal, the receiving device 324 generates a voltage that is transmitted to the electrical contact pads 330 through the electrical connections 332. The electrical signal, typically a voltage, is detectable at the electrical probe head 362a in contact with the electrical contact pads 330, and at the parametric analyzer connected to the electrical probe head 362a. In an embodiment, the receiving device 324 is a photodetector, and when activated by the optical signal that originated at the optical probe head 362b, the photodetector generates the voltage that is detected at the parametric analyzer 360.

In embodiments, the electrical probe head 362b, is configured to send electrical signals to the parametric analyzer 360 when the receiving device is activated by an incident optical signal such as the optical signal 370 from the optical probe head 362b. The optical signal that is reflected from the upturned mirror structure 348b, and received by the one or more receiving device 324, provides information about the functionality of the optoelectrical circuitry on the PIC die 302. In an embodiment, for example, the functionality test is used to assess the presence of an optical emission from the emitter 317 in the optical probe head 362b in the one or more receiving device 324. In this embodiment, the optical signal incident on a receiving device 324 generates a voltage that is measurable at the parametric analyzer 360 as described. A voltage measured by the parametric analyzer 360, indicates optical input to the receiving device 324. In another example embodiment, a functionality test is used to assess the strength of the optical signal or signals that are received by the one or more of the receiving devices 324. In this embodiment, the magnitude of the voltage measured by the parametric tester 360 by the receiving devices 324 in the optical probe head 362b is proportional to the strength of the optical signal received by the receiving devices 324. In other similar embodiments, the strength of the voltage measured at the parametric analyzer 360 through the electrical probe head 362a in contact with the electrical contact pads 330, is proportional to the strength of the optical signal received by a receiving device 324 less any losses or attenuation of the optical signal as it propagates through the optoelectrical circuitry on the PIC die 302. Any of a large number of functionality tests is conceivable that provides an assessment of the functionality of the optoelectrical circuitry and of the PIC die 302.

In Step 1094 of FIG. 10B, upon completion of the functionality test performed in Step 1093, fabrication of the PIC die 302 is resumed, and can include, for example, the removal of the upturned mirror structures 348a, 348b and the formation of the v-grooves or other means to support the attachment of optical fiber cables to the PIC die 302 such as the attachment of an optical fiber mounting block.

In Step 1095 of FIG. 10B, the plurality of PIC die are singulated into individual PIC die 302. Having been subjected to wafer level testing during the fabrication process, PIC die that failed to meet specific functionality test criteria can optionally be excluded from some further processing steps. A PIC die that was found to have a faulty laser, for example, can be marked and eliminated from further processing after singulation. Similarly, a PIC die that was found to have a faulty receiving device 124, for example, can be marked and eliminated from further processing. Other defects in PIC die 302 that are identified during the functionality testing can be marked, repaired, adjusted, tuned, or any of a number of other remedies to provide the specified functionality for the die.

Figure 11A:
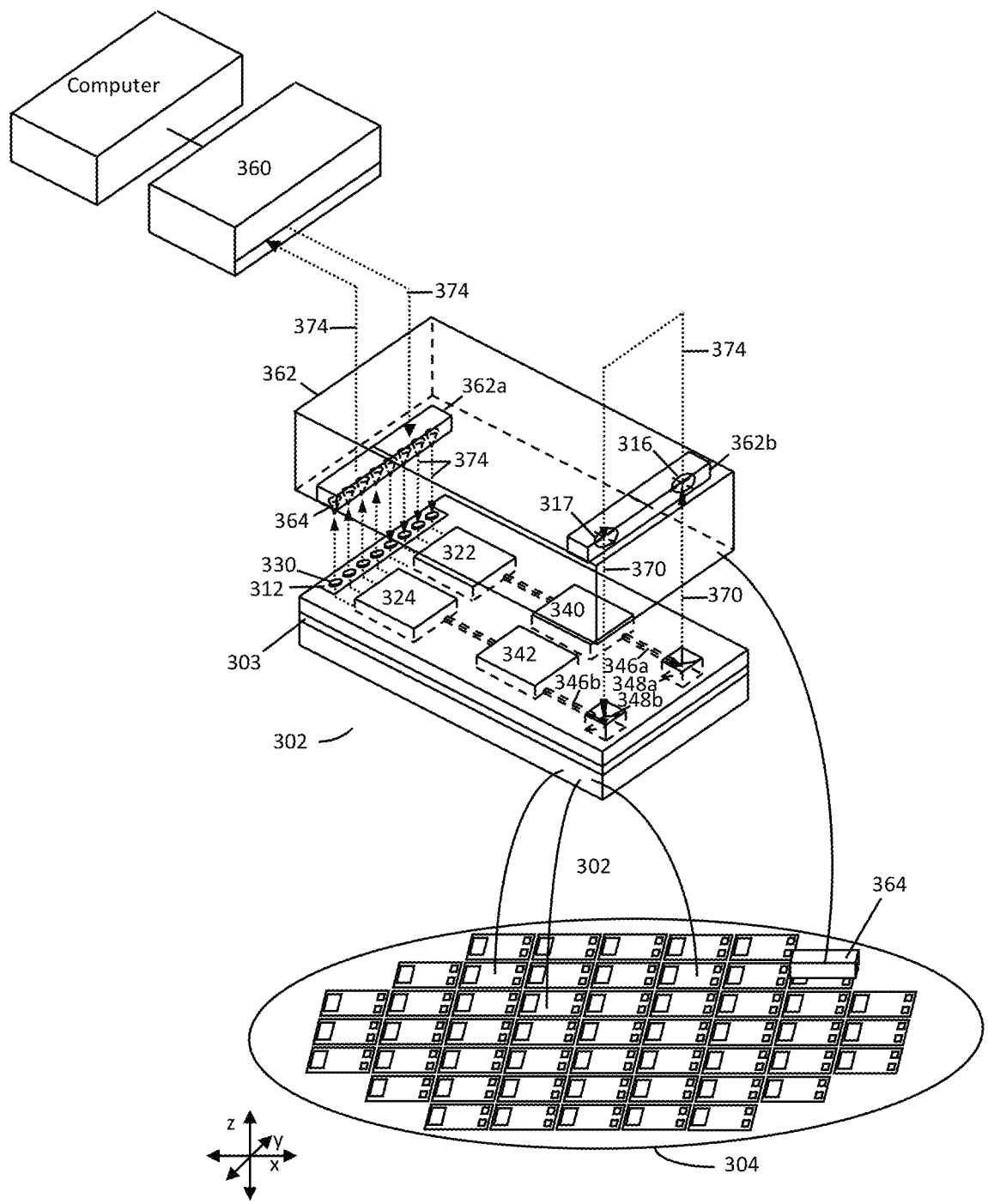
FIG. 11A. Plurality 304 of PICs 302 with one or more sending devices 322 and receiving devices 324 with electrically coupled detector 316 and emitter 317 in the optical portion 362b of probe head 362 connected to parametric analyzer 360.

Referring to FIG. 11A, an embodiment of the wafer level testing method and apparatus is shown for a plurality 304 of PIC die 302. An enlarged view of an embodiment of PIC die 302 with one or more sending devices 322 and one or more receiving devices 324 is shown with probe head 362. PIC die 302 in this embodiment includes a first optoelectrical circuitry that includes a sending device 322, optical device 340, planar waveguides 344, 346a, and electrical contact pads 330 on electrical interface 312 and also includes a second optoelectrical circuitry that includes a receiving device 324, optical sending device 342, planar waveguides 344, 346b, and electrical contact pads 330 on electrical interface 312. PIC die 302 in this embodiment also includes upturned mirror structure 348a optically connected to the first optoelectrical circuitry through waveguide section 346a and upturned mirror structure 348b optically connected to the second optoelectrical circuitry through planar waveguide section 346b Also shown in FIG. 11A is probe head 362 that includes an electrical probe head portion 362a with electrical probe contacts 364, and an optical probe head portion 362b that includes an optical detector 316 and an optical emitter 317. In this embodiment, the optical detector 316 is electrically linked to the optical emitter 317 such that the detection of an optical signal by the detector 317 triggers the emission of an optical signal by the emitter 317 either through direct connection of the detector 316 to the emitter 317 or through an intermediate device that receives an electrical signal from the detector 316 and transfers the same or a modified signal to the emitter 317 to trigger an emitted signal from the emitter 317. During a wafer level test in an embodiment, the wafer 304 is loaded into a wafer probing apparatus (see FIG. 7, for example) and the electrical probe contacts 364 on the electrical probe head portion 362a are brought into alignment and contact with the electrical contact pads 330 of the PIC die 302. Additionally, the optical detector 316 on the optical probe head 362b is brought into alignment with the upturned mirror structure 348a and the optical emitter 317 on the optical probe head 362b is brought into alignment with the upturned mirror structure 348b. Once aligned, an electrical signal from the parametric analyzer 360 or other voltage source 360 is applied to the electrical probe contacts 364 on the electrical probe head 362a, and thusly to the electrical contact pads that are connected to the sending device 322 of the PIC die 302. Electrical signals 374 are transmitted from the electrical contact pads 330 to the sending device 322 through the one or more electrical interconnects in the electrical interconnect layer 303, which activate the sending device 322 to send an optical signal 370 from the sending device 322 through the planar waveguides 344, optical device 340, and the waveguide 346 to the upturned mirror structure 348a. The optical signal 374 is reflected in the reflective upturned mirror structure 348a to the detector 316 in the optical probe head 362b. In the embodiment shown, the optical probe head is equipped with a detector 316 that receives the reflected optical signal 370 and forms an electrical signal that is transmitted to the emitter 317 either directly, or through an intermediate device that transfers the signal directly or that amplifies, converts, or somehow modifies the from the detector prior to sending a signal to the emitter 317 to trigger an emitted signal.

In the embodiment shown in FIG. 11A, the emission of an optical signal 370 by the emitter 317 to mirror 348b is dependently linked to the detection of the optical signal 370 from the sending device 322 in the first optoelectrical circuitry. In an embodiment with this dependency between the emitter 317 and the detector 316, the wafer level test includes a testing sequence that includes both the first optoelectrical circuitry and the second optoelectrical circuitry of the PIC die 302.

Upon emission of the optical signal from the emitter 317, triggered by the detection of an optical signal by the detector 316, this optical signal 370 is incident on the reflective mirror structure 348b, is reflected wholly or in part into the planar waveguide section 346b, through the optical device 342, the planar waveguides 344, to the receiving devices 324. Upon absorption of the signal by the receiving device 324, an electrical signal 374 is generated that is transmitted through the electrical interconnects in the electrical interconnect layer 303, through the contact pads 330 to the electrical probe contacts 364 on the electrical probe head portion 362a, and to the parametric analyzer 360.

The configuration shown in FIG. 11A includes a computer connected to the parametric analyzer 360 for the storage, manipulation, interpretation, compilation, or transfer of data, for example, that are obtained from the wafer level testing operations that are performed on the PIC die 302. The computer connected to the parametric analyzer may be configured to store, interpret, compile, transfer, or otherwise receive and manipulate the data, locally or attached to a network or to the internet for storage, interpretation, compilation, transfer, or manipulation elsewhere.

In the embodiment shown in FIG. 11A with interdependently controllable detector 316 and emitter 317 in the optical probe head 362b, a wafer level testing functionality is provided that allows for testing of both the first optoelectrical circuitry with the sending device 322 and the second optoelectrical circuitry with the receiving device 324.

Referring to FIG. 11B, a flowchart is provided that shows the method for fabrication and wafer level testing in embodiments that include at least one sending device 322 in a first optoelectrical circuitry 306 and at least one receiving device 324 in a second optoelectrical circuitry 308, such as described in FIG. 3A and FIG. 11A. In Step 1190 of FIG. 11B, a base structure 301 is formed that includes an electrical interconnect layer 303 on substrate 300.

In Step 1191a of FIG. 11B, a first optoelectrical device or circuitry 306 is formed on the base structure 301 that includes at least one optical sending device 322, one or more optical device 340, electrical contact pads 330a on electrical interface 312, and electrical connections 332 between the electrical contact pads 330a and the sending device 322, and planar waveguides 344, 346a. In Step 1191a, the first optoelectrical circuitry 306 with sending device 322 is configured to send an optical signal 370.

In Step 1191b of FIG. 11B, a second optoelectrical device or circuitry 308 is formed on the base structure 301 that includes at least one optical receiving device 324, one or more optical device 342, electrical contact pads 330b on electrical interface 312, electrical connections 332 between the electrical contact pads 330b and the receiving device 324, and planar waveguides 344, 346b. In Step 1191b, the second optoelectrical circuitry 308 with receiving device 324 is configured to receive an optical signal 370.

In Step 1192a, a first upturned mirror structure 348a is formed on the base structure 301 that is optically connected to the one or more sending devices 322 and the optical device 340 through planar waveguides 344 and planar waveguide section 346a. This first upturned mirror structure 348a is configured to receive optical signals 370 from the sending device 322 through planar waveguides 344, and through the optical device 342. The first optical circuitry 306, in embodiments, is configured to send one or more optical signals from the one or more optical sending devices 322 through other components in the first optoelectrical circuitry 306 including the optical device 342 to the upturned mirror 348a as shown in FIG. 11A. In an embodiment, the optical signal is a single wavelength signal from a single sending device 322. In other embodiments, the optical signal is a multiplexed signal that includes two or more wavelengths from two or more optical sending devices 322.

In Step 1192b, a second upturned mirror structure 348b is formed on the base structure 301 that is optically connected to the one or more receiving devices 324 and the optical device 342 through planar waveguides 344, optical device 340, and planar waveguide section 346b. This second upturned mirror structure 348b is optically aligned with the planar waveguide section 346b such that this second upturned mirror structure 348b can receive an optical signal from an optical probe head 362 positioned above the PIC die 302 and reflect this signal into the planar waveguide section 346b. The second optical circuitry 308, in embodiments, is configured to receive one or more reflected optical signals, wholly or in part in the one or more optical receiving devices 324 from an optical signal reflected into the planar waveguide 346b by the upturned mirror 348b as shown in FIG. 11A.

In Step 1193 of FIG. 11B, a probe head is provided that includes an electrical probe head 362a and an optical probe head 362b. The electrical probe head 362a and the optical probe head 362b, in some embodiments, are combined into a single probe head 362. In other embodiments, the electrical probe head 362a and the optical probe head 362b are separate probe heads. In addition to providing the probe heads 362a, 362b, a parametric analyzer 360 is also provided in Step 1193. The parametric analyzer 360 is commonly used equipment in electrical device testing, and in particular in functionality testing of integrated circuits and photonic integrated circuits. A parametric analyzer 360 is a device, typically programmable, that contains one or more voltage or current sources (outputs), and the capability to measure one or more voltages or currents (inputs).

In embodiments described in FIG. 11B, the optical probe head 362b includes an electrical probe head portion 362a with electrical probe contacts 364, and an optical probe head portion 362b that includes an optical detector 316 and an optical emitter 317. In these embodiments, the optical detector 316 is electrically linked to the optical emitter 317 such that the detection of an optical signal by the detector 317 triggers the emission of an optical signal by the emitter 317 either through direct connection of the detector 316 to the emitter 317 or through an intermediate device that receives an electrical signal from the detector 316 and transfers the same or a modified signal to the emitter 317 to trigger an emitted signal from the emitter 317.

In Step 1193 of FIG. 11B, a functionality test is performed of the first and second optoelectrical circuitries 306, 308 formed on the PIC die 302 using the parametric analyzer 360 connected to one or more of the electrical contact pads 330 and to the optical probe head 362b. In an embodiment, the parametric analyzer 360 provides a voltage to the electrical probe head 362a, in contact with the one or more electrical contact pads 330 on the electrical interface 312 of the PIC die 302. The voltage applied to the electrical contact pads 330 from the electrical probe head 362a reaches the sending device 322 through the electrical interconnects 332 in the electrical interconnect layer 303 on the substrate 300, activating the sending device 322. In an embodiment, the sending device is a laser 322, and when activated, the laser device 322 sends an optical signal at a specific wavelength at which the laser is designed to emit. The emitted optical signal 370 from the sending device 322 is sent through the planar waveguide 344 to the optical device 340, and again through a waveguide layer section 346 to the upturned mirror structure 348a.

Upon reaching the upturned mirror structure 348a, the optical signal is reflected perpendicularly (from the plane of propagation in the planar waveguide layer 305) by the reflective layer in the upturned mirror structure 348a. The optical probe head 362b is positioned in proximity to the upturned mirror structure to receive the reflected optical signal 370. In an embodiment, the optical probe head 362b is configured with an optoelectrical detector 336 that is further configured to send, or cause to be sent, electrical signals to the emitter 317 of the optical probe head. The emitter 317, upon receiving the electrical signal from the detector 316, emits an optical signal to upturned mirror 348b that is optically connected through planar waveguide section 346b to the second optoelectrical circuitry 308. The incident optical signal on the second upturned mirror is reflected into the second optoelectrical circuitry through the planar waveguide section 346b and propagates wholly or in parts through the second optoelectrical circuitry to the one or more receiving devices 324, wherein the parametric analyzer receives an electrical signal from the electrical probe head 362a connected to the one or more receiving devices, and wherein the electrical signal received by the parametric analyzer provides information about the functionality of the first and second optoelectrical circuitries 306, 308.

In embodiments, the optical signal 370 from the sending device 322 will generate a voltage at the receiving device 324 that is measurable at the parametric tester 360. The voltage formed on the receiving device 324 and measured by the parametric analyzer 360, indicates that output from the sending device 322 has reached the receiving device 324. The magnitude of the voltage formed on the receiving device 324 can also yield information about the optical output from the sending devices, losses or attenuation of the optical signal in the optoelectrical circuitries, and the functionality of the receiving devices, among other information about the functionality of the optoelectrical devices and circuitry on the PIC die 302.

In Step 1194 of FIG. 11B, upon completion of the functionality test performed in Step 1193, fabrication of the PIC die 302 is resumed, and can include, for example, the removal of the upturned mirror structures 348a, 348b the formation of the v-grooves or other means to support the attachment of optical fiber cables to the PIC die 302 such as the attachment of an optical fiber mounting block.

In Step 1195 of FIG. 11B, the plurality of PIC die are singulated into individual PIC die 302. Having been subjected to wafer level testing during the fabrication process, PIC die that failed to meet specific functionality test criteria can be excluded from some further processing steps. In an embodiment, for example, a PIC die that was found to have a faulty laser, is marked and eliminated from further processing after singulation. Other defects in PIC die 302 that are identified during the functionality testing can be marked, repaired, adjusted, tuned, or any of a number of other remedies to provide the specified functionality for the die.

Figure 12A:
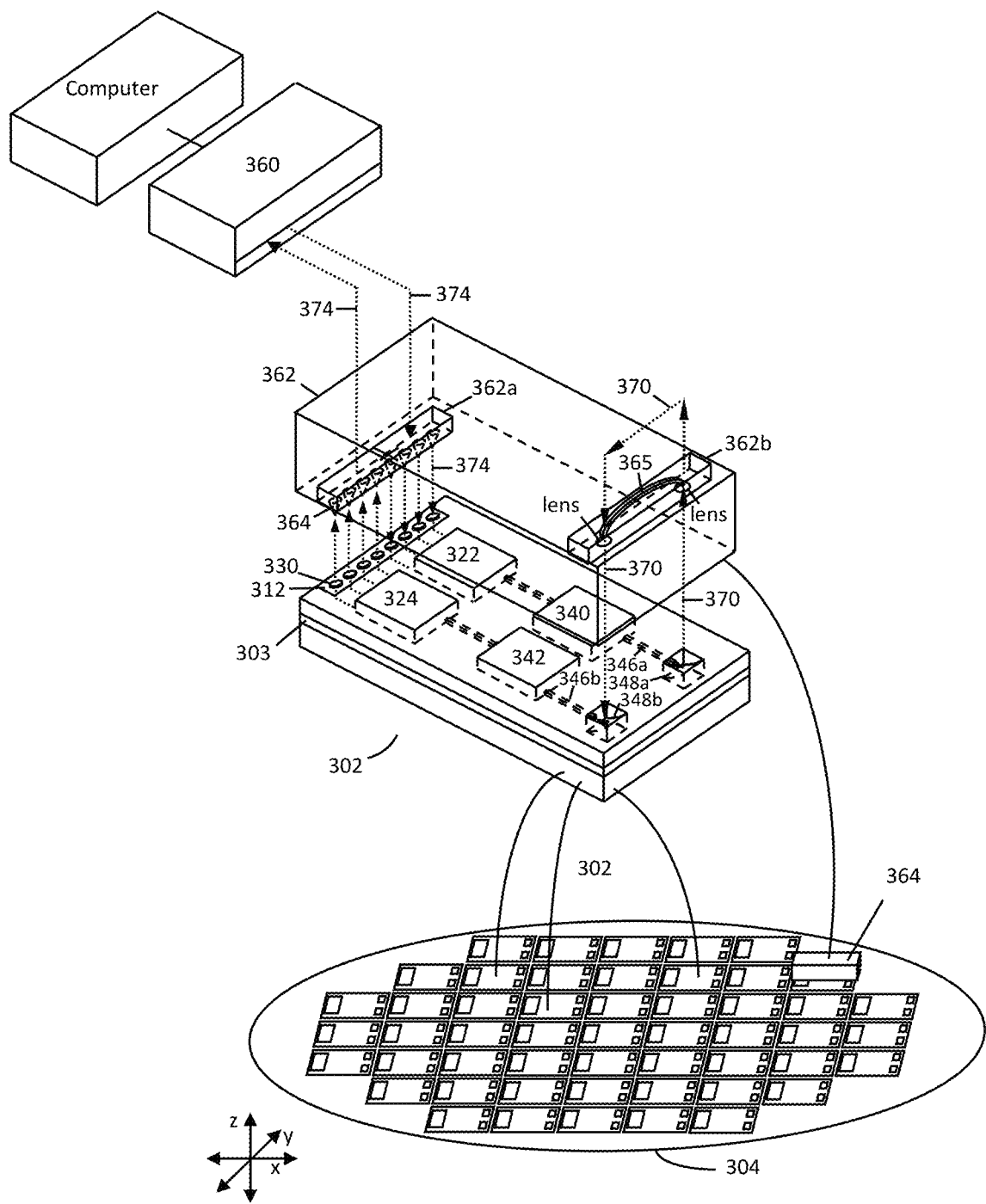
FIG. 12A. Plurality 304 of PICs 302 with one or more sending devices 322 and receiving devices 324 with optical loop 365 in the probe head 362.

Referring to FIG. 12A, an embodiment of the wafer level testing method and apparatus is shown for a plurality 304 of PIC die 302. An enlarged view of an embodiment of PIC die 302 with one or more sending devices 322 and one or more receiving devices 324 is shown with probe head 362. PIC die 302 in this embodiment includes a first optoelectrical circuitry that includes a sending device 322, optical device 340, planar waveguides 344, 346a, and electrical contact pads 330 on electrical interface 312 and also includes a second optoelectrical circuitry that includes a receiving device 324, optical sending device 342, planar waveguides 344, 346b, and electrical contact pads 330 on electrical interface 312. First optoelectrical circuitry is shown, for example, in sending circuitry 306 shown in FIG. 3A, and second optoelectrical circuitry is shown, for example, in receiving circuitry 308 also shown in FIG. 3A. PIC die 302 in this embodiment also includes upturned mirror structure 348a optically connected to the first optoelectrical circuitry through waveguide section 346a and upturned mirror structure 348b optically connected to the second optoelectrical circuitry through planar waveguide section 346b.

Also shown in FIG. 12A is an embodiment of probe head 362 that includes an electrical probe head portion 362a with electrical probe contacts 364, and an optical probe head portion 362b that includes an optical loop 365. In this embodiment, the optical loop 365 is configured to receive an optical signal 370 either directly or through a lens such that the optical signal from the PIC die 302 is received by the probe head 362 and redirected back to the PIC die 302 as shown in FIG. 12A.

During a wafer level test in an embodiment, the wafer 304 is loaded into a wafer probing apparatus (see FIG. 7, for example) and the electrical probe contacts 364 on the electrical probe head portion 362a are brought into alignment and contact with the electrical contact pads 330 of the PIC die 302. Additionally, a receiving portion of the optical loop on the optical probe head 362b is brought into alignment with the upturned mirror structure 348a and the redirecting end of the optical loop on the optical probe head 362b is brought into alignment with the upturned mirror structure 348b as shown in FIG. 12A. Once aligned, an electrical signal from the parametric analyzer 360 or other voltage source 360 is applied to the electrical probe contacts 364 on the electrical probe head 362a, and thusly to the electrical contact pads that are connected to the sending device 322 of the PIC die 302. Electrical signals 374 are transmitted from the electrical contact pads 330 to the sending device 322 through the one or more electrical interconnects in the electrical interconnect layer 303, which activate the sending device 322 to send an optical signal 370 from the sending device 322 through the planar waveguides 344, optical device 340, and the waveguide 346 to the upturned mirror structure 348*a*. The optical signal 374 is reflected in the reflective upturned mirror structure 348*a* to the optical loop 365 with optional lens in the optical probe head 362*b*. In the embodiment shown in FIG. 12A, the optical probe head is equipped with an optical loop 365 that receives the reflected optical signal 370 from mirror 348*a* and redirects the optical signal from the optical probe head 362*b* to the upturned mirror 348*b*.

In the embodiment shown in FIG. 12A, the redirecting of the optical signal 370 from mirror 348*a* to mirror 348*b* through the optical probe head 362*b* is dependently linked to the receiving of the optical signal 370 from the sending device 322 in the first optoelectrical circuitry. In embodiments with this dependent looping of the optical signal from the mirror 348*a* to the mirror 348*b*, wafer level testing includes both the first optoelectrical circuitry and the second optoelectrical circuitry of the PIC die 302.

Upon the reemergence of the optical signal 370 from the optical loop 365 in the optical probe head 362*b*, this optical signal 370 is incident on the reflective mirror structure 348*b*, is reflected wholly or in part into the planar waveguide section 346*b*, through the optical device 342, the planar waveguides 344, to the receiving devices 324. Upon absorption of the signal by the receiving device 324, an electrical signal 374 is generated that is transmitted through the electrical interconnects in the electrical interconnect layer 303, through the contact pads 330 to the electrical probe contacts 364 on the electrical probe head portion 362*a*, and to the parametric analyzer 360.

The configuration shown in FIG. 12A includes a computer connected to the parametric analyzer 360 for the storage, manipulation, interpretation, compilation, or transfer of data, for example, that are obtained from the wafer level testing operations that are performed on the PIC die 302. The computer connected to the parametric analyzer may be configured to store, interpret, compile, transfer, or otherwise receive and manipulate the data, locally or attached to a network or to the internet for storage, interpretation, compilation, transfer, or manipulation elsewhere.

In the embodiment shown in FIG. 12A with the optical loop 365 in the optical probe head 362*b*, a wafer level testing functionality is provided that provides for testing of both the first optoelectrical circuitry with the sending device 322 and the second optoelectrical circuitry with the receiving device 324 using optical signals generated by the sending devices in the first optoelectrical circuitry and electrical signals generated by the receiving devices in the second optoelectrical circuitry. Although the concurrent testing of both the first and second optoelectrical circuitries is also a feature of the embodiments in FIGS. 10 and 11, the testing of the first and second circuitries for the embodiment described in FIG. 12 is directly linked to the detection in the second optoelectrical circuitry of the optical signal 370 formed in the first circuitry.

Referring to FIG. 12B, a flowchart is provided that shows the method for fabrication and wafer level testing in embodiments that include at least one sending device 322 in a first optoelectrical circuitry 306 and at least one receiving device 324 in a second optoelectrical circuitry 308, such as described in FIGS. 3A and 12A. In Step 1290 of FIG. 12B, a base structure 301 is formed that includes an optional electrical interconnect layer 303 on the substrate 300.

In Step 1291*a* of FIG. 12B, a first optoelectrical device or circuitry 306 is formed on the base structure 301 that includes at least one optical sending device 322, one or more optical device 340, electrical contact pads 330*a* on electrical interface 312, and electrical connections 332 between the electrical contact pads 330*a* and the sending device 322, and planar waveguides 344, 346. In Step 1291*a*, the first optoelectrical circuitry 306 with sending device 322 is configured to send an optical signal 370.

In Step 1291*b* of FIG. 12B, a second optoelectrical device or circuitry 308 is formed on the base structure 301 that includes at least one optoelectrical receiving device 324, one or more optical devices 342, electrical contact pads 330*b* on electrical interface 312, electrical connections 332 between the electrical contact pads 330*b* and the receiving device 324, and planar waveguides 344, 346. In Step 1291*b*, the second optoelectrical circuitry 308 with receiving device 324 is configured to receive an optical signal 370.

In Step 1292*a*, a first upturned mirror structure 348*a* is formed on the base structure 301 on PIC die 302 that is optically connected to the one or more sending devices 322 and the optical device 340 through planar waveguides 344 and planar waveguide section 346*a*. This first upturned mirror structure 348*a* is configured to receive optical signals 370 from the sending device 322 through planar waveguides 344, and through the optical device 342. The first optoelectrical circuitry 306, in embodiments, is configured to send one or more optical signals from the one or more optical sending devices 322 through other components in the first optoelectrical circuitry 306 including the optical device 342 to the upturned mirror 348*a* as shown in FIG. 12A. The upturned mirror 348*a*, in this embodiment, is configured to receive the optical signal, formed in the one or more sending devices 322, from the planar waveguide section 346*a* of the first optoelectrical circuitry 306. In an embodiment, the optical signal is a single wavelength signal from a single sending device 322. In other embodiments, the optical signal is a multiplexed signal that includes two or more wavelengths from two or more optical sending devices 322.

In Step 1292*b*, a second upturned mirror structure 348*b* is formed on the base structure 301 of PIC die 302 that is optically connected to the one or more receiving devices 324 and the optical device 342 through planar waveguides 344, optical device 340, and planar waveguide section 346*b*. This second upturned mirror structure 348*b* is optically aligned with the planar waveguide section 346*b* such that this second upturned mirror structure 348*b* can receive an optical signal from an optical probe head 362 positioned above the PIC die 302 and reflect this signal into the planar waveguide section 346*b*. The second optoelectrical circuitry 308, in embodiments, is configured to receive one or more reflected optical signals, wholly or in part in the one or more optoelectrical receiving devices 324 from an optical signal reflected into the planar waveguide 346*b* by the upturned mirror 348*b* as shown in FIG. 12A.

In Step 1293 of FIG. 12B, a probe head is provided that includes an electrical probe head 362*a* and an optical probe head 362*b*. The electrical probe head 362*a* and the optical probe head 362*b*, in some embodiments, are combined into a single probe head 362. In other embodiments, the electrical probe head 362*a* and the optical probe head 362*b* are separate probe heads. In addition to providing the probe heads 362*a*, 362*b*, a parametric analyzer 360 is also provided in Step 1293. The parametric analyzer 360 is commonly used equipment in electrical device testing, and in particular in functionality testing of integrated circuits and photonic integrated circuits. A parametric analyzer 360 is a device, typically programmable, that contains one or more voltage or current sources (outputs), and the capability to measure one or more voltages or currents (inputs).

In the embodiment described in FIG. 12A and FIG. 12B, optical loop 365 is also provided in the optical probe head 362b. In other embodiments, an optical loop 365 is provided at, connected to, or in conjunction with, the parametric analyzer 360. Optical loop 365 is a length of waveguide, such as an optical fiber or a solid waveguide, or a configuration of reflective mirrors, for which an optical signal can be received at one location on an optical probe and redirected in the direction from which it was received (as shown for example in FIG. 3B(i).)

In Step 1293 shown in FIG. 12B, a functionality test is performed of the first and second optoelectrical circuitries 306, 308 on the PIC die 302 using the parametric analyzer 360 connected to one or more of the electrical contact pads 330 and to the optical probe head 362b. In an embodiment, the parametric analyzer 360 provides a first electrical signal, typically a voltage, to the electrical probe head 362a, in contact with the one or more electrical contact pads 330 on the electrical interface 312 of the PIC die 302. The electrical signal applied to the electrical contact pads 330 from the electrical probe head 362a reaches the sending device 322 through the electrical interconnects 332 in the electrical interconnect layer 303 on the substrate 300, activating the sending device 322. Activation of the sending device 322 causes the sending device 322 to form an optical signal 370 that propagates through the first optoelectrical circuitry 306 to the first upturned mirror 348a. This first upturned mirror 348a reflects the optical signal 370 to the optical probe head 362b and is received at a receiving end of an optical loop 365 that in some embodiments, includes a lens and a length of fiber optical cable or waveguide. The optical signal 370 is received by the optical loop 365 and is redirected in the optical probe head 362b to the second upturned mirror 348b, wherein the optical signal is reflected into the second optoelectrical circuitry 308 to the one or more receiving devices 324. Optoelectrical receiving device 324 subsequently provides an electrical signal to the parametric analyzer 360. The electrical signal received by the parametric analyzer provides information about the functionality of the first and second optoelectrical circuitries 306, 308.

In Step 1294 of FIG. 12B, upon completion of the functionality test performed in Step 1293, fabrication of the PIC die 302 is resumed, and can include, for example, the removal of the upturned mirror structures 348a, 348b, and the formation of the v-grooves or other means to support the attachment of optical fiber cables to the PIC die 302 such as the attachment of an optical fiber mounting block.

In Step 1295 of FIG. 12B, the plurality of PIC die are singulated into individual PIC die 302. Having been subjected to wafer level testing during the fabrication process, PIC die that failed to meet specific functionality test criteria can be optionally excluded from some further processing steps. In an embodiment, for example, a PIC die that was found to have a faulty laser 322 or photodiode 324, is marked and eliminated from further processing after singulation. Other defects in PIC die 302 that are identified during the functionality testing can be marked, repaired, adjusted, tuned, or any of a number of other remedies to provide the specified functionality for the die.

Figure 13:
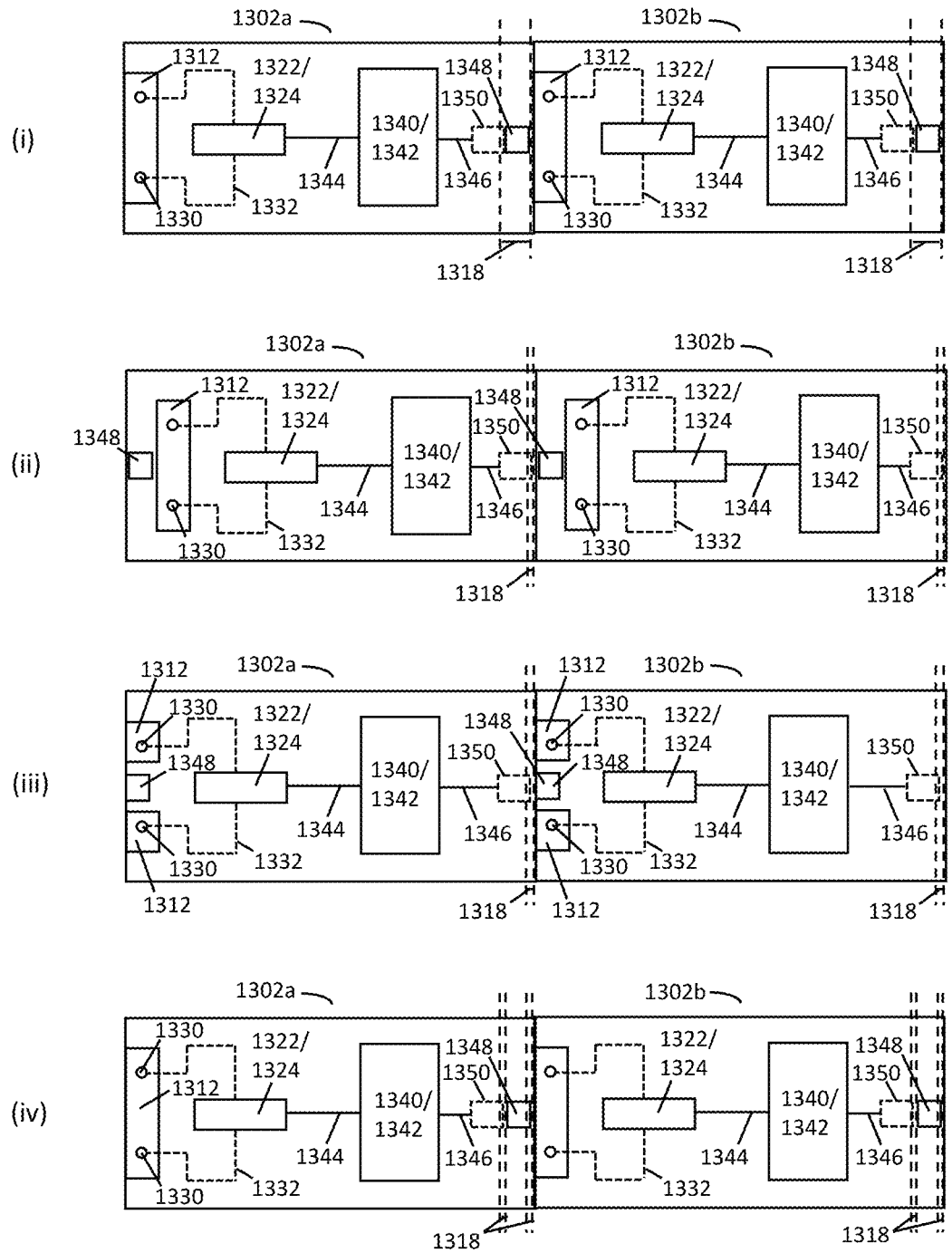
FIG. 13. Schematic drawings of neighboring PICs 1302 formed on interposer base structure 1301 that show example embodiments for scribe lines 1318 to facilitate removal of upturned mirror 1348 during the singulation process.

Referring to FIG. 13, some embodiments are shown with various scribing locations that facilitate the isolation of mirror structures 848 from the optoelectrical circuitries on the PIC die 1302 after formation of the v-grooves or features that facilitate the attachment of an optical fiber mounting block. Neighboring die 1302a, 1302b are shown in the embodiments in FIG. 13 to better illustrate the relative positions of the scribe lines 1318 between two example neighboring die, the positions of the upturned mirrors 1348, the positions of the planar waveguide section 1346, and the position of v-groove 1350. Optoelectrical circuitries shown in FIGS. 13(i)-13(iv) include the optoelectrical sender device 1322 or receiver device 1324 electrically connected to electrical contact pads 1330 on electrical interface 1312 through the electrical interconnections 1332. Also shown in the optoelectrical circuitry is the planar waveguide 1344 optically connecting the optoelectrical sending device 1322 or optoelectrical receiving device 1324 to the optical device 1340 or 1342.

In embodiments, the v-grooves 1350 are formed prior to the singulation process. An objective with the formation of the v-grooves 1350 is to enable the insertion and mounting of an optical fiber in the open end of the v-groove 1350 that is aligned with planar waveguide section 1446. The insertion and mounting of the optical fiber requires that the scribe line 1318 intersect the v-groove 1350. Additionally, another objective in the singulation process is to separate the mirror-containing portion of a die in order for the optical fiber to be inserted in the v-groove 1353. And yet another objective of embodiments is to separate the die 1302a and 1302b.

The removal of the mirror structure 1348 is accomplished for the embodiment shown in FIG. 13(i) by sizing the mirror and scribe line such that the mirror structure is smaller than the width of the scribe line. In this embodiment, the mirror structure is fully or substantially removed during the dicing or scribing process and the v-groove is opened by including a portion of the v-groove 1350 within the width of the scribe line 1318.

In another embodiment, shown in FIG. 13(ii), scribe line 1318 is positioned such that the mirror structures 1348 that is used in the testing of the PIC die 1302a, remains with the neighboring die 1302b after the die singulation process. In FIG. 13(ii), for example, the mirror structure 1348 that is used in the testing of PIC die 1302a is formed on a portion of the neighboring die 1302b, and the mirror structure 1348 remains with the neighboring die 1302b after dicing. Opening of the v-groove 1350, as shown in the embodiment in FIG. 13(ii), is accomplished by sizing the scribe line 1318 to cut through a portion of the v-groove 1350 as shown.

In yet another embodiment, shown in FIG. 13(iii), scribe line 1318 is positioned such that the mirror structures 1348 for the testing of PIC die 1302a is formed in an area on the neighboring PIC die 1302b. An example embodiment in which a mirror structure for testing a PIC die 1302a is positioned on the neighboring die 1302b shows the mirror structure 1348 at a location between two portions of a divided electrical interface 1312 of the neighboring PIC die 1302b. This mirror structure 1348 remains with the neighboring die 1302b after the die singulation process. Other embodiments in which the mirror structure 1348 is positioned within or adjacent to features of the neighboring die remain within the scope of the current invention. Opening of the v-groove is accomplished by sizing the scribe line to cut through a portion of the v-groove during the singulation process as shown.

And in yet another embodiment, shown in FIG. 13(iv), multiple scribe lines 1318 are cut to separate the neighboring PIC die 1302a, 1302b, to isolate the mirror 1348, and to open the end of the v-groove 1350 to enable access for an optical fiber. In the embodiment shown in FIG. 13(iv), multiple scribe lines 1318 are shown. The left scribe line of a pair of scribe lines shows a cut through the edge of the v-groove 1350 to open the end of the v-groove 1350 and to isolate the opened v-groove 1350 from one side of the mirror structure 1348, as shown, and a second scribe line 1318 to the right of this first scribe line shows a second cut on the right edge of the mirror 1348 between the mirror 1348 and the neighboring die 1302*b*. Multiple scribe lines, however, may require additional processing time.

In yet other embodiments, all or part of the mirror 1348 is removed during the formation of the v-groove 1350 by widening or otherwise varying or changing the width of the scribe lines shown in the embodiments in FIG. 13. Dicing of the remaining three sides of the PIC die 1302 in the embodiments in FIG. 13 does not affect the mirror structure or the formation of the v-groove and therefore is not shown.

Figure 14:
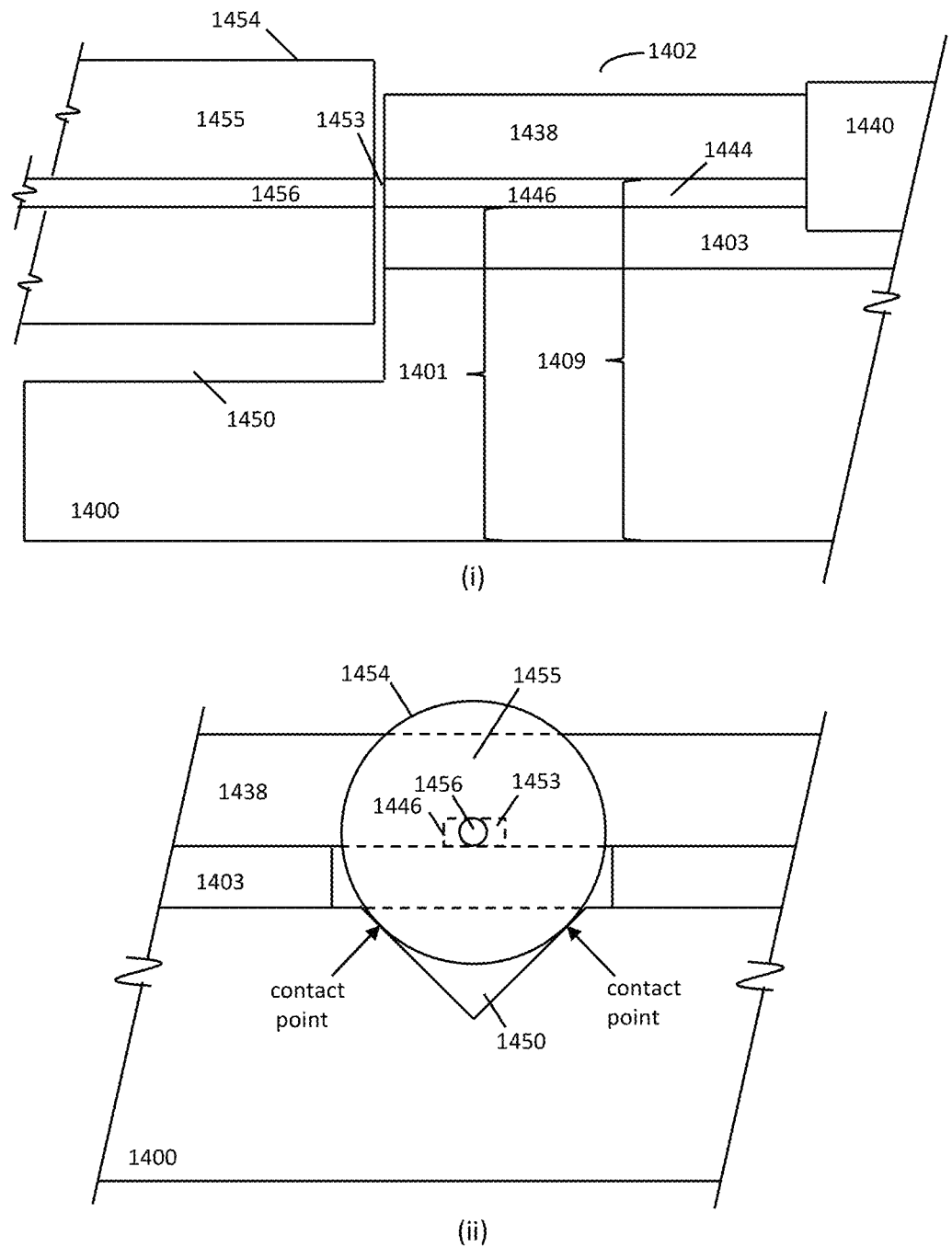
FIG. 14. Schematic illustration of an embodiment of a v-groove 1450 formed in the base structure 1401 for mounting an optical fiber 1454 at the edge of a PIC die 1402 showing the direct coupling of the core 1456 of a mounted fiber optic cable 1456; in this embodiment, the core 1456 is substantially matched in size to the mating planar waveguide section 1446 of the waveguide layer 1444 of the interposer-based PIC die 1402.

Referring to FIG. 14, an illustration of a portion of a PIC die 1402, that includes a v-groove 1450, is shown. PIC die 1402 is formed on an interposer 1409, and FIG. 14 shows an advantage of the interposer structure 1409 with the fiber optic cable 1454 positioned in a v-groove in that the core 1456 of the fiber optic cable 1454 can be brought into substantial alignment with the end facet 1453 of the planar waveguide layer section 1446. This alignment facilitates the transfer of optical signals between the fiber optic core 1456 and the planar waveguide section 1446. In FIG. 14(*i*), a cross section that includes the interposer 1409 shows planar waveguide layer 1446 on the base structure 1401 wherein the base structure includes an electrical interconnect layer 1403 on substrate 1400. Also shown in the cross section is the dielectric insulation layer 1438. Dielectric layer 1438 is one or more of a cladding layer, a buffer layer, an encapsulation layer, a planarization layer, a spacer layer, among others. A portion of an optical device 1440 is also shown.

The interposer structure layers are also shown in the end view in FIG. 14(*ii*). The end view, taken from the left of FIG. 14(*i*), shows the "v" shape of a v-groove 1450 and the positioning of the fiber optic cable 1454 in the v-groove. The fiber optic cable 1454 has fiber core 1456 and fiber cladding layer 1455. The fiber optic cable 1054 is shown inserted in the v-groove 1450 and in a position to be mounted, and in this position, the core 1456 of the fiber optic cable 1454 is aligned with the end facet 1453 of the planar waveguide section 1446 of the planar waveguide layer 1444. Planar waveguide section 1446 is the section of the planar waveguide 1444 that resides between an optical device 1440 and v-groove 1450. The sizing of the v-groove 1450 and the fiber optic cable 1454 provides physical points of contact between the cladding layer 1455 of the fiber optic cable 1454 and the v-groove surface such that the core 1456 of the fiber optic cable 1454 is aligned with the end facet 1453 of the planar waveguide section 1446, as shown. In FIG. 14(*ii*), the end-view schematic drawing shows the points of contact between the fiber optic cable 1454 and the v-groove 1450, and to further illustrate the alignment of the core 1456 of the fiber optic cable 1454 with the end facet 1453 of the planar waveguide section 1446.

In other embodiments, an optical fiber mounting block is used for embodiments that require the formation of an optical fiber mounting scheme for the attachment of optical fiber cables to the PIC die 1402.

Figure 15:
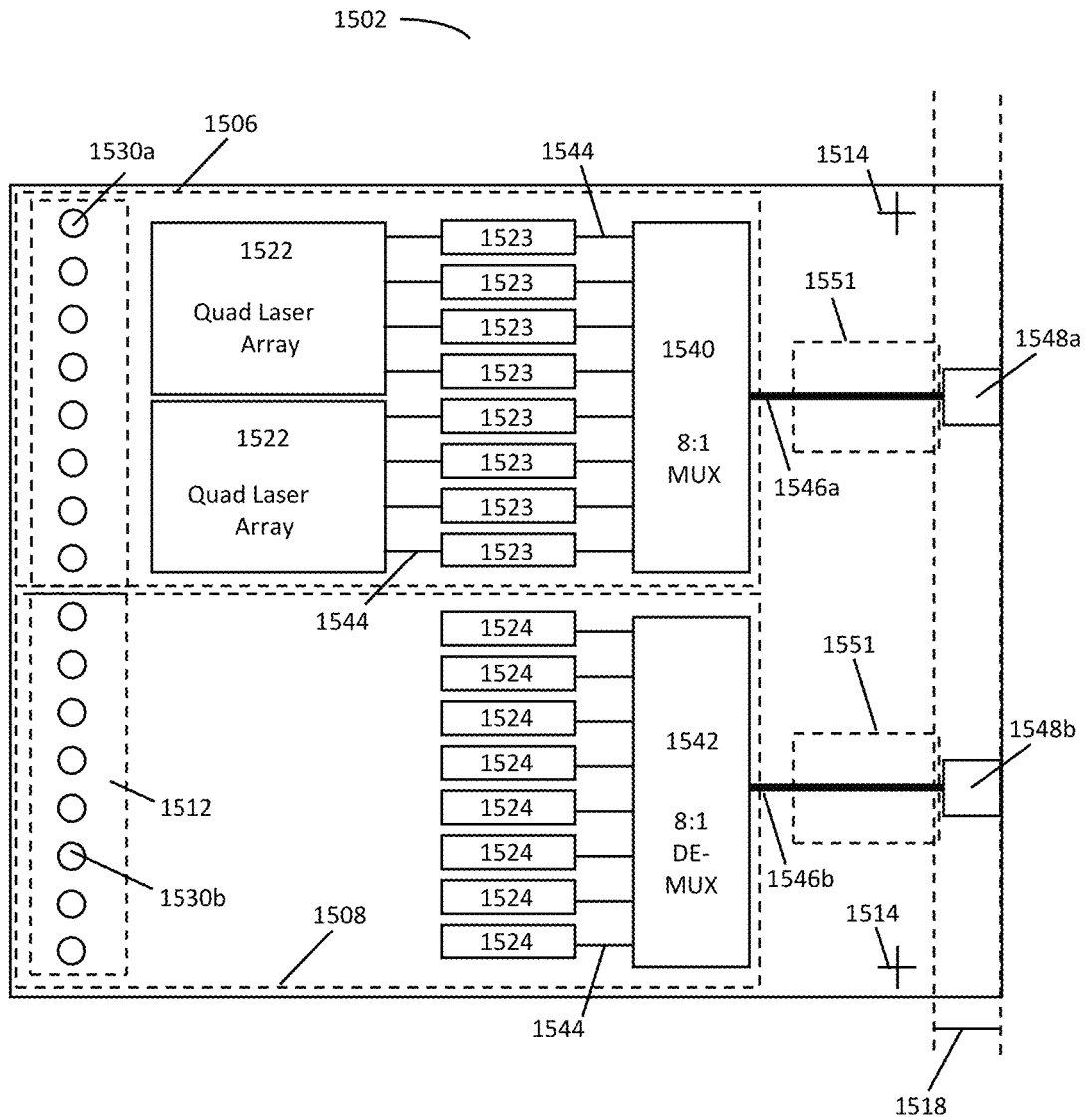
FIG. 15. Schematic drawing of an embodiment of a PIC 1502 configured for multiple channels of sending devices 1522 in optoelectronic sending circuitry 1506 and multiple channels of receiving devices 1524 in optoelectronic receiving circuitry 1508. Upturned mirror structures 1548a, 1548b that are used in wafer level testing are shown in relation to a scribe line used in this embodiment to isolate the upturned mirrors 1548a, 1548b from the PIC 1502 in the singulation process. Also shown is an outline 1551 of the location for v-grooves 1550.

Referring to FIG. 15, a schematic top-down drawing of an embodiment of a PIC application that includes a plurality of sending devices 1522 and receiving devices 1524. Optoelectrical sending circuit 1506 includes optoelectrical devices 1522. In the example embodiment, the optoelectrical devices 1522 are arrays of lasers that, in the embodiment shown in FIG. 15, include four lasers in each laser array 1522. In embodiments, the quad laser arrays 1522 are electrically connected to electrical interface 1512 with metal traces in an underlying electrical interconnect layer (see for example layer 303 described herein). Each laser in the quad laser array 1522 is optically coupled in the embodiment shown in FIG. 15 to optoelectrical device 1523, a modulator device 1523. In some embodiments, the optoelectrical device 1523 is an electro-absorption modulator. In other embodiments, the lasers are directly modulated, and the optoelectrical device 1523 is not present. In the embodiments that include a modulator device 1523, the devices 1523 are each optically coupled through a planar waveguide 1544 to optical device 1540. Optical device 1540 is a multiplexing device that is used in embodiments to combine the optical signals from the lasers 1522 into a single multiplexed signal that exits optical device 1540 into planar waveguide section 1546*a*.

In an embodiment for which the PIC die 1502 undergoes a wafer level test, prior to singulation, a multiplexed optical signal 1570 propagates from the optoelectrical sending devices 1522, the lasers, through the planar waveguide section 1546*a*, to a first mirror 1548*a*. An optical signal is formed by one or more of the lasers 1522 through the application of an electrical signal from the electrical contacts 1530*a* of an electrical probe head in contact with the contact pads 1530*a* on the electrical interface 1512 of the optoelectrical sending circuit 1506. In embodiments of a test procedure with more that one laser, a multiplexed optical signal is formed in optical multiplexing device 1540. The optical signal that exits the optical device 1540, and that propagates into planar waveguide section 1546*a*, is incident upon the mirror 1548*a* and is reflected perpendicularly from the plane of the planar waveguide 1546*a* to an optical probe head positioned to receive the reflected optical signal as described in embodiments herein. (See, for example, FIG. 3 and FIGS. 10-12.) In an embodiment, the reflected optical signal that is received by the optical probe head, is looped back to the second mirror 1548*b* and reflected into planar waveguide section 1546*b*, and into the optical device 1542. In the embodiment shown in FIG. 15, optical device 1542 is, for example, is a de-multiplexing device that separates the reflected optical signal from mirror 1548*b* that is received through planar waveguide section 1546*b* into eight optical signals with differing wavelengths corresponding to the wavelengths generated by the optoelectrical devices 1522, 1523. The eight individual wavelengths each propagate from the optical device 1542 through planar waveguides 1544 to optoelectrical devices 1524. In the embodiment shown in FIG. 15, optoelectrical devices 1524 are receiving devices, such as photodiodes. Electrical signals generated by the photodiodes are transmitted to the electrical interface 1512 through electrical traces in an underlying electrical interconnect layer (see interconnect layer 303, for example, described herein) and are detectable by the electrical probe head 362*a*, for example, in contact with the contact pads 1530*b* of optoelectrical circuitry 1508 as described herein.

Also shown in FIG. 15 are example alignment marks 1514 for aligning a probe head, or one or more of the electrical and the optical portions of the probe head (see for example, probe head 362, electrical portion of probe head 362*a*, and optical portion of probe head 362*b*). Other alignment marks that aid in the fabrication process may also be present on the PIC die 1502. Additionally, an embodiment of the scribe lines 1518 are shown in which the width of the scribe lines 1518 corresponds to the approximate width of the mirrors such that the singulation process could remove the mirrors 1548*a*, 1548*b*. Adjacent to the mirrors 1548*a* and 1548*b*, v-groove outlines 1551 are shown to illustrate a location for the v-grooves relative to the scribe line 1518, the mirrors 1548a, 1548b, and the planar waveguide sections 1546a, 1546b in this embodiment.

Figure 16:
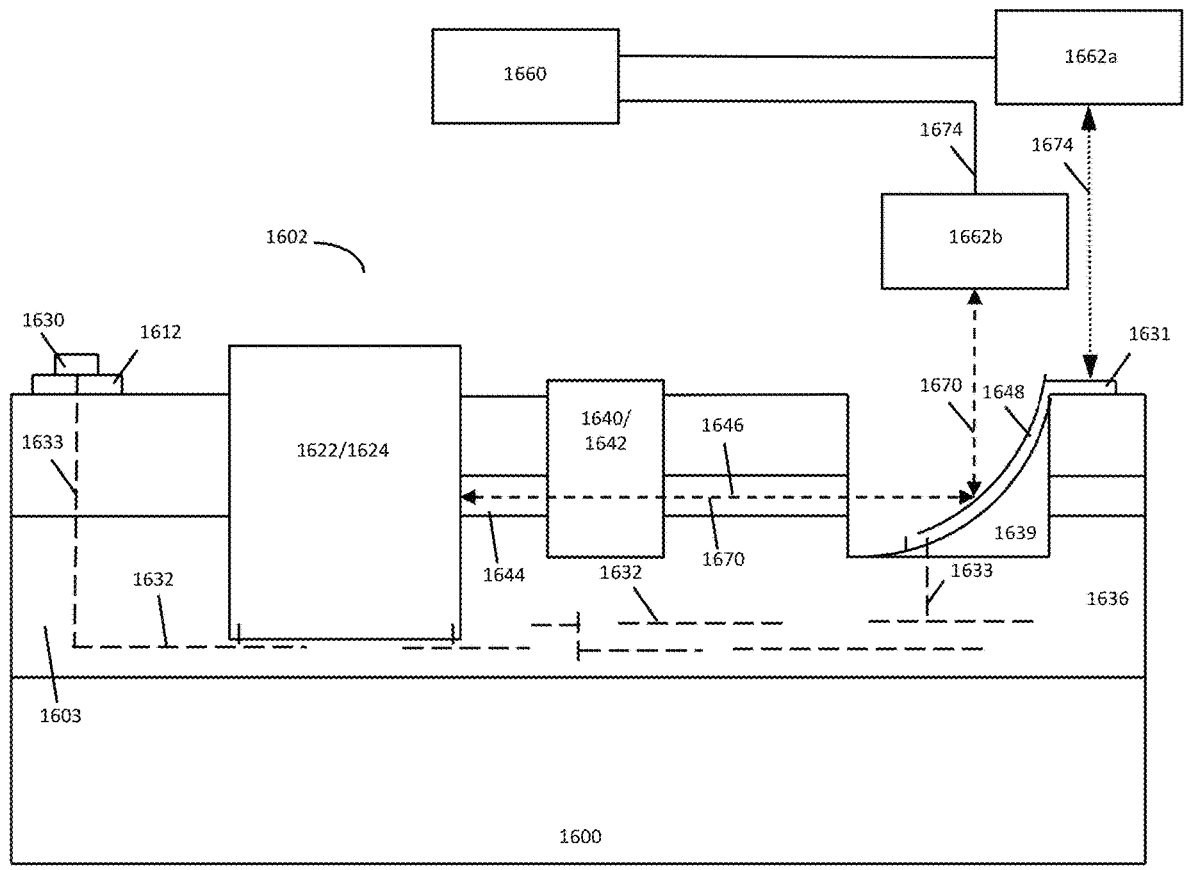

Referring to FIG. 16, embodiments are shown for which the conductive mirror structure 1648 provides a portion of one or more conductive interconnections from the interconnect layer 1603 to a portion of the PIC die 1602 that can be accessed by an electrical probe 1662a as shown in FIG. 16. Interconnects 1632 in the interconnect layer 1603 are used, in embodiments, to route electrical signals between the electrical and optoelectrical devices in the PIC die. Use of the mirror to form electrical connections to the interconnect layer 1603 can allow the conductive properties of the mirrors to be used as contact pads and vertical interconnects in addition to the use of the mirror's reflective properties. In these embodiments, electrical contacts 1631 on mirror 1648 utilize the conductive property of embodiments in which conductive mirror material is used in the formation of the mirror to form these interconnections. In embodiments, the interconnections provide electrically conductive pathways to the underlying interconnect layer 1603 similar to electrical contact pads 1630 and the vertical interconnects 1633 of the optoelectrical circuitry on the PIC die 1602. Electrical probe contacts on the PIC die 1602 that provide an electrical interface between the PIC die 1602 and the electrical probe head portion 1662b are formed, wholly or in part, from the same metallization layer that is used in the formation of the reflective mirror layer 1648. In some embodiments, the mirror contacts 1631 and the mirror 1648 are used to form a single electrical contact from the top surface of the die 1602 to the underlying electrical contacts in the electrical contact layer 1603. In other embodiments, the mirror contacts 1631 and the mirror 1648 are divided into multiple contacts to allow the formation of multiple electrical contacts, as is expected, for example, in the operation of a multi-terminal device such as a laser or a photodiode. In yet other embodiments, electrical contact pads 1630 are formed in proximity to the mirror to facilitate multiple contact points in proximity to the mirror structure 1648.

In an embodiment, an electrical probe head portion 1662a is brought into alignment with one or more horizontal contact pads 1631 connected through the mirrors 1648 to the underlaying electrical interconnect layer 1603 wherein the electrical traces 1632 in the electrical interconnect layer 1603 provide the electrical connections to the optoelectrical devices 1622, 1624. Additionally, the optical probe head portion 1662b is brought into alignment with the mirror structure 1648 wherein the mirror structure 1648 can reflect optical signals 1670 from the optoelectrical circuits on the PIC die 1602 to the optical probe head 1662b or receive optical signals 1670 from the optical probe head 1662b, or both, as required by the functionality tests imposed in the measurement.

In some embodiments, vertical interconnects 1633 through the interconnect dielectric layer 1636 are used to connect the mirror to the horizontal traces 1632 in the interconnect layer 1603. Use of the electrical properties of the conductive mirror 1648 to provide an electrical conduit from the top of the die 1602 to the electrical interconnect layer 1603 has a number of advantages that include the ability to combine the electrical and optical functions of the probe head 1662 in some embodiments, and the capability to provide temporary contact pads with the mirror structure to preserve the electrical contact pads 1630 on the electrical interface 1612.

In FIG. 16, parametric analyzer 1660 is shown connected to electrical probe head 1662a which is further connected to a horizontal contact portion 1631 of the mirror 1648. During a functionality test, in an embodiment in which the optoelectrical device is a sending device 1622, an electrical signal 1674 is delivered to the horizontal surface portion 1631 of the mirror 1648, which propagates to electrical traces 1632 in the electrical interconnect layer 1603 to the optoelectrical sending device 1622. The signal from the parametric analyzer 1660 initiates an optical signal 1670 from the optoelectrical sending device 1622 to propagate from the device 1622 through the waveguide 1644, the optical device 1640, and the waveguide section 1646 to the reflective mirror 1648. The optical signal 1670 is reflected from the reflective surface of the mirror structure 1648 to the optical probe head portion 1662b causing an electrical signal to be detected in the parametric analyzer 1660. Detection of the electrical signal 1674 from the optical probe head portion 1662b enables a measure of the functionality of the optoelectrical circuit to be attained.

Conversely, in an embodiment in which the optoelectrical device is a receiving device 1624, an electrical signal 1674 is delivered from the parametric analyzer 1660 or other voltage or measurement system to an emitter device in the optical probe head 1662b. The emitter causes an optical signal 1670 to be delivered to the upturned mirror structure 1648, and in turn through the optical circuitry to the receiving device 1624. Upon receiving the optical signal, the receiving device 1624 forms an electrical response, typically a voltage, that is detectable at the electrical probe head 1662a in contact with the electrical contacts 1631 formed through the electrical interconnects 1632 in the electrical interconnect layer 1603 and the electrical path through all or part, or in parallel to the mirror structure 1648. Detection of the electrical signal at the electrical probe head, and subsequently, at the parametric analyzer 1660, enables a measure of the functionality of the optoelectrical circuit to be attained.

Other embodiments, further described herein, are similarly applicable to embodiments, that utilize the mirror structure 1648 wholly, or in part, to provide an electrical connection between the electrical probe head and the underlying electrical interconnect layer 1603.

In embodiments, the electrical contacts formed wholly or in part with the mirror structure, are removed wholly, or in part, from the PIC die 1602 with the removal of the mirror structures 1648 from the PIC die 1602 as described in embodiments herein after testing.

Described herein are embodiments of an upturned mirror structure formed in an interposer. In some embodiments, we disclose an upturned mirror structure and a method for forming an upturned mirror structure. In other embodiments, we describe a test circuit that includes one or more upturned mirror structures, and the method for using the upturned mirror in a testing circuit.

The foregoing descriptions of embodiments have been presented for purposes of illustration and description and are not intended to be exhaustive or to limit embodiments to the forms disclosed. Modifications to, and variations of, the disclosed embodiments will be readily apparent to those skilled in the art, and the general principles defined herein may be applied to other embodiments without departing from the spirit and scope of the embodiments disclosed herein. Thus, embodiments should not be limited to those specifically described herein but rather are to be accorded the widest scope consistent with the principles and features disclosed herein.

What is claimed is:

1. A sacrificial upturned mirror comprising
a reflective layer disposed on a mirror base on a substrate,
wherein the mirror base comprises a mirror profile configured to reflect a first optical signal from a waveguide,
wherein the waveguide is fabricated on a surface of the substrate
wherein the first optical signal is configured to reflect upward, in a direction perpendicular to the substrate, out of the surface of the substrate from the waveguide,
wherein the waveguide is coupled to an optoelectronic circuit,
wherein the optoelectronic circuit is configured to emit the first optical signal to the waveguide to the sacrificial upturned mirror,
wherein the sacrificial upturned mirror is configured for testing the optoelectronic circuit,
wherein the testing is performed using a tester comprising an electrical probe head and an optical probe head with the electrical probe head configured to contact the substrate and the optical probe head configured to be disposed above the substrate,
wherein the electrical probe head comprises multiple electrical probes,
wherein the multiple electrical probes are configured to contact multiple terminal pads of the optoelectronic circuit during the testing process,
wherein the optical probe head comprises an optical detector,
wherein the optical detector is configured to be aligned with the sacrificial upturned mirror for receiving a second optical signal generated by the optoelectronic circuit during the testing process,
wherein the sacrificial upturned mirror is configured to transmit the second optical signal in a direction perpendicular to the substrate to the optical detector,
wherein the tester is configured to process the second optical signal for testing the optoelectronic circuit,
wherein the sacrificial upturned mirror is configured to be removed in a subsequent fabrication step after the testing step.

2. A sacrificial upturned mirror as in claim 1,
wherein the mirror profile is configured to optimize optical signals transferred between the optical probe head and the sacrificial upturned mirror.

3. A sacrificial upturned mirror as in claim 1,
wherein the mirror profile comprises a curve or a straight profile configured to transmit an optical signal between a direction parallel to the substrate and the direction perpendicular to the substrate.

4. A sacrificial upturned mirror as in claim 1,
wherein the sacrificial upturned mirror is fabricated in an area configured to have the upturned mirror removed in the subsequent fabrication step to enable an attachment of an optical fiber.

5. A sacrificial upturned mirror as in claim 1,
wherein the sacrificial upturned mirror is fabricated in an area configured to be cut during a separation of the optoelectronic circuit.

6. An optoelectronic circuit comprising
an optoelectronic circuit,
wherein the optoelectronic circuit comprises an emitter circuit configured to emit a first optical signal to an output waveguide,
wherein the output waveguide is optically coupled to an upturned mirror,
wherein the upturned mirror is configured to transmit, in a direction perpendicular to the substrate, the first optical signal generated by the emitter circuit,
wherein the upturned mirror is configured for testing the optoelectronic circuit,
wherein the testing is performed using a tester comprising an electrical probe head and an optical probe head, with the optical probe head configured to be disposed above the substrate and aligned with the upturned mirror,
wherein the electrical probe head is configured to contact the emitter circuit to cause the emitter circuit to emit a second optical signal to the output waveguide to the upturned mirror,
wherein the upturned mirror is configured to transmit the second optical signal in a direction perpendicular to the substrate to the optical probe head,
wherein the upturned mirror is configured to be removed in a subsequent fabrication step after the testing step.

7. An optoelectronic circuit as in claim 6, further comprising
an output coupler,
wherein the output coupler is configured to house a first optical fiber for coupling to the output waveguide,
wherein the output coupler is formed in the subsequent fabrication step at an area on which either the output waveguide or on the first upturned mirror is present before the subsequent fabrication step.

8. An optoelectronic circuit as in claim 6,
wherein the optoelectronic circuit comprises a receiver circuit configured to receive and process a third optical signal received from an input waveguide,
wherein the input waveguide is optically coupled to a second upturned mirror,
wherein the second upturned mirror is configured to receive the third optical signal in a direction perpendicular to the substrate from the optical probe head,
wherein the optical probe head is configured to send a fourth optical signal to the second upturned mirror,
wherein the electrical probe head is configured to contact the receiver circuit to cause the receiver circuit to receive and process the fourth optical signal received from the second upturned mirror to the input waveguide,
wherein the tester is configured to measure a response from the receiver circuit based on the processed second optical signal.

9. An optoelectronic circuit as in claim 6,
wherein the emitter circuit comprises multiple laser devices coupled to a multiplexor to generate a composite optical signal,
wherein the electrical probe head is configured to contact the emitter circuit to cause the multiple laser devices to emit multiple individual optical signals having different wavelengths,
wherein the optical probe head is configured to receive the composite optical signal in a direction perpendicular to the substrate from the first upturned mirror.

10. An optoelectronic circuit as in claim 6,
wherein the emitter circuit comprises a laser device.

11. An optoelectronic circuit as in claim 6,
wherein at least one of the output waveguide or the input waveguide is patterned on a stack of SiON layers.

12. Multiple optoelectronic circuits fabricated on a substrate, each optoelectronic circuit comprising
an optoelectronic circuit,
wherein the optoelectronic circuit comprises at least one of
an emitter circuit configured to emit a first optical signal to an output waveguide, or
a receiver circuit configured to receive and process a second optical signal received from an input waveguide;
one or more upturned mirrors,
wherein at least one of
a first upturned mirror of the one or more upturned mirrors is optically coupled to the output waveguide, or
a second upturned mirror of the one or more upturned mirrors is optically coupled to the input waveguide;
wherein the first upturned mirror is configured to send upward in a direction perpendicular to the substrate the first optical signal generated by the emitter circuit from the output waveguide,
wherein the second upturned mirror is configured to receive from upward in the direction perpendicular to the substrate the second optical signal to the input waveguide to be received by the receiver circuit,
wherein the first and second upturned mirrors are configured for testing the optoelectronic circuit,
wherein the testing is performed using a tester comprising an electrical probe head and an optical probe head,
wherein the testing is performed using a tester comprising an electrical probe head and an optical probe head with the electrical probe head configured to contact the each optoelectrical circuit and the optical probe head configured to be disposed above the substrate and aligned with the first or second upturned mirror in the direction perpendicular to the substrate,
wherein the upturned mirror is configured to be removed in a subsequent fabrication step after the testing step.

13. Multiple optoelectronic circuits as in claim 12, wherein each optoelectronic circuit further comprises at least one of
an output coupler,
wherein the output coupler is configured to house a first optical fiber for coupling to the output waveguide,
wherein the output coupler is formed in the subsequent fabrication step at an area on which either the output waveguide or on the first upturned mirror is present before the subsequent fabrication step; or
an input coupler,
wherein the input coupler is configured to house a second optical fiber for coupling to the input waveguide,
wherein the input coupler is formed in the subsequent fabrication step at an area on which either the input waveguide or the second upturned mirror is present before the subsequent fabrication step.

14. Multiple optoelectronic circuits as in claim 12, wherein the multiple optoelectronic circuits are configured to be separated into individual optoelectronic circuits,
wherein the separation passes through at least one of the output waveguide, the one or more upturned mirrors, or the input waveguide.

15. Multiple optoelectronic circuits as in claim 12,
wherein each optoelectronic circuit is fabricated on a separate portion of the substrate,
wherein the one or more upturned mirrors are fabricated in an area between two adjacent portions housing two adjacent optoelectronic circuits.

16. A sacrificial upturned mirror comprising
a reflective layer disposed on a mirror base on a substrate,
wherein the mirror base comprises a mirror profile configured to reflect a first optical signal to a waveguide,
wherein the waveguide is fabricated on a surface of the substrate
wherein the first optical signal is configured to reflect to the waveguide from above the substrate in a direction perpendicular to the substrate,
wherein the waveguide is coupled to an optoelectronic circuit,
wherein the optoelectronic circuit is configured to receive and process the first optical signal received from the waveguide coming from the sacrificial upturned mirror,
wherein the sacrificial upturned mirror is configured for testing the optoelectronic circuit,
wherein the testing is performed using a tester comprising an electrical probe head and an optical probe head with the electrical probe head configured to contact the substrate and the optical probe head configured to be disposed above the substrate,
wherein the electrical probe head comprises multiple electrical probes,
wherein the multiple electrical probes are configured to contact multiple terminal pads of the optoelectronic circuit during the testing process,
wherein the optical probe head comprises an optical emitter,
wherein the optical emitter is configured to be aligned with the sacrificial upturned mirror for sending a second optical signal to the optoelectronic circuit during the testing process,
wherein the sacrificial upturned mirror is configured to receive the second optical signal in a direction perpendicular to the substrate from the optical emitter,
wherein the tester is configured to measure an electrical signal from the optoelectronic circuit for testing the optoelectronic circuit,
wherein the electrical signal is generated in response to the optical signal received by the optoelectronic circuit from the optical probe head,
wherein the sacrificial upturned mirror is configured to be removed in a subsequent fabrication step after the testing step.

17. A sacrificial upturned mirror as in claim 16,
wherein the sacrificial upturned mirror is fabricated in an area configured to have the upturned mirror removed in the subsequent fabrication step to enable an attachment of an optical fiber.

18. An optoelectronic circuit as in claim 17,
wherein the optical probe head is configured to generate a composite optical signal in a direction perpendicular to the substrate to the second upturned mirror,
wherein the receiver circuit comprises a demultiplexor configured to receive the composite optical signal,
wherein the electrical probe head is configured to contact the receiver circuit to cause the demultiplexor to generate multiple individual optical signals having different wavelengths.

19. An optoelectronic circuit comprising
an optoelectronic circuit,
- wherein the optoelectronic circuit comprises a receiver circuit configured to receive and process a first optical signal received from an input waveguide,
- wherein the input waveguide is optically coupled to an upturned mirror,
- wherein the upturned mirror is configured to receive from upward, in a direction perpendicular to the substrate, the first optical signal, which is to be transmitted to the input waveguide to be received by the receiver circuit,
- wherein the upturned mirror is configured for testing the optoelectronic circuit,
- wherein the testing is performed using a tester comprising an electrical probe head and an optical probe head, with the optical probe head configured to be disposed above the substrate and aligned with the upturned mirror,
- wherein the optical probe head is configured to send a second optical signal to the upturned mirror,
- wherein the upturned mirror is configured to receive the second optical signal in a direction perpendicular to the substrate,
- wherein the electrical probe head is configured to contact the receiver circuit to cause the receiver circuit to receive and process the second optical signal received from the second upturned mirror to the input waveguide,
- wherein the tester is configured to measure a response from the receiver circuit based on the processed optical signal,
- wherein the upturned mirror is configured to be removed in a subsequent fabrication step after the testing step.

20. An optoelectronic circuit as in claim 19, further comprising
an input coupler,
- wherein the input coupler is configured to house an optical fiber for coupling to the input waveguide,
- wherein the input coupler is formed in the subsequent fabrication step at an area on which either the input waveguide or on the upturned mirror is present before the subsequent fabrication step.

* * * * *